United States Patent
Wang et al.

(10) Patent No.: US 11,997,864 B2
(45) Date of Patent: May 28, 2024

(54) DEVICE INCLUDING PATTERNING A CONDUCTIVE COATING

(71) Applicant: OTI Lumionics Inc., Mississauga (CA)

(72) Inventors: Zhibin Wang, Toronto (CA); Michael Helander, Toronto (CA)

(73) Assignee: OTI Lumionics Inc., Mississauga (CA)

( * ) Notice: Subject to any disclaimer, the term of this patent is extended or adjusted under 35 U.S.C. 154(b) by 0 days.

(21) Appl. No.: 17/959,279

(22) Filed: Oct. 3, 2022

(65) Prior Publication Data

US 2023/0029169 A1    Jan. 26, 2023

Related U.S. Application Data

(63) Continuation of application No. 17/053,026, filed as application No. PCT/IB2019/053706 on May 7, 2019, now Pat. No. 11,489,136.

(60) Provisional application No. 62/729,889, filed on Sep. 11, 2018, provisional application No. 62/668,134, filed on May 7, 2018.

(51) Int. Cl.
*H10K 50/824* (2023.01)
*H10K 71/00* (2023.01)

(52) U.S. Cl.
CPC ........... *H10K 50/824* (2023.02); *H10K 71/00* (2023.02)

(58) Field of Classification Search
CPC .... H10K 50/824; H10K 71/00; H10K 59/122; H10K 71/60; H01L 25/167
See application file for complete search history.

(56) References Cited

U.S. PATENT DOCUMENTS

| | | | |
|---|---|---|---|
| 3,928,480 A | 12/1975 | Tabushi et al. |
| 4,022,928 A | 5/1977 | Piwcyzk |
| 4,832,983 A | 5/1989 | Nagatomi et al. |
| 5,015,758 A | 5/1991 | Pilgrim et al. |
| 5,399,936 A | 3/1995 | Namiki et al. |

(Continued)

FOREIGN PATENT DOCUMENTS

| | | |
|---|---|---|
| CA | 2890253 A1 | 5/2014 |
| CN | 101299419 A | 11/2008 |

(Continued)

OTHER PUBLICATIONS

International Search Report for International Application No. PCT/IB2019/053706 dated Aug. 15, 2019.

(Continued)

*Primary Examiner* — Caleb E Henry
(74) *Attorney, Agent, or Firm* — Foley & Lardner LLP

(57) ABSTRACT

An opto-electronic device includes: (i) a substrate having a surface; (ii) a first electrode disposed over the surface; (iii) a semiconducting layer disposed over at least a portion of the first electrode; (iv) a second electrode disposed over the semiconducting layer; (v) a nucleation inhibiting coating disposed over at least a portion of the second electrode; (vi) a patterning structure disposed over the surface, the patterning structure providing a shadowed region between the patterning structure and the second electrode; (vii) an auxiliary electrode disposed over the surface; and (viii) a conductive coating disposed in the shadowed region, the conductive coating electrically connecting the auxiliary electrode and the second electrode.

20 Claims, 28 Drawing Sheets

(56) References Cited

U.S. PATENT DOCUMENTS

| | | |
|---|---|---|
| 6,016,033 A | 1/2000 | Jones et al. |
| 6,407,408 B1 | 6/2002 | Zhou et al. |
| 6,465,115 B2 | 10/2002 | Shi et al. |
| 6,472,468 B1 | 10/2002 | Omura |
| 6,538,374 B2 | 3/2003 | Hosokawa |
| 6,787,468 B2 | 9/2004 | Kim et al. |
| 6,794,061 B2 | 9/2004 | Liao et al. |
| 6,835,950 B2 | 12/2004 | Brown et al. |
| 6,900,470 B2 | 5/2005 | Kobayashi et al. |
| 6,927,270 B2 | 8/2005 | Lichtenhan et al. |
| 6,995,035 B2 | 2/2006 | Cok et al. |
| 7,018,713 B2 | 3/2006 | Padiyath |
| 7,099,299 B2 | 8/2006 | Liang et al. |
| 7,105,298 B2 | 9/2006 | Liu et al. |
| 7,175,815 B2 | 2/2007 | Yamasaki et al. |
| 7,193,015 B1 | 3/2007 | Mabry et al. |
| 7,217,683 B1 | 5/2007 | Blanski et al. |
| 7,319,129 B2 | 1/2008 | Yoshida et al. |
| 7,363,308 B2 | 4/2008 | Dillon et al. |
| 7,402,948 B2 | 7/2008 | Yamazaki et al. |
| 7,427,783 B2 | 9/2008 | Lee et al. |
| 7,449,539 B2 | 11/2008 | Morimoto et al. |
| 7,491,975 B2 | 2/2009 | Kubota |
| 7,495,389 B2 | 2/2009 | Noguchi et al. |
| 7,701,132 B2 | 4/2010 | Oh |
| 7,728,510 B2 | 6/2010 | Oh |
| 7,816,861 B2 | 10/2010 | Choi et al. |
| 7,839,083 B2 | 11/2010 | Kubota |
| 7,897,667 B2 | 3/2011 | Mabry et al. |
| 7,947,519 B2 | 5/2011 | Lee et al. |
| 7,956,351 B2 | 6/2011 | Choi |
| 7,986,672 B2 | 7/2011 | Tiedemann et al. |
| 8,004,180 B2 | 8/2011 | Seo |
| 8,030,838 B2 | 10/2011 | Kwak et al. |
| 8,044,580 B2 | 10/2011 | Yamazaki et al. |
| 8,089,066 B2 | 1/2012 | Yamazaki et al. |
| 8,115,376 B2 | 2/2012 | Fujioka et al. |
| 8,232,350 B2 | 7/2012 | Fujita et al. |
| 8,237,351 B2 | 8/2012 | Sung et al. |
| 8,310,149 B2 | 11/2012 | Lifka et al. |
| 8,318,878 B2 | 11/2012 | Sudo et al. |
| 8,343,637 B2 | 1/2013 | Parham et al. |
| 8,362,469 B2 | 1/2013 | Suh |
| 8,679,647 B2 | 3/2014 | Pflumm et al. |
| 8,703,303 B2 | 4/2014 | Yamamoto et al. |
| 8,766,306 B2 | 7/2014 | Lifka et al. |
| 8,795,847 B2 | 8/2014 | Heil et al. |
| 8,809,838 B2 | 8/2014 | Jeong et al. |
| 8,852,756 B2 | 10/2014 | Vestweber et al. |
| 8,872,206 B2 | 10/2014 | Chung et al. |
| 8,895,972 B2 | 11/2014 | Chung et al. |
| 8,940,568 B2 | 1/2015 | Mohan et al. |
| 8,957,413 B2 | 2/2015 | Song et al. |
| 8,963,137 B2 | 2/2015 | Lee et al. |
| 8,963,414 B2 | 2/2015 | Sawabe |
| 8,986,852 B2 | 3/2015 | Stoessel et al. |
| 8,994,010 B2 | 3/2015 | Choi et al. |
| 9,018,621 B2 | 4/2015 | Park et al. |
| 9,024,307 B2 | 5/2015 | Lee |
| 9,040,962 B2 | 5/2015 | Adamovich et al. |
| 9,051,344 B2 | 6/2015 | Lin et al. |
| 9,064,755 B2 | 6/2015 | Park et al. |
| 9,076,993 B2 | 7/2015 | Kim et al. |
| 9,088,004 B2 | 7/2015 | Chung et al. |
| 9,093,403 B2 | 7/2015 | Kim et al. |
| 9,093,669 B2 | 7/2015 | Park et al. |
| 9,105,865 B2 | 8/2015 | Chung et al. |
| 9,105,867 B2 | 8/2015 | Verschuuren et al. |
| 9,126,970 B2 | 9/2015 | Pflumm |
| 9,231,030 B2 | 1/2016 | Choi et al. |
| 9,245,934 B2 | 1/2016 | Chung et al. |
| 9,246,123 B2 | 1/2016 | Kim et al. |
| 9,287,339 B2 | 3/2016 | Lee et al. |
| 9,293,515 B2 | 3/2016 | Choi |
| 9,331,308 B2 | 5/2016 | Choi et al. |
| 9,444,064 B2 | 9/2016 | Kaiser et al. |
| 9,450,027 B2 | 9/2016 | Pang et al. |
| 9,478,591 B2 | 10/2016 | Nam et al. |
| 9,570,471 B2 | 2/2017 | Heo et al. |
| 9,595,681 B2 | 3/2017 | Mujica-Fernaud |
| 9,624,193 B2 | 4/2017 | Aihara |
| 9,660,195 B2 | 5/2017 | Kawamura et al. |
| 9,711,751 B2 | 7/2017 | Prushinskiy et al. |
| 9,748,318 B2 | 8/2017 | Shim et al. |
| 9,776,983 B2 | 10/2017 | Marchionni et al. |
| 9,859,520 B2 | 1/2018 | Kim |
| 9,954,039 B2 | 4/2018 | Im et al. |
| 9,960,216 B2 | 5/2018 | Lee et al. |
| 9,960,386 B2 | 5/2018 | Thompson et al. |
| 9,966,554 B2 | 5/2018 | Lee et al. |
| 10,032,843 B2 | 7/2018 | Lee et al. |
| 10,084,019 B2 | 9/2018 | Shim et al. |
| 10,084,150 B1 | 9/2018 | Lou |
| 10,090,370 B2 | 10/2018 | Lee et al. |
| 10,147,769 B2 | 12/2018 | Lee et al. |
| 10,177,206 B2 | 1/2019 | Jung et al. |
| 10,181,573 B2 | 1/2019 | Im |
| 10,186,568 B2 | 1/2019 | Kim et al. |
| 10,224,386 B2 | 3/2019 | Rieutort-Louis et al. |
| 10,240,084 B2 | 3/2019 | Molaire |
| 10,263,185 B2 | 4/2019 | Matsueda et al. |
| 10,269,879 B2 | 4/2019 | Shim et al. |
| 10,276,641 B2 | 4/2019 | Lou |
| 10,297,762 B2 | 5/2019 | Zeng et al. |
| 10,361,375 B2 | 7/2019 | Zeng et al. |
| 10,501,583 B2 | 12/2019 | Song et al. |
| 10,658,625 B2 * | 5/2020 | Takagi .................. H10K 50/11 |
| 10,700,304 B2 | 6/2020 | Helander et al. |
| 11,335,855 B2 * | 5/2022 | Chang ................ H10K 50/828 |
| 2002/0090811 A1 | 7/2002 | Kim et al. |
| 2002/0189392 A1 | 12/2002 | Molstad |
| 2003/0196987 A1 | 10/2003 | Kung et al. |
| 2005/0052118 A1 | 3/2005 | Lee et al. |
| 2005/0175770 A1 | 8/2005 | Liao et al. |
| 2006/0125390 A1 | 6/2006 | Oh |
| 2007/0077349 A1 | 4/2007 | Newman et al. |
| 2007/0178405 A1 | 8/2007 | Kanda et al. |
| 2009/0033208 A1 | 2/2009 | Nagayama et al. |
| 2009/0199903 A1 | 8/2009 | Oyamada et al. |
| 2010/0078628 A1 | 4/2010 | Chi et al. |
| 2010/0193768 A1 | 8/2010 | Habib |
| 2010/0244197 A1 | 9/2010 | Arena et al. |
| 2011/0006289 A1 | 1/2011 | Mizuki et al. |
| 2011/0094889 A1 | 4/2011 | Shin et al. |
| 2011/0175031 A1 | 7/2011 | Matsunami et al. |
| 2011/0186820 A1 | 8/2011 | Kim et al. |
| 2011/0309307 A1 | 12/2011 | Zeika et al. |
| 2012/0003484 A1 | 1/2012 | Roehrig et al. |
| 2012/0018770 A1 | 1/2012 | Lu et al. |
| 2012/0146030 A1 | 6/2012 | You et al. |
| 2012/0187541 A1 | 7/2012 | Arena et al. |
| 2013/0049024 A1 | 2/2013 | Choi et al. |
| 2013/0056784 A1 | 3/2013 | Lee et al. |
| 2013/0112952 A1 | 5/2013 | Adamovich et al. |
| 2014/0070236 A1 | 3/2014 | Chen et al. |
| 2014/0103306 A1 | 4/2014 | Moon et al. |
| 2014/0110680 A1 | 4/2014 | Choe |
| 2014/0186983 A1 | 7/2014 | Kim et al. |
| 2014/0231761 A1 | 8/2014 | Kim et al. |
| 2014/0299866 A1 | 10/2014 | Ruske et al. |
| 2014/0353601 A1 | 12/2014 | Cho et al. |
| 2014/0353611 A1 | 12/2014 | Choi et al. |
| 2015/0090989 A1 | 4/2015 | Matsumoto et al. |
| 2015/0097171 A1 | 4/2015 | Kim et al. |
| 2015/0144902 A1 | 5/2015 | Do et al. |
| 2015/0287846 A1 * | 10/2015 | Helander ................ H01L 31/18 427/256 |
| 2015/0376768 A1 | 12/2015 | Veres et al. |
| 2016/0013438 A1 | 1/2016 | Im et al. |
| 2016/0043341 A1 | 2/2016 | Heo et al. |
| 2016/0104859 A1 | 4/2016 | Kim et al. |
| 2016/0149156 A1 | 5/2016 | Kim et al. |
| 2016/0180763 A1 | 6/2016 | Park et al. |
| 2016/0211454 A1 | 7/2016 | Kim et al. |

(56) References Cited

U.S. PATENT DOCUMENTS

| | | | |
|---|---|---|---|
| 2016/0293888 A1 | 10/2016 | Shim et al. | |
| 2016/0351638 A1 | 12/2016 | Im et al. | |
| 2017/0018733 A1 | 1/2017 | Jin et al. | |
| 2017/0033166 A1 | 2/2017 | Shim et al. | |
| 2017/0062755 A1 | 3/2017 | Im et al. | |
| 2017/0125495 A1 | 5/2017 | Lee et al. | |
| 2017/0125506 A1 | 5/2017 | Kim | |
| 2017/0155078 A1 | 6/2017 | Lee | |
| 2017/0170246 A1 | 6/2017 | Im et al. | |
| 2017/0186831 A1 | 6/2017 | Nam et al. | |
| 2017/0317154 A1 | 11/2017 | Heo | |
| 2017/0338438 A1 | 11/2017 | Kwon et al. | |
| 2018/0006264 A1 | 1/2018 | Lee et al. | |
| 2018/0040685 A1 | 2/2018 | Yeo et al. | |
| 2018/0061323 A1 | 3/2018 | Kwon et al. | |
| 2018/0062104 A1 | 3/2018 | Kwon et al. | |
| 2018/0083217 A1 | 3/2018 | Chung et al. | |
| 2018/0090063 A1 | 3/2018 | Ying et al. | |
| 2018/0102499 A1 | 4/2018 | Pyo et al. | |
| 2018/0123078 A1 | 5/2018 | Byun et al. | |
| 2018/0158881 A1 | 6/2018 | Lim et al. | |
| 2018/0166518 A1 | 6/2018 | Kim | |
| 2018/0198080 A1 | 7/2018 | Noh et al. | |
| 2018/0212060 A1 | 7/2018 | Kang et al. | |
| 2018/0219058 A1 | 8/2018 | Xiang et al. | |
| 2018/0226455 A1 | 8/2018 | Kim et al. | |
| 2018/0226581 A1* | 8/2018 | Chang | H10K 50/828 |
| 2018/0261797 A1 | 9/2018 | Lee | |
| 2018/0294436 A1 | 10/2018 | Choi et al. | |
| 2018/0309085 A1 | 10/2018 | Park et al. | |
| 2018/0337219 A1 | 11/2018 | Rhee et al. | |
| 2018/0366678 A1 | 12/2018 | Chi et al. | |
| 2019/0081111 A1 | 3/2019 | Lee et al. | |
| 2019/0088204 A1 | 3/2019 | Zhang et al. | |
| 2019/0130822 A1 | 5/2019 | Jung et al. | |
| 2019/0237517 A1 | 8/2019 | Hack | |
| 2019/0250450 A1 | 8/2019 | Li | |
| 2019/0253591 A1 | 8/2019 | Chen et al. | |
| 2019/0273125 A1 | 9/2019 | Takechi | |
| 2019/0305246 A1* | 10/2019 | Helander | H10K 50/828 |
| 2019/0317629 A1 | 10/2019 | Jung et al. | |
| 2019/0325805 A1 | 10/2019 | Moon et al. | |
| 2019/0340980 A1 | 11/2019 | Yum et al. | |
| 2019/0341435 A1 | 11/2019 | Chang et al. | |
| 2019/0341575 A1 | 11/2019 | Chung et al. | |
| 2019/0348627 A1 | 11/2019 | Lee et al. | |
| 2020/0035951 A1 | 1/2020 | Cheon et al. | |
| 2020/0044197 A1 | 2/2020 | Shedletsky et al. | |
| 2020/0064968 A1 | 2/2020 | Kim et al. | |
| 2020/0075683 A1 | 3/2020 | Polyakov et al. | |
| 2020/0075693 A1 | 3/2020 | Polyakov et al. | |
| 2020/0075864 A1* | 3/2020 | Helander | H10K 50/824 |
| 2020/0194676 A1* | 6/2020 | Chang | H10K 85/631 |
| 2020/0280017 A1* | 9/2020 | Helander | H10K 50/80 |
| 2021/0047536 A1* | 2/2021 | Chang | H10K 50/824 |
| 2021/0135150 A1* | 5/2021 | Wang | H01L 25/167 |
| 2022/0013594 A1* | 1/2022 | Wang | H10K 59/121 |
| 2022/0238806 A1* | 7/2022 | Chang | C09K 11/06 |
| 2022/0246853 A1* | 8/2022 | Chang | C09K 11/06 |

FOREIGN PATENT DOCUMENTS

| | | |
|---|---|---|
| CN | 101617064 A | 12/2009 |
| CN | 101730938 A | 6/2010 |
| CN | 102456713 A | 5/2012 |
| CN | 102738409 A | 10/2012 |
| CN | 103178079 B | 6/2013 |
| CN | 104037359 A | 9/2014 |
| CN | 104769149 A | 7/2015 |
| CN | 105094451 A | 11/2015 |
| CN | 105097877 A | 11/2015 |
| CN | 105206650 A | 12/2015 |
| CN | 105206753 A | 12/2015 |
| CN | 106206995 A | 12/2016 |
| CN | 106992267 A | 7/2017 |
| CN | 107564945 A | 1/2018 |
| CN | 107808895 A | 3/2018 |
| CN | 108376019 A | 8/2018 |
| CN | 108389878 A | 8/2018 |
| CN | 108418928 A | 8/2018 |
| CN | 108630830 A | 10/2018 |
| CN | 108767136 A | 11/2018 |
| CN | 108881531 A | 11/2018 |
| CN | 108900659 A | 11/2018 |
| CN | 109299631 A | 2/2019 |
| CN | 109461758 A | 3/2019 |
| CN | 109599030 A | 4/2019 |
| CN | 109742132 A | 5/2019 |
| CN | 109817672 A | 5/2019 |
| CN | 109817694 A | 5/2019 |
| CN | 109830495 A | 5/2019 |
| CN | 109920931 A | 6/2019 |
| CN | 109950293 A | 6/2019 |
| CN | 110112182 A | 8/2019 |
| CN | 110767682 A | 2/2020 |
| CN | 110767708 A | 2/2020 |
| CN | 110767709 A | 2/2020 |
| CN | 110767713 A | 2/2020 |
| CN | 110767830 A | 2/2020 |
| CN | 110767835 A | 2/2020 |
| CN | 110767836 A | 2/2020 |
| CN | 110767844 A | 2/2020 |
| CN | 110914891 A | 3/2020 |
| EP | 1 850 368 A1 | 10/2007 |
| EP | 1 873 162 A1 | 1/2008 |
| EP | 2 248 849 B1 | 11/2010 |
| EP | 2 998 997 A1 | 3/2016 |
| EP | 3 182 477 A1 | 6/2017 |
| EP | 3 240 036 A1 | 11/2017 |
| EP | 3 316 311 A1 | 5/2018 |
| EP | 3 331 045 A1 | 6/2018 |
| EP | 3 336 899 A1 | 6/2018 |
| EP | 3 406 752 A1 | 11/2018 |
| EP | 3 499 576 A1 | 6/2019 |
| JP | 2004-352815 A | 12/2004 |
| JP | 2007-188854 A | 7/2007 |
| JP | 2010-258410 A | 11/2010 |
| JP | 2012-253015 A | 12/2012 |
| JP | 5233074 B2 | 7/2013 |
| JP | 2013-219278 A | 10/2013 |
| JP | 2014-107268 A | 6/2014 |
| KR | 20100054630 A | 5/2010 |
| KR | 20100123735 A | 11/2010 |
| KR | 20140062258 A | 5/2014 |
| KR | 20150127368 A | 11/2015 |
| KR | 101640772 B1 | 7/2016 |
| KR | 20170030168 A | 3/2017 |
| KR | 20170075865 A | 7/2017 |
| KR | 20180115655 A | 10/2018 |
| KR | 20180121304 A | 11/2018 |
| TW | 201929219 A | 7/2019 |
| WO | WO-2011/012212 A1 | 2/2011 |
| WO | WO-2011/049284 A1 | 4/2011 |
| WO | WO-2014/104703 A1 | 7/2014 |
| WO | WO-2016/056364 A1 | 4/2016 |
| WO | WO-2017/072678 A1 | 5/2017 |

OTHER PUBLICATIONS

Hoge, J. Novel Benzoxazine Resin System for Flame Retardant Aircraft.
025-07-JP NP (JP 2020-562755): English translation of office action dated Feb. 2, 2023.
Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.
Allcock, H.R. "Phosphorus-nitrogen Compounds", pp. 400-407, Academic Press (1972).
Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.

(56) References Cited

OTHER PUBLICATIONS

Allcock, Harry R., and Dawn E. Smith. "Surface studies of poly (organophosphazenes) containing dimethylsiloxane grafts." Chemistry of materials 7.8 (1995): 1469-1474.

Allcock, Harry R., and Michael L. Turner. "Ring expansion and polymerization of transannular bridged cyclotriphosphazenes and their spirocyclic analogs." Macromolecules 26.1 (1993): 3-10.

Allcock, Harry R., Gayann S. McDonnell, and James L. Desorcie. "Ring expansion and equilibration in organophosphazenes and the relationship to polymerization." Inorganic chemistry 29.19 (1990): 3839-3844.

Allcock, Harry R., Michael L. Turner, and Karyn B. Visscher. "Synthesis of transannular-and spiro-substituted cyclotriphosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4 O2C10H6]." Inorganic chemistry 31.21 (1992): 4354-4364.

Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.

Aqra, Fathi, and Ahmed Ayyad. "Surface free energy of alkali and transition metal nanoparticles." Applied surface science 314 (2014): 308-313.

Araki, H. and Naka, K., "Syntheses and Properties of Dumbbell-Shaped POSS Derivatives Linked by Luminescent p-Conjugated Units", Polymer Chemistry, 50.20 (2012):4170-4181.

Araki, H. and Naka, K., "Syntheses and Properties of Star- and Dumbbell-Shaped POSS Derivatives Containing Isobutyl Groups", Polymer Journal, 44 (2012):340-346.

Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.

Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.

Bae, J. et al. "Optically recoverable, deep ultraviolet (UV) stable and transparent sol-gel fluoro siloxane hybrid material for a UV LED encapsulant." RSC advances 6.32 (2016): 26826-26834.

Baradie, B. et al. "Synthesis and characterization of novel polysiloxane-grafted fluoropolymers." Canadian journal of chemistry 83.6-7 (2005): 553-558.

Barry, B., "Routes to Silsesquioxanes Functionalization—Capping of DDSQs for the Synthesis of Asymmetric POSS Compounds", Masters Thesis, Michigan State University (2019).

Bechtolsheim, C. V., V. Zaporojtchenko, and F. Faupel. "Interface structure and formation between gold and trimethylcyclohexane polycarbonate." Journal of materials research 14.9 (1999): 3538-3543.

Bertolucci, M. et al. "Wetting Behavior of Films of New Fluorinated Styrene—Siloxane Block Copolymers." Macromolecules 37.10 (2004): 3666-3672.

Besli, S. et al., "Bridged Cyclophosphazenes Resulting From Deprotonation Reactions of Cyclotriphophazenes Bearing a P-NH Group", 40.19 (2011):5307.

Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.

Biederman, H. et al., "The Properties of Fluorocarbon Films Prepared by R.F.Sputtering and Plasma Polymerization in Inert and Active Gas", Thin Solid Films, 41.3 (1977):329-339.

Blanchet, G.B., "Deposition of Amorphous Fluoropolymers Thin Films by Laser Ablation", Appl. Phys. Lett. 62 (1993):479-481.

Blanco, I., "The Rediscovery of POSS: A Molecule Rather than a Filler", Polymers, 10.8 (2018):904-914.

Boyne, D. et al., "Vacuum Thermal Evaporation of Polyaniline Doped with Camphor Sulfonic Acid", Journal of Vacuum Science & Technology A, 33.3 (2015):031510.

Brickley, J.F. et al., "Supramolecular Variations on a Molecular Theme: the Structural Diversity of Phosphazenes (RNH)6P3N3 in the Solid State", Dalton Trans., 7 (2003):1235-1244.

Brown, Douglas E., et al. "Poly[(vinyloxy)cyclophosphazenes]." Macromolecules 34.9 (2001), 2870-2875.

Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.

Buzin, M. I., et al. "Solid-state polymerization of hexaphenylcyclotrisiloxane." Journal of Polymer Science Part A: Polymer Chemistry 35.10 (1997): 1973-1984.

Camino, G. et al., "Polydimethylsiloxane Thermal Degradation Part 1. Kinetic Aspects", Polymer, 42.6 (2001):2395-2402.

Chan, E.P. et al., "Viscoelastic Properties of Confined Polymer Films Measured via Thermal Wrinkling", Soft Matter, 5.23 (2009):4638-4641.

Chan, K.L. et al., "Cubic Silsesquioxanes for Use in Solution Processable Organic Light Emitting Diodes (OLED)", Journal of Materials Chemistry, 19.48 (2009):9103-9120.

Chandrasekhar, V. et al., "Cyclophosphazene-Based Multi-Site Coordination Ligands", Coordination Chemistry Reviews, 251.9-10 (2007):1045-1074.

Chen, B. J., X. W. Sun, and S. C. Tan. "Transparent organic light-emitting devices with LiF/Mg: Ag cathode." Optics express 13.3 (2005): 937-941.

Chen, G. K. J., and J. Chen. "Flexible displays: Flexible AMOLED manufacturing." Handbook of Visual Display Technology; Chen, J., Cranton, W., Fihn, M., Eds (2016).

Chen, Yu-Hung, et al. "58.2: High-Performance Large-Size OLED TV with Ultra HD Resolution." SID Symposium Digest of Technical Papers. vol. 46. No. 1. 2015.

Ching, Suet Ying. Plasmonic properties of silver-based alloy thin films. Diss. Hong Kong Baptist University, 2015.

Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.

Cordes, D.B. et al., "Recent Developments in the Chemistry of Cubic Polyhedral Oligosilsesquioxanes", Chem. Rev., 110 (2010):2081-2173.

Dalvi, V.H. and Rossky, P.J., "Molecular Origins of Fluorocarbon Hydrophobicity", PNAS, 107.31 (2010):13603-13607.

David, Robert, Neumann, A. Wilhelm. "A Theory for the Surface Tensions and Contact Angles of HydrogenBonding Liquids." Langmuir 30.39 (2014):11634-11639.

De Wilde, W., "Evaporation of Polytetrafluoroethylene by Electron Bombardment of the Bulk Material", Thin Solid Films, 24.1 (1974):101-111.

Dong, H. et al., "Surface Properties and Thermal Stability of a Novel Low-Surface-Energy Polybenzoxazine/Clay Nanocomposites", Polymer Composites, 33.8 (2012):1313-1320.

Drelich, J. et al., "Hydrophilic and Superhydrophilic Surfaces and Materials", Soft Matter, 7.21 (2011):9804-9828.

Dubrovskii, Vladimir. "Fundamentals of Nucleation Theory." Nucleation Theory and Growth of Nanostructures. Springer, Berlin, Heidelberg, 2014. 1-73.

Dudziec, B. and Marciniec, B., "Double-decker Silsesquioxanes: Current Chemistry and Applications", Current Organic Chemistry, 21.28 (2017):2794-2813.

Dudziec, B. et al., "Synthetic Routes to Silsesquioxane-Based Systems as Photoactive Materials and Their Precursors", Polymers, 11.3 (2019):504-542.

Dutkiewicz, M. et al., "New Fluorocarbofunctional Spherosilicates: Synthesis and Characterization", Organometallics, 30.8 (2011):2149-2153.

Eguchi, Shingo, et al. "35-1: Strategy for Developing an Ultra-High-Luminance AMOLED Display." SID Symposium Digest of Technical Papers. vol. 49. No. 1. 2018.

(56) References Cited

OTHER PUBLICATIONS

Eilers, H., et al. "Teflon AF/Ag nanocomposites with tailored optical properties." Journal of materials research 21.9 (2006): 2168-2171.
Ellison, A. H., H. W. Fox, and W. A. Zisman. "Wetting of fluorinated solids by hydrogen-bonding liquids." The Journal of Physical Chemistry 57.7 (1953): 622-627.
Faupel, F., et al. "Nucleation, growth, interdiffusion, and adhesion of metal films on polymers."?AIP Conference Proceedings. vol. 491. No. 1. American Institute of Physics, 1999.
Feher, F.J. and Budzichowski, T.A., "Silasesquioxanes as Ligands in Inorganic and Organometallic Chemistry", Polyhedron, 14.22 (1995):3239-3253.
Flores-Camacho, Jose Manuel, et al. "Growth and optical properties of Ag clusters deposited on poly (ethylene terephthalate)." Nanotechnology 22.27 (2011): 275710.
Forrest, James A. Reductions of the glass transition temperature in thin polymer films: Probing the length scale.
Fowkes, Frederick M. "Attractive Forces at Interfaces." Industrial and Engineering Chemistry 56.12 (1964): 40-52.
Fox, H.W. et al., "Polyorganosiloxanes . . . Surface Active Properties", Ind. Eng. Chem., 39.11 (1947):1401-1409.
Frey, Kurt, et al. "Implications of coverage-dependent O adsorption for catalytic No oxidation on the late transition metals." Catalysis Science & Technology 4.12 (2014): 4356-4365.
Fryer, David S., et al. "Dependence of the glass transition temperature of polymer films on interfacial energy and thickness."? Macromolecules?34.16 (2001): 5627-5634.
Gabler, D.G. and Haw, J.F., "Hydrolysis Chemistry of the Chlorophosphazene Cyclic Trimer", Inorganic Chemistry, 29.20 (1990):4018-4021.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.
Gao Y., "Microphase Separation of Stimulus-Responsive Block-co-Polypeptides on Surfaces", Master's thesis, Duke University (2018).
Giebink, C. "Catastrophic OLED failure and pathways to address it" Department of Energy, url:https://www.energy.gov/sites/prod/files/2018/02/f48/giebink_oled-failure_nashville18_0.pdf (2018).
Gogoi, N. et al., "Low-Surface-Energy Materials Based on Polybenzoxazines for Surface Modification of Textiles", The Journal of The Textile Institute, 105.11 (2014):1212-1220.
Golovin, K. et al., "Low-Interfacial Toughness Materials for Effective Large-Scale Deicing", Science, 364.6438 (2019):371-375.
Grant Norton, M. et al., "Pulsed Laser Ablation and Deposition of Fluorocarbon Polymers", Applied Surface Science, 96-98 (1996):617-620.
Gritsenko, K.P. and Krasovsky, A.M., "Thin-Film Deposition of Polymers by Vacuum Degradation", Chem. Rev., 103.9 (2003):3607-3649.
Grytsenko, K. "Vacuum-deposited fluoropolymer films for organic electronics" International Symposium on Plastics Electronics (Part of Semicon Europe-2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016):139-148.
Heaney, James B. "Evaluation of commercially supplied silver coated Teflon for spacecraft temperature control usage." (1974).
Ho, P. S. "Chemistry and adhesion of metal-polymer interfaces." Applied surface science 41 (1990):559-566.
Ho, P. S., et al. "Chemical bonding and reaction at metal/polymer interfaces." Journal of Vacuum Science & Technology A: Vacuum, Surfaces, and Films 3.3 (1985): 739-745.
Holland, L. et al., "Sputtered and Plasma Polymerized Fluorocarbon Films", Thin Solid Films, 35 (1976): L19-L21.
Hwang, S. et al., "ChemInform Abstract: Dendritic Macromolecules for Organic Light-Emitting Diodes", Chemical Society Reviews, 37.11 (2008):2543-2557.
Iacono, S. T. et al. "Fluorinated polyhedral oligomeric silsesquioxanes (F-POSS), and pathways to address it", Defense Technical Information Center, url:https://apps.dtic.mil/sti/citations/ADA533422 (2010).
Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009):125-135.
Ikonnikov, D.A., "Controlling Multiple Diffraction with Quasiperiodic Gratings", Laser Phys. Lett., 16.12 (2019):126202.
Imoto, H. et al., "Tripodal Polyhedral Oligomeric Silsesquioxanes as a Novel Class of Three-Dimensional Emulsifiers", Polymer Journal, 47 (2015):609-615.
Interior Applications The Sixth Triennial International Aircraft Fire and Cabin Safety Research (2010).
Ito, Hitoshi, et al. "Synthesis and Thermal Properties of Fully Aromatic Polysilarylenesiloxanes." Polymer Journal 38.2 (2006): 109-116.
Ivleva, E.A. et al., "Synthesis of Adamantane Functional Derivatives Basing on N-[(Adamantan-1-yl)alkyl]acetamides", Russian Journal of Organic Chemistry, 52.11 (2016):1558-1564.
Iwamori, S. et al., "Adsorption Properties of Fluorocarbon Thin Films Prepared by Physical Vapor Deposition Methods", Surface & Coatings Technology, 204:16-17 (2010):2803-2807.
Iwamori, S., "Adhesion and Friction Properties of Fluorocarbon Polymer Thin Films Coated onto Metal Substrates", Key Engineering Materials, 384 (2008):311-320.
Jarvis, N.L. and Zisman, W.A., "Surface Chemistry of Fluorochemicals", Defense Technical Information Center (1965):1-37.
Jiao, Zhiqiang, et al. "61-2: Weakening Micro-Cavity Effects in White Top-Emitting WOLEDs with Semitransparent Metal Top Electrode."?SID Symposium Digest of Technical Papers. vol. 49. No. 1. 2018.
Kaesler, K., "The hidden defenders: Silane and siloxane impregnation protects construction materials", European coatings journal, 3 (2006):36-41.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning." SID Symposium Digest of Technical Papers. vol. 46. No. 1. 2015.
Kim, Haewon, et al. "Analysis of Semi-Transparent Cathode Performance Based on Fabrication Methods." IDW '19. 2019.
Kim, J.H. et al., "Thickness and Composition Dependence of the Glass Transition Temperature in Thin Homogeneous Polymer Blend Films", Macromolecules, 35.1 (2002):311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001):386-389.
Kim, S. et al., "Origin of Macroscopic Adhesion in Organic Light-Emitting Diodes Analyzed at Different Length Scales", Scentific Reports, 8.6391 (2018): 1-7.
Kim, S.K.,et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kisin, Srdjan.?Adhesion changes at metal-polymer interfaces: Study of the copper—(acrylonitrile-butadiene-styrene) system. Diss. Dissertation, Technische Universiteit Eindhoven, 2007.

(56) References Cited

OTHER PUBLICATIONS

Kiskan, B., "Adapting Benzoxazine Chemistry for Unconventional Applications", Reactive and Functional Polymers, 129 (2018):76-88.
Knight Jr, L. B., et al. "Unusual behavior of vaporized magnesium under low pressure conditions."?The Journal of Physical Chemistry? 79.12 (1975): 1183-1190.
Koh, K et al., "Precision Synthesis of a Fluorinated Polyhedral Oligomeric Silsesquioxane—Terminated Polymer and Surface Characterization of Its Blend Film with Poly(methyl methacrylate)", Macromolecules, 38.4 (2005):1264-1270.
Koma, N. et al. "44.2: Novel Front-light System Using Fine-pitch Patterned OLED." SID Symposium Digest of Technical Papers, 39: 655-658. 2008.
Kota, A.K. et al., "The Design and Applications of Superomniphobic Surfaces", NPG Asia Materials, 6109 (2014):1-16.
Kovacik, P. et al., "Vacuum-Deposited Planar Heterojunction Polymer Solar Cells", ACS Appl. Mater. Interfaces, 3.1 (2011):11-15.
Krishnan, S. et al., "Fluorinated Polymers: Liquid Crystalline Properties and Applications in Lithography", The Chemical Record, 4.5 (2004):315-330.
Kunthom, R. et al., "Synthesis and Characterization of Unsymmetrical Double-Decker Siloxane (Basket Cage)", Molecules, 24.23 (2019):4252.
Kuo, S. et al., "Preparing Low-Surface-Energy Polymer Materials by Minimizing Intermolecular Hydrogen-Bonding Interactions", J. Phys. Chem. C, 113.48 (2009):20666-20673.
Kwon, Sun-kap, et al. "Efficient micro-cavity top emission OLED with optimized Mg: Ag ratio cathode." Optics Express 25.24 (2017): 29906-29915.
Lanoux, S. and Mas, R.H., "Reactions of the Hydrolyzed Phosphazene N3P3(OCH2CF3)5ONa", Phosphorus and Sulfur and the Related Elements, 26.2 (1986):139-142.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs."?SID Symposium Digest of Technical Papers. vol. 46. No. 1. 2015.
Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.
Li, P. et al. "Preparation and application of fluorinated-siloxane protective surface coating material for stone inscriptions." Journal of Polymer Engineering 35.6 (2015): 511-522.
Lifka, H. et al. "P-169: Single Side Emitting Transparent OLED Lamp." SID Symposium Digest of Technical Papers, 42: 1737-1739. 2011.
Liu, C. et al., "Mechanistic Studies on Ring-Opening Polymerization of Benzoxazines: A Mechanistically Based Catalyst Design", Macromolecules, 44.12 (2011):4616-4622.
Liu, F. et al. "Syntheses and structure of the first eight-membered fluoro and chloro hafnium siloxane complexes" Zeitschrift für anorganische und allgemeine Chemie 622.5 (1996): 819-822.
Liu, Yang, et al. "P-168: Top Emission WOLED for High Resolution OLED TV." SID Symposium Digest of Technical Papers. vol. 49. No. 1. 2018.
Liu, Z. et al., "Two-Dimensional Gratings of Hexagonal Holes for High Order Diffraction Suppression", Optics Express, 25.2 (2017): 1339-1349.
Lowe, R.D. et al., "Deposition of Dense Siloxane Monolayers from Water and Trimethoxyorganosilane Vapor", Langmuir, 27.16 (2011):9928-9935.
Lu, H. and Nutt, S., "Restricted Relaxation in Polymer Nanocomposites near the Glass Transition", Macromolecules, 36.11 (2003):4010-4016.
Lu, T. et al., "Blended Hybrids Based on Silsesquioxane-OH and Epoxy Resins", Journal of Applied Polymer Science, 106.6 (2007):4117-4123.

Lund, L. G., et al. "514. Phosphonitrilic derivatives. Part I. The preparation of cyclic and linear phosphonitrilic chlorides." Journal of the Chemical Society (Resumed) (1960): 2542-2547.
Mabry, J.M. et al., "Fluorinated Polyhedral Oligomeric Silsesquioxanes (F-POSS)", Angew. Chem. Int. Ed., 47.22 (2008):4137-4140.
Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.
Mackus, A.J.M. et al. "From the bottom-up: toward area-selective atomic layer deposition with high selectivity" Chemistry of Materials 31.1 (2018): 2-12.
Maissel, Leon I., and Maurice H. Francombe. An introduction to thin films. CRC Press, 1973. pp. 61-83, 198, 199.
Majhy, B. et al., "Facile Fabrication and Mechanistic Understanding of a Transparent Reversible Superhydrophobic—Superhydrophilic Surface", Scientific Reports, 8 (2018):18018.
Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.
Meinders, Marcel BJ, William Kloek, and Ton van Vliet. "Effect of surface elasticity on Ostwald ripening in emulsions." Langmuir 17.13 (2001): 3923-3929.
Mikhaylov, D.Y. and Budnikova, Y.H., "Fluoroalkylation of Organic Compounds", Russian Chemical Reviews, 82.9 (2013):835-864.
Mittal, Kashmiri Lal, ed. Metallized plastics 3: fundamental and applied aspects. Springer Science & Business Media, 2012.
Morgenstern, Karina, Georg Rosenfeld, and George Comsa. "Decay of two-dimensional Ag islands on Ag (111)." Physical review letters 76.12 (1996): 2113.
Mugisawa, M. et al., "Synthesis and Application of Novel Fluoroalkyl End-Capped Cooligomers Having Adamantane as a Pendant Group", Colloid Polym Sci, 285 (2007):737-744.
Murano, Sven, et al. "30.3: Invited Paper: AMOLED Manufacturing—Challenges and Solutions from a Material Makers Perspective." SID Symposium Digest of Technical Papers. vol. 45. No. 1. 2014.
Muray, M. et al., "NMR Studies of Hydrolysis and Rearrangement Reactions of Cyclophosphazenes", Phosphorus, Sulfur, and Silicon and the Related Elements, 65.1-4 (1992):83-86.
Nakamura, Daiki, et al. "68-4: Top-emission OLED Kawara-type Multidisplay with Auxiliary Electrode." SID Symposium Digest of Technical Papers. vol. 49. No. 1. 2018.
Nason, T.C. et al., "Deposition of Amorphous Fluoropolymer Thin Films by Thermolysis of Teflon Amorphous Fluoropolymer", Appl. Phys. Lett. 60 (1992):1866-1868.
Nasrallah, H. and Hierso, J., "Porous Materials Based on 3-Dimensional TD-Directing Functionalized Adamantane Scaffolds and Applied as Recyclable Catalysts", Chem. Mater., 31.3 (2019):619-642.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on -CF3 Alignment", Langmuir, 15 (1999):4321-4323.
Nittler, Laurent, et al. "Morphology study of small amounts of evaporated gold on polymers." Surface and interface analysis 44.8 (2012): 1072-1075.
Niu, J. et al., "High Order Diffraction Suppression by Quasi-Periodic Two-Dimensional Gratings", Optical Materials Express, 7.2 (2017):366-375.
Of cooperative dynamics." Physical Review E 61.1 (2000): R53-6.".
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Ohring, Milton. Materials science of thin films. Elsevier, 2001.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Okuyama, Kentaro, et al. "79-4L: Late-News Paper: Highly Transparent LCD using New Scattering-type Liquid Crystal with Field Sequential Color Edge Light." SID Symposium Digest of Technical Papers, 48, 2017.

(56) References Cited

OTHER PUBLICATIONS

Owen, M. J. "A review of significant directions in fluorosiloxane coatings" Surface Coatings International Part B: Coatings Transactions 87:B2 (2004).

Pandharkar, Riddhish, et al. "A Computational Study of AIF3 and ACF Surfaces." Inorganics 6.4 (2018): 124.

Park, Chan II, et al. "54-1: Distinguished Paper: World 1st Large Size 77-inch Transparent Flexible OLED Display.""?SID Symposium Digest of Technical Papers. vol. 49. No. 1. 2018.

Park, Jongwoong, et al. "8-1: The Method to Compensate IR-Drop of AMOLED Display." SID Symposium Digest of Technical Papers. vol. 50. No. 1. 2019.

Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.

Peters, Richard D., et al. "Using Self-Assembled Monolayers Exposed to X-rays To Control the Wetting Behavior of Thin Films of Diblock Copolymers." Langmuir 16.10 (2000): 4625-4631.

Pham, J.Q. and Green, P.F., "The Glass Transition of Thin Film Polymer/Polymer Blends: Interfacial Interactions and Confinement", J. Chem. Phys., 116.13 (2002):5801-5806.

Pu, T. et al., "Effects of Structure Parameters on High-Order Diffraction Suppression of Quasi-Periodic Gratings", Journal of the Optical Society of America B, 35.4 (2018):711-717.

Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.

Reichert, V.R. and Mathias, L.J., "Expanded Tetrahedral Molecules from 1,3,5,7-Tetraphenyladarnantane", Macromolecules, 27.24 (1994):7015-7023.

Riberiro, P et al., "Optics, Photonics and Laser Technology 2017", Chapters 2 and 3, Springer (2019).

Rokni-Fard, Mahroo, and Quanmin Guo. "Biased Ostwald ripening in site-selective growth of two-dimensional gold clusters." The Journal of Physical Chemistry C 122.14 (2018): 7801-7805.

Roy, M.R., "Surface Properties of Hard Fluorinated Amorphous Carbon Films Deposited by Pulsed-DC Discharges", Doctoral Thesis, Universitat de Barcelona (2012).

Safonov, Alexey I., et al. "Deposition of thin composite films consisting of fluoropolymer and silver nanoparticles having surface plasmon resonance." Thin Solid Films 603 (2016): 313-316.

Scharnberg, M., et al. "Radiotracer measurements as a sensitive tool for the detection of metal penetration in molecular-based organic electronics." Applied Physics Letters 86.2 (2005): 024104.

Schilling, C.I. et al., "Fourfold Suzuki—Miyaura and Sonogashira Cross-Coupling Reactions on Tetrahedral Methane and Adamantane Derivatives", Eur. J. Org. Chem., Sep. 2011 (2011):1743-1754.

Schissel, Paul, and Alvin Warren Czanderna. "Reactions at the silver/polymer interface: a review." Solar Energy Materials 3.1-2 (1980): 225-245.

Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.

Seebauer, E.G. and Allen, C.E., "Estimating Surface Diffusion Coefficients", Progress in Surface Science, 49.3 (1995): 265-330.

Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.

Senchyk, G.A. et al., "Functionalized Adamantane Tectons Used in the Design of Mixed-Ligand Copper(II) 1,2,4-Triazolyl/Carboxylate Metal-Organic Frameworks", Inorganic Chemistry, 52.2 (2013):863-872.

Sessler, C.D. et al., "CF2H, a Hydrogen Bond Donor", J. Am. Chem. Soc., 139.27 (2017):9325-9332.

Shen, Mingmin, et al. "Destabilization of Ag nanoislands on Ag (100) by adsorbed sulfur." The Journal of chemical physics 135.15 (2011): 154701.

Shih, H. et al., "A Cross-Linkable Triphenylamine Derivative as a Hole Injection/Transporting Material in Organic Light-Emitting Diodes", Polym. Chem., 6 (2015):6227-6237.

Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.

Shin, Dong-Youn, and Inyoung Kim. "Self-patterning of fine metal electrodes by means of the formation of isolated silver nanoclusters embedded in polyaniline."Nanotechnology?20.41 (2009):415301.

Smithson, Robert LW, Donald J. McClure, and D. Fennell Evans. "Effects of polymer substrate surface energy on nucleation and growth of evaporated gold films." Thin Solid Films 307.1-2 (1997): 110-112.

Sohn, I. et al. "Improved modeling of material deposition during OLED manufacturing using direct simulation monte carlo method on GPU Architecture." International Journal of Precision Engineering and Manufacturing-Green Technology 6 (2019): 861-873.

Song, Hongwei, Olusegun J. llegbusi, and L. I. Trakhtenberg. "Modeling vapor deposition of metal/semiconductor-polymer nanocomposite." Thin Solid Films 476.1 (2005): 190-195.

Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.

Spelt, J. K., Absolom, D. R., Neumann, A. W. "Solid Surface Tension: The Interpretation of Contact Angles by the Equation of State Approach and the Theory of Surface Tension Components." Langmuir 2.5 (1986): 620-625.

Spelt, J. K., Neumann, A. W. "Solid Surface Tension: The Equation of State Approach and the Theory of Surface Tension Components. Theoretical and Conceptual Considerations." Langmuir 3 (1987): 588-591.

Spoljaric, S. et al., "Novel Elastomer-Dumbbell Functionalized POSS Composites: Thermomechanical and Morphological Properties", Journal of Applied Polymer Science, 123.1 (2012):585-600.

Starr, F.W. et al., "Bound Layers 'Cloak' Nanoparticles in Strongly Interacting Polymer Nanocomposites", ACS Nano, 10.12 (2016):10960-10965.

Sun, T. et al., "Reversible Switching between Superhydrophilicity and Superhydrophobicity", Angew. Chem. Int. Ed., 43.3 (2004):357-360.

Svorcik, V. et al., "Deposition of Polystyrene Films by Vacuum Evaporation", Journal of Materials Science Letters, 16 (1997):1564-1566.

Takele, H. et al., "Plasmonic Properties of Ag Nanoclusters in Various Polymer Matrices", Nanotechnology, 17.14 (2006):3499-3505.

Tao, C. et al., "Highly Icephobic Properties on Slippery Surfaces Formed From Polysiloxane and Fluorinated POSS", Progress in Organic Coatings, 103 (2017):48-59.

Tarasevich, Y. I. "Surface energy of oxides and silicates." Theoretical and Experimental Chemistry 42 (2006): 145-161.

Thran, A., et al. "Condensation coefficients of Ag on polymers." Physical review letters 82.9 (1999):1903-1906.

Tong, T. et al., "Adhesion in Organic Electronics Structures", Journal of Applied Physics, 106.8 (2009): 083708.

Töpper, T. et al. "Siloxane-based thin films for biomimetic low-voltage dielectric actuators." Sensors and Actuators A: Physical 233 (2015): 32-41.

Tsai, Yu-Hsiang, et al. "P-202: A Flexible Transparent OLED Display with FlexUPTM Technology." SID Symposium Digest of Technical Papers. vol. 48. No. 1. 2017.

Tsujioka, Tsuyoshi, and Kosuke Tsuji. "Metal-vapor deposition modulation on soft polymer surfaces." Applied Physics Express 5.2 (2012): 021601.

Tsujioka, Tsuyoshi, et al. "Selective metal deposition on photoswitchable molecular surfaces." Journal of the American Chemical Society 130.32 (2008): 10740-10747.

Tsujioka, Tsuyoshi, Rie Takagi, and Takahiro Shiozawa. "Light-controlled metal deposition on photochromic polymer films. "Journal of Materials Chemistry 20.43 (2010): 9623-9627.

(56) References Cited

OTHER PUBLICATIONS

Tuteja, A. et al., "Designing Superoleophobic Surfaces", Science, 318.5856 (2007):1618-1622.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by Ionized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.
Usui, H., "Deposition of Polymeric Thin Films by Ionization-Assisted Method", IEICE Trans. Electron., E83-C:7 (2000):1128-1133.
Van de Grampel, R.D., "Surfaces of Fluorinated Polymer Systems", Doctoral Thesis, Technische Universiteit Eindhoven (2002).
Vasilak, L. et al., "Statistical Paradigm for Organic Optoelectronic Devices: Normal Force Testing for Adhesion of Organic Photovoltaics and Organic Light-Emitting Diodes", ACS Appl. Mater. Interfaces, 9.15 (2017), 13347-13356.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).
Vitos, Levente, et al. "The surface energy of metals." Surface science 411.1-2 (1998): 186-202.
Vogelsang, D.F. et al., "Separation of Asymmetrically Capped Double-Decker Silsesquioxanes Mixtures", Polyhedron, 155 (2018): 189-193.
von R. Schleyer, P. and Nicholas, R. D., "The Reactivity of Bridgehead Compounds of Adamantane", J. Am. Chem. Soc., 83.12 (1961):2700-2707.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.
Wang, Y. et al., "Substrate Effect on the Melting Temperature of Thin Polyethylene Films", Physical Review Letters, 96.2 (2006):028303.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Wei, H. and Eilers, H., "Electrical Conductivity of Thin-Film Composites Containing Silver Nanoparticles Embedded in a Dielectric Fluoropolymer Matrix", Thin Solid Films, 517.2 (2008):575-581.
Weimer, P. K. "Physics of Thin Films, vol. 2.". Academic Press, (1964).
Weiss, F.M. et al., "Molecular Beam Deposition of High-Permittivity Polydimethylsiloxane for Nanometer-Thin Elastomer Films in Dielectric Actuators", Materials and Design, 105 (2016):106-113.
Wojtczak, L., "The Melting Point of Thin Films", Phys. Stat. Sol., 23.2 (1967):K163-K166.
Wolfgang Decker, Vast Films, Ltd. "Pattern Metallization: Selective Deposition of Metals on Polymer Films for Functional Applications" AIMCAL Fall Conference 2005.
Xu, Hua, et al. "Transparent AMOLED Display Derived by Metal Oxide Thin Film Transistor with Praseodymium Doping." Proceedings of the International Display Workshops vol. 26 (IDW '19). 2019.
Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.
Yamada, Toshikazu, et al. "Nanoparticle chemisorption printing technique for conductive silver patterning with submicron resolution." Nature communications 7.1 (2016): 1-9.
Yang, H. et al., "Catalyst-Controlled C—H Functionalization of Adamantanes Using Selective H-Atom Transfer", ACS Catal., 9.6 (2019):5708-5715.
Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method."?Surface science?532 (2003): 300-305.
Zaporojtchenko, V., et al. "Determination of condensation coefficients of metals on polymer surfaces."?Surface science?454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zhang, Tianyu, et al. "Transparent white organic light-emitting devices with a LiF/Yb: Ag cathode." Optics letters 34.8 (2009): 1174-1176.
Zhang, W. et al., "Polymer/polyhedral Oligomeric Silsesquioxane (POSS) Nanocomposites: An Overview of Fire Retardance", Progress in Polymer Science, 67 (2017):77-125.
Zhang, W. et al., "Why We Need to Look Beyond the Glass Transition Temperature to Characterize the Dynamics of Thin Supported Polymer Films", PNAS Latest Articles, 115.22 (2018):5641-5646.
Zhao, Lei, Daqun Chen, and Weihua Hu. "Patterning of metal films on arbitrary substrates by using polydopamine as a UV-sensitive catalytic layer for electroless deposition." Langmuir 32.21 (2016):5285-5290.
Zhu, C. et al. "A novel synthetic UV-curable fluorinated siloxane resin for low surface energy coating." Polymers 10.9 (2018): 979.
Zhu, X. L., et al. "29.3: Very Bright and Efficient Top-Emitting OLED with Ultra-Thin Yb as Effective Electron Injector." SID Symposium Digest of Technical Papers. vol. 37. No. 1. Oxford, UK: Blackwell Publishing Ltd, 2006.

* cited by examiner

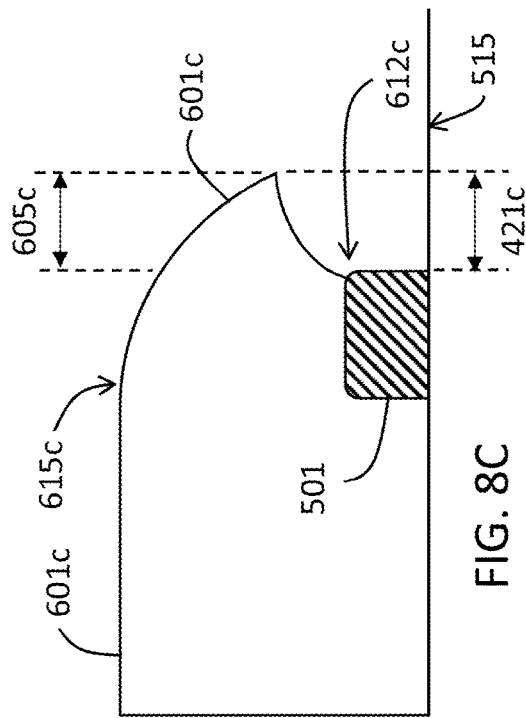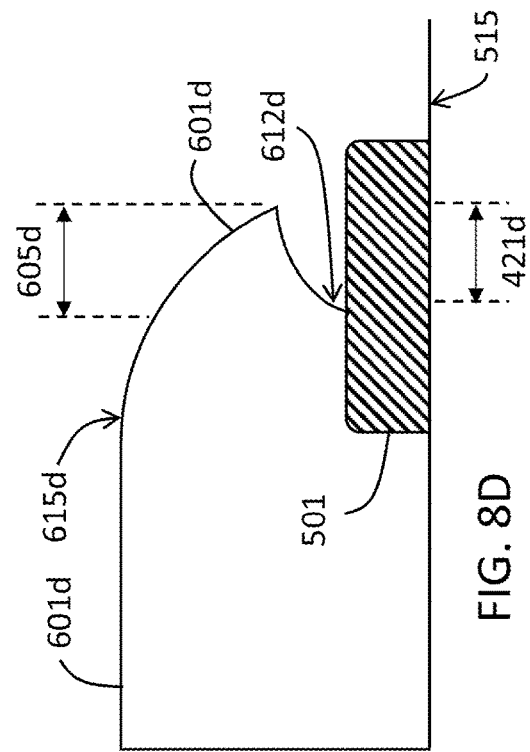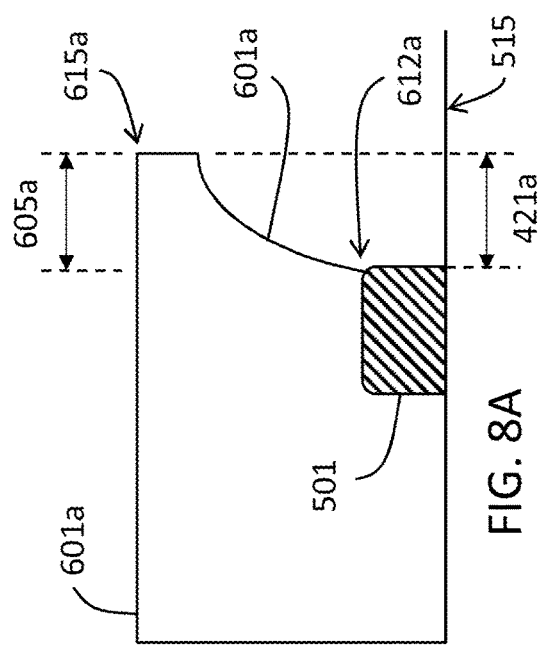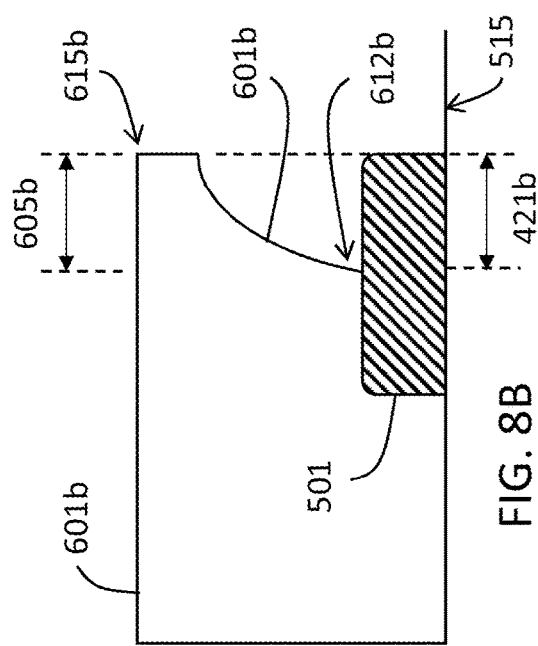

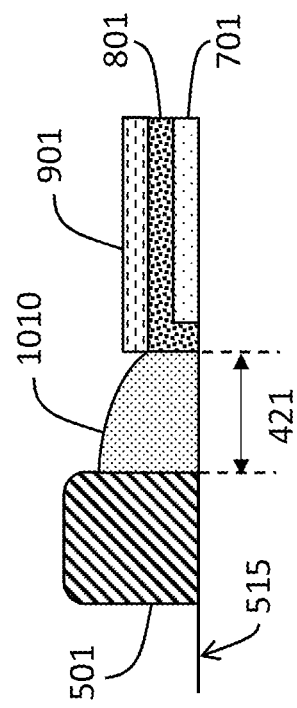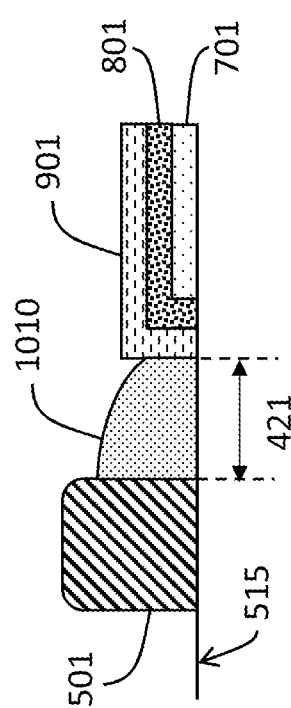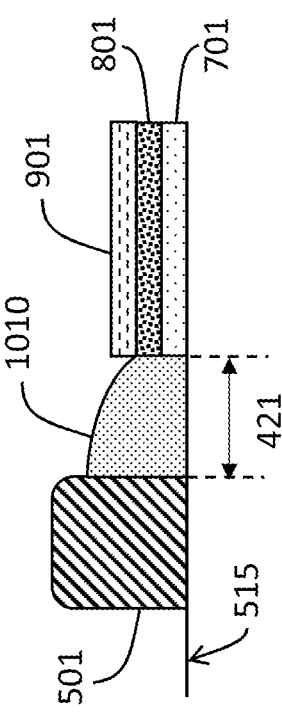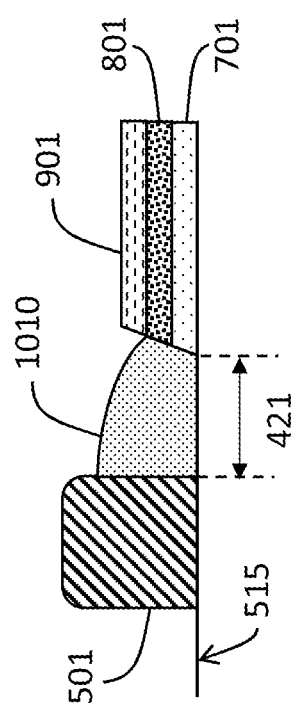

DEVICE INCLUDING PATTERNING A CONDUCTIVE COATING

CROSS-REFERENCE TO RELATED APPLICATIONS

This application is a continuation of U.S. patent application Ser. No. 17/053,026 filed Nov. 4, 2020 which is a U.S. National Stage Application under 35 U.S.C. § 371 of International Application No. PCT/IB2019/053706, filed May 7, 2019, which claims the benefit of U.S. Provisional Application No. 62/668,134, filed May 7, 2018, and the benefit of U.S. Provisional Application No. 62/729,889, filed Sep. 11, 2018, the contents of each of which are incorporated herein by reference in their entireties.

TECHNICAL FIELD

The following generally relates to a method for providing an auxiliary electrode for an opto-electronic device. Specifically, the method relates to selective deposition of the electrically conductive material on a surface for forming an electrically conductive structure of a device.

BACKGROUND

Organic light emitting diodes (OLEDs) typically include several layers of organic materials interposed between conductive thin film electrodes, with at least one of the organic layers being an electroluminescent layer. When a voltage is applied to electrodes, holes and electrons are injected from an anode and a cathode, respectively. The holes and electrons injected by the electrodes migrate through the organic layers to reach the electroluminescent layer. When a hole and an electron are in close proximity, they are attracted to each other due to a Coulomb force. The hole and electron may then combine to form a bound state referred to as an exciton. An exciton may decay through a radiative recombination process, in which a photon is released. Alternatively, an exciton may decay through a non-radiative recombination process, in which no photon is released. It is noted that, as used herein, internal quantum efficiency (IQE) will be understood to be a proportion of all electron-hole pairs generated in a device which decay through a radiative recombination process.

A radiative recombination process can occur as a fluorescence or phosphorescence process, depending on a spin state of an electron-hole pair (namely, an exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

More recently, other light emission mechanisms for OLEDs have been proposed and investigated, including thermally activated delayed fluorescence (TADF). Briefly, TADF emission occurs through a conversion of triplet excitons into singlet excitons via a reverse inter system crossing process with the aid of thermal energy, followed by radiative decay of the singlet excitons.

An external quantum efficiency (EQE) of an OLED device may refer to a ratio of charge carriers provided to the OLED device relative to a number of photons emitted by the device. For example, an EQE of 100% indicates that one photon is emitted for each electron that is injected into the device. As will be appreciated, an EQE of a device is generally substantially lower than an IQE of the device. The difference between the EQE and the IQE can generally be attributed to a number of factors such as absorption and reflection of light caused by various components of the device.

An OLED device can typically be classified as being either a "bottom-emission" or "top-emission" device, depending on a relative direction in which light is emitted from the device. In a bottom-emission device, light generated as a result of a radiative recombination process is emitted in a direction towards a base substrate of the device, whereas, in a top-emission device, light is emitted in a direction away from the base substrate. Accordingly, an electrode that is proximal to the base substrate is generally made to be light transmissive (e.g., substantially transparent or semi-transparent) in a bottom-emission device, whereas, in a top-emission device, an electrode that is distal to the base substrate is generally made to be light transmissive in order to reduce attenuation of light. Depending on the specific device structure, either an anode or a cathode may act as a transmissive electrode in top-emission and bottom-emission devices.

An OLED device also may be a double-sided emission device, which is configured to emit light in both directions relative to a base substrate. For example, a double-sided emission device may include a transmissive anode and a transmissive cathode, such that light from each pixel is emitted in both directions. In another example, a double-sided emission display device may include a first set of pixels configured to emit light in one direction, and a second set of pixels configured to emit light in the other direction, such that a single electrode from each pixel is transmissive.

In addition to the above device configurations, a transparent or semi-transparent OLED device also can be implemented, in which the device includes a transparent portion which allows external light to be transmitted through the device. For example, in a transparent OLED display device, a transparent portion may be provided in a non-emissive region between each neighboring pixels. In another example, a transparent OLED lighting panel may be formed by providing a plurality of transparent regions between emissive regions of the panel. Transparent or semi-transparent OLED devices may be bottom-emission, top-emission, or double-sided emission devices.

While either a cathode or an anode can be selected as a transmissive electrode, a typical top-emission device includes a light transmissive cathode. Materials which are typically used to form the transmissive cathode include transparent conducting oxides (TCOs), such as indium tin oxide (ITO), indium zinc oxide (IZO), and zinc oxide (ZnO), as well as thin films, such as those formed by depositing a thin layer of silver (Ag), aluminum (Al), or various metallic alloys such as magnesium silver (Mg:Ag) alloy and ytterbium silver (Yb:Ag) alloy with compositions ranging from about 1:9 to about 9:1 by volume. A multi-layered cathode including two or more layers of TCOs and/or thin metal films also can be used.

Particularly in the case of thin films, a relatively thin layer thickness of up to about a few tens of nanometers contributes to enhanced transparency and favorable optical properties (e.g., reduced microcavity effects) for use in OLEDs. However, a reduction in the thickness of a transmissive electrode is accompanied by an increase in its sheet resistance. An electrode with a high sheet resistance is generally undesirable for use in OLEDs, since it creates a large current-resistance (IR) drop when a device is in use, which is detrimental to the performance and efficiency of OLEDs. The IR drop can be compensated to some extent by increasing a power supply level; however, when the power supply level is increased for one pixel, voltages supplied to other components are also increased to maintain proper operation of the device, and thus is unfavorable.

In order to reduce power supply specifications for top-emission OLED devices, solutions have been proposed to form busbar structures or auxiliary electrodes on the devices. For example, such an auxiliary electrode may be formed by depositing a conductive coating in electrical communication with a transmissive electrode of an OLED device. Such an auxiliary electrode may allow current to be carried more effectively to various regions of the device by lowering a sheet resistance and an associated IR drop of the transmissive electrode.

Since an auxiliary electrode is typically provided on top of an OLED stack including an anode, one or more organic layers, and a cathode, patterning of the auxiliary electrode is traditionally achieved using a shadow mask with mask apertures through which a conductive coating is selectively deposited, for example by a physical vapor deposition (PVD) process. However, since masks are typically metal masks, they have a tendency to warp during a high-temperature deposition process, thereby distorting mask apertures and a resulting deposition pattern. Furthermore, a mask is typically degraded through successive depositions, as a conductive coating adheres to the mask and obfuscates features of the mask. Consequently, such a mask should either be cleaned using time-consuming and expensive processes or should be disposed once the mask is deemed to be ineffective at producing the desired pattern, thereby rendering such process highly costly and complex. Accordingly, a shadow mask process may not be commercially feasible for mass production of OLED devices. Moreover, an aspect ratio of features which can be produced using the shadow mask process is typically constrained due to shadowing effects and a mechanical (e.g., tensile) strength of the metal mask, since large metal masks are typically stretched during a shadow mask deposition process.

Another challenge of patterning a conductive coating onto a surface through a shadow mask is that certain, but not all, patterns can be achieved using a single mask. As each portion of the mask is physically supported, not all patterns are possible in a single processing stage. For example, where a pattern specifies an isolated feature, a single mask processing stage typically cannot be used to achieve the desired pattern. In addition, masks which are used to produce repeating structures (e.g., busbar structures or auxiliary electrodes) spread across an entire device surface include a large number of perforations or apertures formed on the masks. However, forming a large number of apertures on a mask can compromise the structural integrity of the mask, thus leading to significant warping or deformation of the mask during processing, which can distort a pattern of deposited structures.

In addition to the above, when a common electrode having a substantially uniform thickness is provided as the top-emission cathode in an OLED display device, the optical performance of the device cannot readily be fine-tuned according to the emission spectrum associated each subpixel. In a typical OLED display device, red, green, and blue subpixels are provided to form the pixels of the display device. The top-emission electrode used in such OLED display device is typically a common electrode coating a plurality of pixels. For example, such common electrode may be a relatively thin conductive layer having a substantially uniform thickness across the device. While efforts have been made to tune the optical microcavity effects associated with each subpixel color by varying the thickness of organic layers disposed within different subpixels, such approach may not provide sufficient degree of tuning of the optical microcavity effects in at least some cases. In addition, such approach may be difficult to implement in an OLED display production environment.

SUMMARY

According to some embodiments, an opto-electronic device includes: (i) a substrate having a surface; (ii) a first electrode disposed over the surface; (iii) a semiconducting layer disposed over at least a portion of the first electrode; (iv) a second electrode disposed over the semiconducting layer; (v) a nucleation inhibiting coating disposed over at least a portion of the second electrode; (vi) a patterning structure disposed over the surface, the patterning structure providing a shadowed region between the patterning structure and the second electrode; (vii) an auxiliary electrode disposed over the surface; and (viii) a conductive coating disposed in the shadowed region, the conductive coating electrically connecting the auxiliary electrode and the second electrode.

According to some embodiments, an opto-electronic device includes a non-emissive region and an emissive region arranged adjacent to the non-emissive region. The emissive region includes: a first electrode and a second electrode, and a semiconducting layer disposed between the first electrode and the second electrode. The non-emissive region includes: an auxiliary electrode, a patterning structure disposed to overlap with the auxiliary electrode, the patterning structure extending laterally to provide a shadowed region, and a conductive coating disposed in the shadowed region, the conductive coating electrically connecting the auxiliary electrode and the second electrode.

According to some embodiments, a method for manufacturing an opto-electronic device includes: (i) providing a substrate having a surface, and the substrate including: a plurality of thin film transistors, a first electrode disposed over the surface, the first electrode in electrical communication with at least one of the thin film transistors, a pixel definition layer disposed over the surface and covering a perimeter of the first electrode, an auxiliary electrode disposed over the surface, and a patterning structure disposed to overlap with the auxiliary electrode, the patterning structure extending laterally to provide a shadowed region; (ii) depositing a semiconducting layer over the first electrode; (iii) depositing a second electrode over the semiconducting layer; (iv) depositing a nucleation inhibiting coating over the second electrode; and (v) treating the nucleating inhibiting coating and the shadowed region to deposit a conductive coating in the shadowed region, while at least a portion of the nucleation inhibiting coating remains substantially uncovered by the conductive coating.

According to some embodiments, a method for manufacturing an opto-electronic device includes: (i) providing a substrate having a surface, and the substrate including: at least one thin film transistor, a first electrode disposed over the surface, the first electrode in electrical communication with the at least one thin film transistor, an auxiliary electrode disposed over the surface, and a bank structure disposed over the surface and defining a via hole region for exposing the auxiliary electrode; (ii) depositing a semiconducting layer over the first electrode; (iii) depositing a second electrode over the semiconducting layer; (iv) depositing a nucleation inhibiting coating over the second electrode; and (v) treating the nucleating inhibiting coating and the via hole region to deposit a conductive coating in the via hole region, while at least a portion of the nucleation inhibiting coating remains substantially uncovered by the conductive coating.

According to some embodiments, an opto-electronic device includes: (i) a first electrode and a second electrode; (ii) a semiconducting layer disposed between the first electrode and the second electrode; (iii) a nucleation inhibiting coating disposed over at least a portion of the second electrode; (iv) an auxiliary electrode having a sidewall; and (v) a conductive coating arranged adjacent to the sidewall, the conductive coating in electrical connection with the auxiliary electrode and the second electrode.

BRIEF DESCRIPTION OF THE DRAWINGS

Some embodiments will now be described by way of example with reference to the appended drawings wherein:

FIGS. 8A-8F are schematic cross-sectional views of a patterning structure and a resulting shadowed region according to various embodiments;

FIGS. 15A-15F are schematic cross-sectional views of a shadowed region and adjacent portions according to various embodiments;

DETAILED DESCRIPTION

Figure 1:
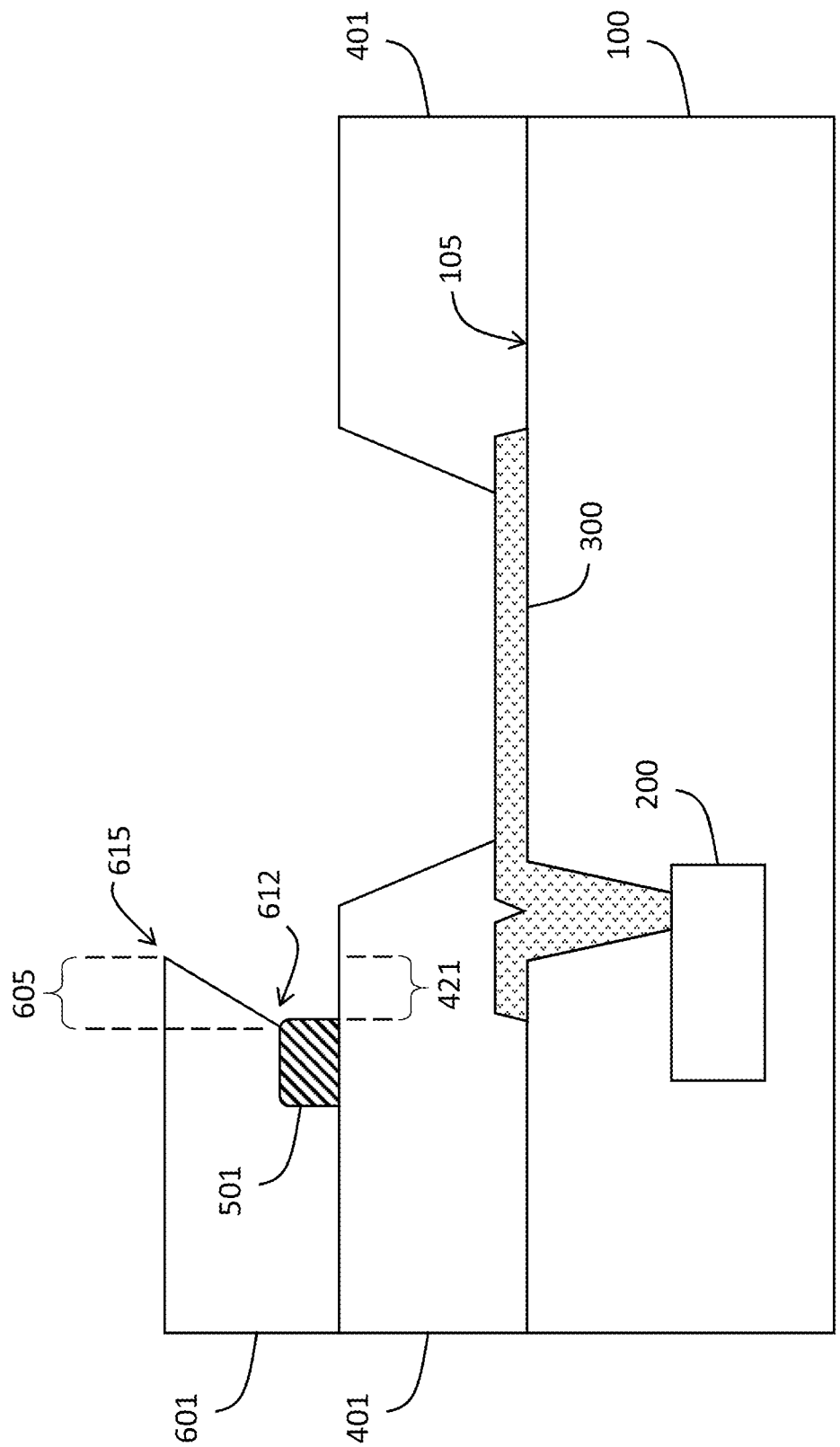
FIG. 1 is a schematic cross-sectional view of a device in one stage of fabrication according to an embodiment.

It will be appreciated that for simplicity and clarity of illustration, where considered appropriate, reference numerals may be repeated among the figures to indicate corresponding or analogous components. In addition, numerous specific details are set forth in order to provide a thorough understanding of example embodiments described herein. However, it will be understood by those of ordinary skill in the art that the example embodiments described herein may be practiced without some of those specific details. In other instances, certain methods, procedures and components have not been described in detail so as not to obscure the example embodiments described herein.

In one aspect according to some embodiments, a method for manufacturing an opto-electronic device is provided. In some embodiments, the method is performed in the context of a manufacturing method of an active matrix OLED device. In some embodiments, the method includes providing a substrate having a surface. In some embodiments, the substrate includes one or more thin film transistors, a first electrode disposed on the surface, a pixel definition layer disposed on the surface, an auxiliary electrode arranged above the surface, and a patterning structure arranged to overlap with the auxiliary electrode. The first electrode is in electrical communication with at least one of the thin film transistors. In some embodiments, the pixel definition layer covers an edge or a perimeter of the first electrode. In some embodiments, the patterning structure extends laterally to provide a shadowed region. The method includes depositing a semiconducting layer over the first electrode. In some embodiments, the semiconducting layer includes an emissive layer. The method also includes depositing a second electrode over the semiconductor layer. In some embodiments, the first electrode is an anode and the second electrode is a cathode. The method also includes depositing a second electrode over the semiconducting layer. The method also includes depositing a nucleation inhibiting coating over the second electrode. The method also includes treating the nucleating inhibiting coating and the shadowed region to deposit a conductive coating in the shadowed region. In some embodiments, at least a portion of the nucleation inhibiting coating remains substantially uncovered by the conductive coating. In some embodiments, deposition of the conductive coating is performed using an open mask or without a mask. In some embodiments, deposition of the nucleation inhibiting coating is performed using an open mask or without a mask. In some embodiments, treating the nucleation inhibiting coating and the shadowed region includes exposing the nucleation inhibiting coating and the shadowed region to an evaporated flux of a material for forming the conductive coating. In some embodiments, at least a portion of the evaporated flux is noncollimated. In some embodiments, at least a portion of the evaporated flux is incident onto a shadowed surface of the shadowed region at a non-normal angle of incidence. In some embodiments, treating the nucleation inhibiting coating and the shadowed region includes displacing the substrate during treatment. In some embodiments, the substrate is subjected to an angular displacement, a lateral displacement, and/or a vertical displacement. In some embodiments, the evaporated flux is generated by a point evaporation source, a linear evaporation source, or a surface evaporation source. In some embodiments, treating the nucleation inhibiting coating and the shadowed region includes rotating the substrate about a rotation axis, the rotation axis being substantially normal with respect to the surface of the substrate. In some embodiments, the evaporated flux is generated by a point evaporation source, an array of point evaporation source, or a surface evaporation source. In some embodiments, upon depositing the conductive coating, the second electrode and the auxiliary electrode are electrically connected to each other by the conductive coating. In some embodiments, a material of the conductive coating includes magnesium.

As used herein, the term "nucleation inhibiting" is used to refer to a coating or a layer of a material having a surface which exhibits a relatively low affinity towards deposition of an electrically conductive material, such that the deposition of the conductive coating material on the surface is inhibited, while the term "nucleation promoting" is used to refer to a coating or a layer of a material having a surface which exhibits a relatively high affinity towards deposition of an electrically conductive material, such that the deposition of the conductive coating material on the surface is facilitated. One measure of nucleation inhibiting or nucleation promoting property of a surface is an initial sticking probability of the surface for an electrically conductive material, such as magnesium. For example, a nucleation inhibiting coating with respect to magnesium can refer to a coating having a surface which exhibits a relatively low initial sticking probability for magnesium vapor, such that deposition of magnesium on the surface is inhibited, while a nucleation promoting coating with respect to magnesium can refer to a coating having a surface which exhibits a relatively high initial sticking probability for magnesium vapor, such that deposition of magnesium on the surface is facilitated. As used herein, the terms "sticking probability" and "sticking coefficient" may be used interchangeably. Another measure of nucleation inhibiting or nucleation promoting property of a surface is an initial deposition rate or initial film growth rate of an electrically conductive material, such as magnesium, on the surface relative to an initial deposition rate or initial film growth rate of the conductive material on another (reference) surface, where both surfaces are subjected or exposed to an evaporation flux of the conductive coating material.

As used herein, the terms "evaporation" and "sublimation" are interchangeably used to generally refer to deposition processes in which a source material is converted into a vapor (e.g., by heating) to be deposited onto a target surface in, for example, a solid state.

As used herein, a surface (or a certain area of the surface) which is "substantially free of" or "is substantially uncovered by" a material refers to a substantial absence of the material on the surface (or the certain area of the surface). Specifically regarding an electrically conductive coating, one measure of an amount of an electrically conductive material on a surface is a light transmittance, since electrically conductive materials, such as metals including magnesium, attenuate and/or absorb light. Accordingly, a surface can be deemed to be substantially free of an electrically conductive material if the light transmittance is greater than 90%, greater than 92%, greater than 95%, or greater than 98% in the visible portion of the electromagnetic spectrum. Another measure of an amount of a material on a surface is a percentage coverage of the surface by the material, such as where the surface can be deemed to be substantially free of the material if the percentage coverage by the material is no greater than 10%, no greater than 8%, no greater than 5%, no greater than 3%, or no greater than 1%. Surface coverage can be assessed using imaging techniques, such as using transmission electron microscopy, atomic force microscopy, or scanning electron microscopy.

FIGS. 1 to 5 are a series of schematic diagrams illustrating a process for fabricating an opto-electronic device according to one embodiment. In FIG. 1, a substrate 100 is illustrated as having a surface 105. The substrate 100 includes one or more thin film transistors (TFTs) 200. For example, such TFTs may be formed by depositing and patterning a series of thin films when fabricating the substrate 100. The surface 105 of the substrate 100 is provided with a first electrode 300. For example, the first electrode 300 may be an anode. The first electrode 300 is in electronic communication with the TFT 200. A pixel definition layer (PDL) 401 is also provided on the surface 105, such that the pixel definition layer 401 covers the surface 105 as well as an edge or a perimeter of the first electrode 300. The pixel definition layer 401 defines an opening through which the surface of the anode 300 is exposed. The opening defined by the pixel definition layer 401 generally corresponds to the emissive regions of the device. For example, the device may include a plurality of openings defined by the pixel definition layer 401, and each opening may correspond to a subpixel region of the device. In the illustrated embodiment, an auxiliary electrode 501 is formed on the pixel definition layer 401. For example, the auxiliary electrode 501 may include an electrically conductive material, such as metals. Examples of such electrically conductive materials include copper (Cu), aluminum (Al), molybdenum (Mo), and silver (Ag). In some embodiments, the auxiliary electrode 501 includes two or more electrically conductive materials. For example, the auxiliary electrode 501 may be formed by a multilayer metallic structure, such as one formed by Mo/Al/Mo. The auxiliary electrode 501 may be formed directly on top of the pixel definition layer 401, such as for example on the top planar surface of the pixel definition layer 401. A patterning structure 601 is also provided. In the illustrated embodiment, the patterning structure 601 is disposed or arranged on top of the pixel definition layer 401, such that at least a portion of the patterning structure 601 overlaps with the auxiliary electrode 501. The patterning structure 601 extends laterally to form a laterally extending portion 605. The laterally extending portion 605 may be configured such that a base portion 612 of the patterning structure 601 is vertically offset from the top portion 615 to provide a shadowed region 421. Specifically in the illustrated embodiment, the shadowed region 421 corresponds to a portion or region of the surface of the pixel definition layer 401 that overlaps with the laterally extending portion 605 of the patterning structure 601.

Figure 2:
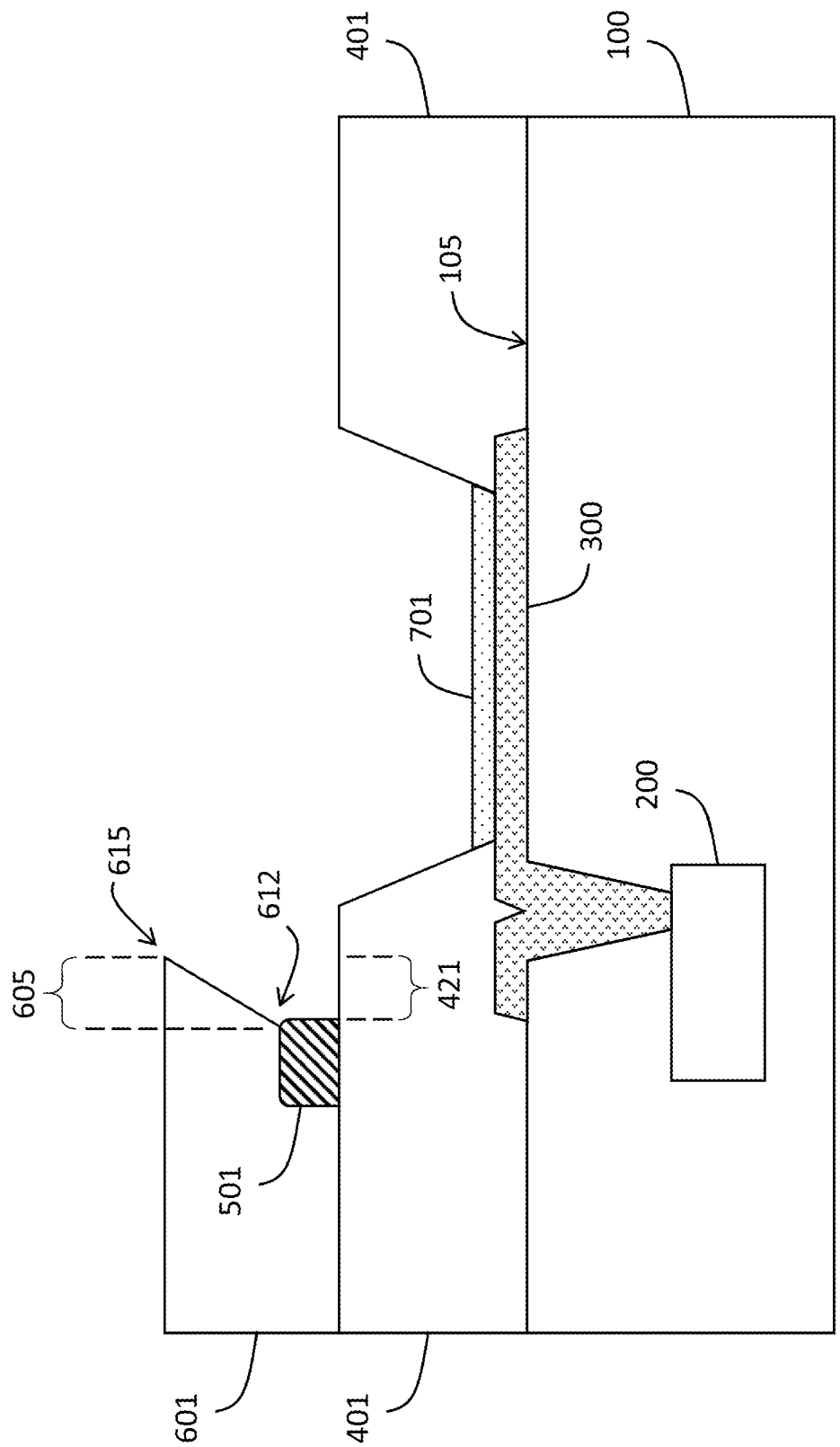
FIG. 2 is a schematic cross-sectional view of the device in another stage of fabrication according to the embodiment of FIG. 1.

In FIG. 2, deposition of a semiconducting layer 701 is illustrated. As illustrated, the semiconducting layer 701 may be deposited over the exposed surface of the first electrode 300. In some embodiments wherein the optoelectronic device is an OLED, the semiconducting layer 701 includes one or more organic semiconducting layers. For example, the semiconducting layer 701 may include an emissive layer. In some embodiments, the semiconducting layer 701 includes a hole injection layer, an electron blocking layer, a hole transport layer, an emissive layer, an electron transport layer, a hole blocking layer, an electron injection layer, and any combinations of the foregoing. In some embodiments, the semiconducting layer 701 may form a "tandem" structure including a plurality of emissive layers. In such structure, the semiconducting layer 701 also may include one or more charge generation layers (CGL). In some embodiments, the semiconducting layer 701 is deposited using a thermal evaporation process. In some embodiments, a shadow mask is used in conjunction with such thermal evaporation process to selectively deposit the semiconducting layer 701.

Figure 3:
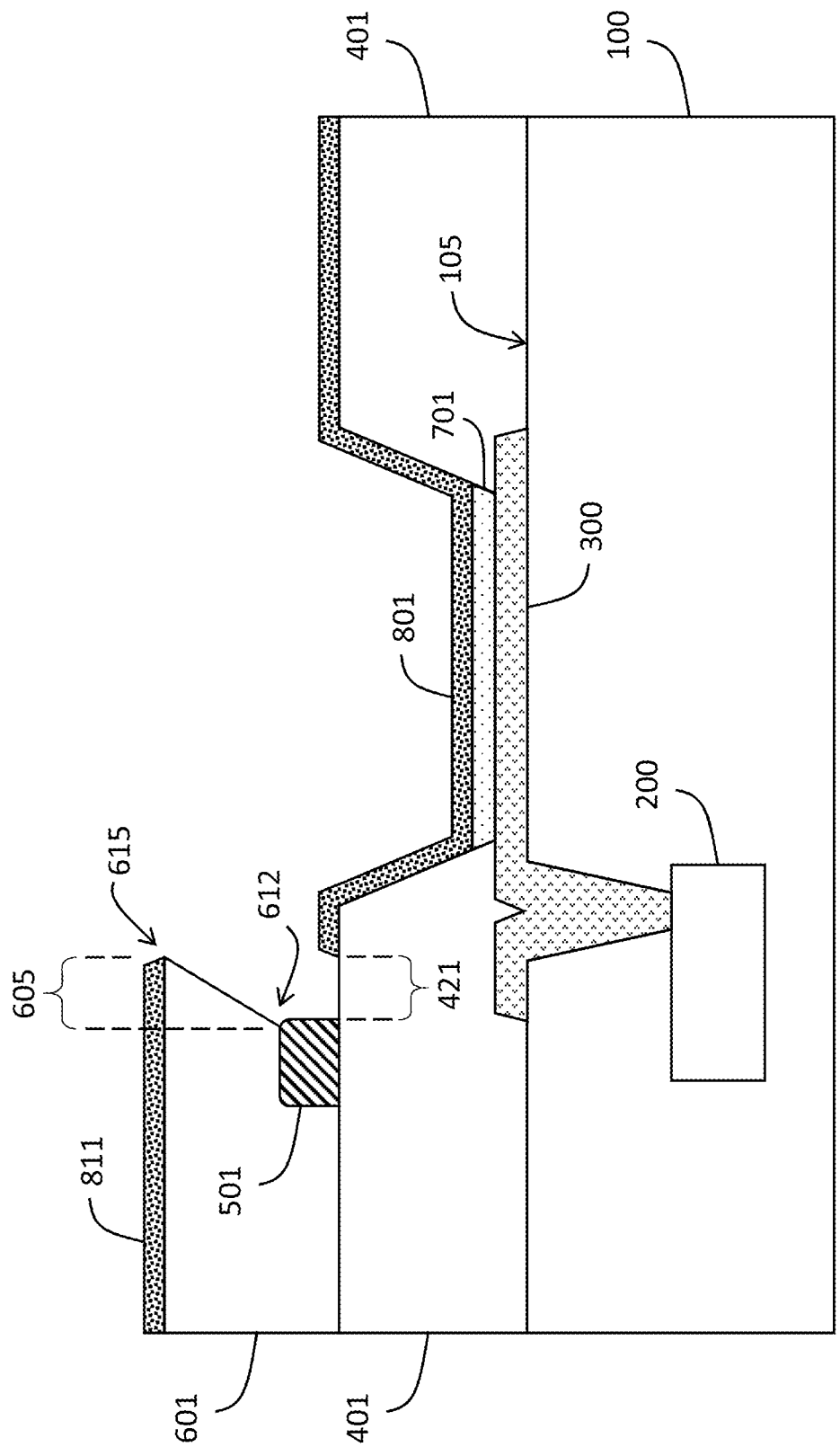
FIG. 3 is a schematic cross-sectional view of the device in yet another stage of fabrication according to the embodiment of FIG. 1.

FIG. 3 illustrates a deposition of a second electrode 801 over the semiconducting layer 701. For example, the second electrode 801 may be a cathode. The second electrode 801 may comprise various materials used to form light transmissive conductive layers or coatings. For example, the second electrode 801 may include transparent conducting oxides (TCOs), metallic or non-metallic thin films, and any combination thereof. The second electrode 801 may further comprise two or more layers or coatings. For example, such layers or coatings may be distinct layers or coatings disposed on top of one another. The second electrode 801 may comprise various materials including, for example, indium tin oxide (ITO), zinc oxide (ZnO), indium zinc oxide (IZO), other oxides containing indium and/or zinc, magnesium (Mg), aluminum (Al), ytterbium (Yb), silver (Ag), zinc (Zn), cadmium (Cd) and any combinations thereof, including alloys containing any of the foregoing materials. For example, the second electrode 801 may comprise a Mg:Ag alloy, a Mg:Yb alloy, or a combination thereof. For a Mg:Ag alloy or a Mg:Yb alloy, the alloy composition may range from about 1:9 to about 9:1 by volume. In other examples, the second electrode 801 may comprise a Yb/Ag bilayer coating. For example, such bilayer coating may be formed by depositing an ytterbium coating, followed by a silver coating. The thickness of the silver coating may be greater than the thickness of the ytterbium coating or vice versa. In yet another example, the second electrode 801 is a multilayer cathode comprising one or more metallic layer and one or more oxide layer. In yet another example, the second electrode 801 may comprise a fullerene and magnesium. For example, such coating may be formed by depositing a fullerene coating followed by a magnesium coating. In another example, a fullerene may be dispersed within the magnesium coating to form a fullerene-containing magnesium alloy coating. Examples of such coatings are further described in US Patent Application Publication No. US 2015/0287846 (published Oct. 8, 2015) and in PCT Application No. PCT/IB2017/054970 (filed Aug. 15, 2017) (published as WO2018/033860 on Feb. 22, 2018). In some embodiments, the deposition of the second electrode 801 is performed using an open mask or without a mask. For example, the second electrode 801 may be deposited by subjecting the exposed top surfaces of the pixel definition layer 401, the semiconducting layer 701, and the patterning structure 601 to the evaporated flux of the material for forming the second electrode 801. In such embodiments, a residual second electrode 811 is formed on the patterning structure 601. As illustrated, the residual second electrode 811 is generally physically disconnected and formed separate from the second electrode 801 due to the presence of the patterning structure 601. Generally, the residual second electrode 811 is formed in a non-emissive region of the device, and the second electrode 801 is formed in an emissive region of the device. In some embodiments, the residual second electrode 811 is electrically isolated or disconnected from the second electrode 801. In some embodiments, the residual second electrode 811 is electrically connected to the second electrode 801 and/or the auxiliary electrode 501. For example, the residual second electrode 811 may be connected to the second electrode 801 and/or the auxiliary electrode 501 at or near an edge or perimeter of the device. The residual second electrode 811 is generally substantially identical in composition to the second electrode 801. In the illustrated embodiment, the shadowed region 421 is substantially free of, or is uncovered by the second electrode 801 or the residual second electrode 811. Specifically, during the deposition of the second electrode 801 and the residual second electrode 811, the shadowed region 421 is masked by the patterning structure 601 such that the evaporated flux of the material for forming the second electrode 801 and the residual second electrode 811 is inhibited from becoming incident onto the portion of the surface of the pixel definition layer 401 corresponding to the shadowed region 421, thereby inhibiting the deposition of the electrode. For example, the laterally extending portion 605 of the patterning structure 601 may be used to provide the shadowed region 421, over which such deposition is inhibited. In some embodiments, at least a portion of the evaporated flux of the material for forming the second electrode 801 is incident onto the shadowed region 421, such that the second electrode 801 covers at least a portion of the shadowed region 421. In some further embodiments, the surface of the laterally extending portion 605 of the patterning structure 601 is covered by the second electrode 801.

Figure 4:
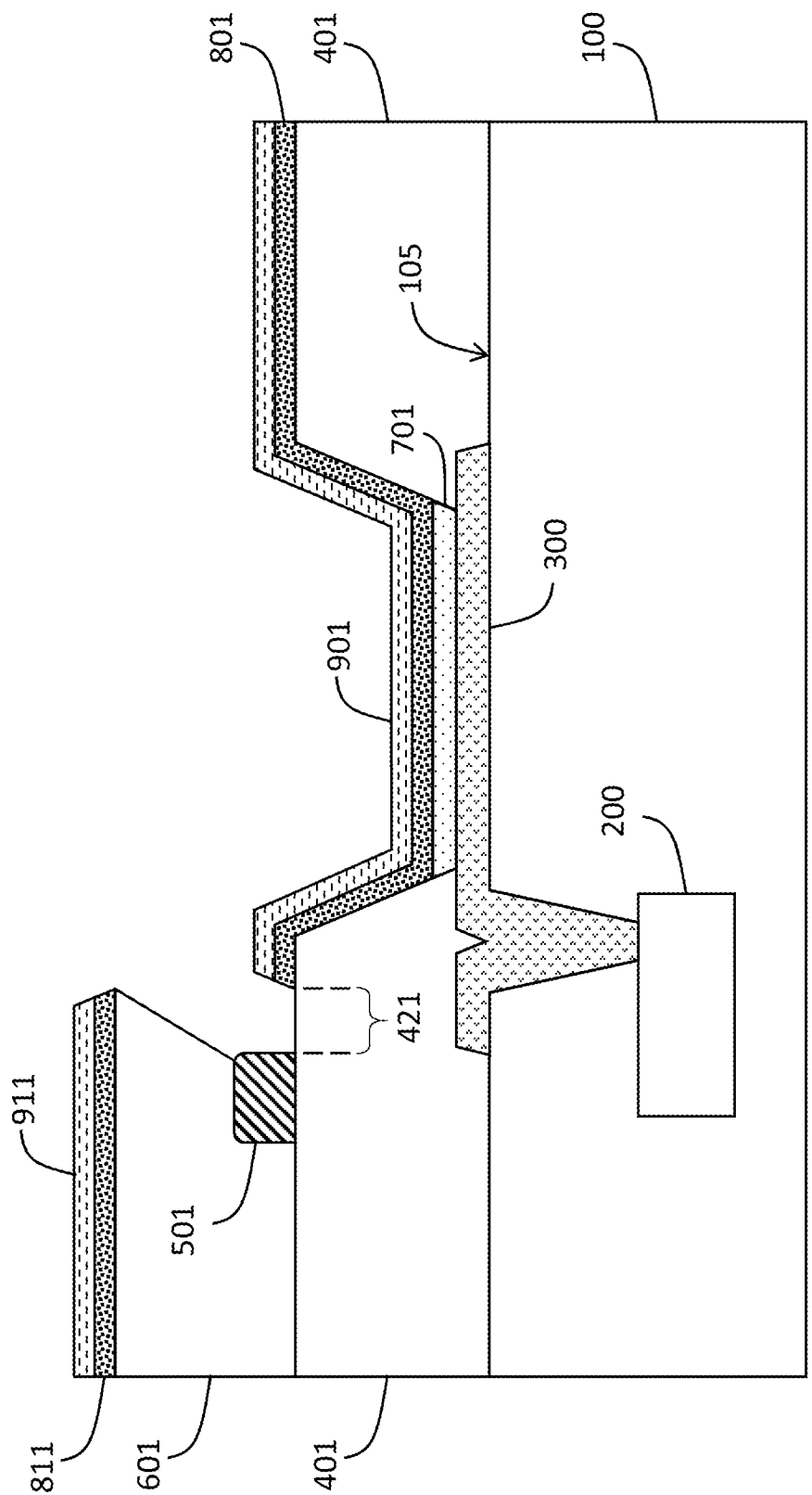
FIG. 4 is a schematic cross-sectional view of the device in yet another stage of fabrication according to the embodiment of FIG. 1.

FIG. 4 illustrates a deposition of a nucleation inhibiting coating 901 over the second electrode 801. In some embodiments, the deposition of the nucleation inhibiting coating 901 is performed using an open mask or without a mask. For example, the nucleation inhibiting coating 901 may be deposited by subjecting the exposed top surface of the second electrode 801 and the residual second electrode 811 to the evaporated flux of the material for forming the nucleation inhibiting coating 901. In such embodiments, a residual nucleation inhibiting coating 911 is formed on the patterning structure 601. As illustrated, the residual nucleation inhibiting coating 911 may be formed on top of, and in contact with the residual second electrode 811. The residual nucleation inhibiting coating 911 is generally physically disconnected and formed separate from the nucleation inhibiting coating 901 due to the presence of the patterning structure 601. Generally, the residual nucleation inhibiting coating 911 is formed in a non-emissive region of the device, and the nucleation inhibiting coating 901 is formed in an emissive region of the device. In some embodiments, the residual nucleation inhibiting coating 911 is substantially identical in composition to the nucleation inhibiting coating 901. As illustrated in FIG. 4, the shadowed region 421 is substantially free of, or is uncovered by the nucleation inhibiting coating 901 or the residual nucleation inhibiting coating 911. Specifically, during the deposition of the nucleation inhibiting coating 901 and the residual nucleation inhibiting coating 911, the shadowed region 421 is masked by the patterning structure 601 such that the evaporated flux of the material for forming the nucleation inhibiting coating 901 and the residual nucleation inhibiting coating 911 is inhibited from becoming incident onto the portion of the surface of the pixel definition layer 401 corresponding to the shadowed region 421, thereby inhibiting the deposition of the nucleation inhibiting material thereon. For example, the laterally extending portion 605 of the patterning structure 601 may be used to provide the shadowed region 421, over which such deposition is inhibited.

Figure 5:
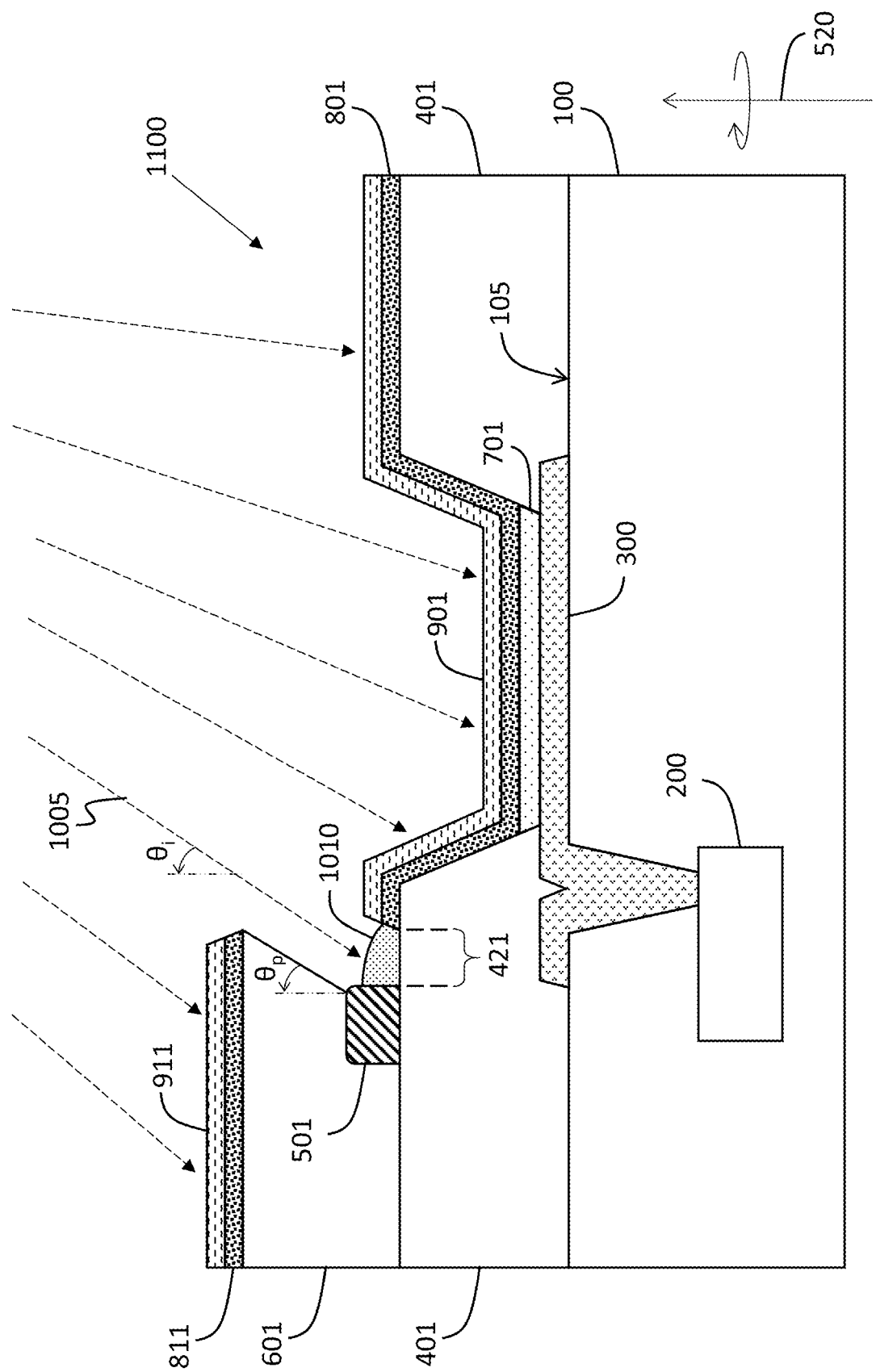
FIG. 5 is a schematic cross-sectional view of the device in yet another stage of fabrication according to the embodiment of FIG. 1.

FIG. 5 illustrates a deposition of a conductive coating 1010. In some embodiments, the deposition is conducted by treating the nucleating inhibiting coating 901 and the shadowed region 421 to deposit a conductive coating 1010 in the shadowed region 421, while at least a portion of the nucleation inhibiting coating 901 remains substantially uncovered by the conductive coating 1010. In the illustrated embodiment, the exposed surfaces of the nucleation inhibiting coating 901 and the residual nucleation inhibiting coating 911 and the surface of the pixel definition layer 401 corresponding to the shadowed region 421 is subjected to an evaporated flux 1005 of the material for forming the conductive coating 1010. For example, a conductive coating source (not shown) may be used to direct an evaporated conductive material towards the surface of the nucleation inhibiting coating 901, the surface of the residual nucleation inhibiting coating 911, and a portion of the surface of the pixel definition layer 401 corresponding to the shadowed region 421, such that the evaporated conductive material is incident on such surfaces. However, since a surface of the nucleation inhibiting coating 901 and the surface of the residual nucleation inhibiting coating 911 exhibit a relatively low initial sticking coefficient compared to that of the surface of the pixel definition layer 401, the conductive coating 1010 selectively deposits onto the shadowed region 421 where the nucleation inhibiting coating 901 and the residual nucleation inhibiting coating 911 are not present. In some embodiments, the deposition of the conductive coating 1010 is performed using an open mask or without a mask. In some embodiments, at least a portion of the evaporated flux 1005 is directed at a non-normal angle with respect to the surface of the pixel definition layer 401 corresponding to the shadowed region 421. For example, at least a portion of the evaporated flux 1005 may be incident onto the surface of the pixel definition layer 401 at an angle of incidence less than 90 degrees with respect to the surface of the pixel definition layer 401. For example, the angle of incidence is less than about 85 degrees, less than about 80 degrees, less than about 75 degrees, less than about 70 degrees, less than about 60 degrees, or less than about 50 degrees. By directing an evaporated flux 1005 including a portion incident upon the surface at a non-normal angle, the shadowed region 421 may be exposed to the evaporated flux 1005. Specifically, the likelihood of such evaporated flux 1005 becoming inhibited from being incident onto the surface in the shadowed region 421 due to the presence of the patterning structure is reduced due to the evaporated flux 1005 including a portion which is directed at a non-normal angle of incidence. For example, the evaporated flux 1005 may contain a portion which is incident onto the shadowed region 421 at an angle of incidence, $\theta_i$, which is equal to or greater to the tangential angle, $\theta_p$, of a portion of the patterning structure 601 extending between the base portion 612 and the top portion 615. For example, the portion extending between the base portion 612 and the top portion 615 may be substantially linear or non-linear, as will be described below. In some embodiments, at least a portion of the evaporated flux 1005 is noncollimated. In some embodiments, the device 1100 is displaced during treatment. For example, the device 1100 including the substrate 100 is displaced while being subjected to the evaporated flux 1005. In some embodiments, the device 1100 and the substrate 100 is subjected to an angular displacement, a lateral displacement, and/or a vertical displacement. The evaporated flux 1005 may be generated by a point evaporation source, a linear evaporation source, or a surface evaporation source. In some embodiments, treating the nucleation inhibiting coating 901 and the shadowed region 1010 includes rotating the device 1100 including the substrate 100 about a rotation axis 520. For example, the rotation axis 520 illustrated in FIG. 5 may be substantially normally oriented with respect to the surface 105 or plane of the substrate 100. As illustrated in the figure, the conductive coating 1010 is formed such that the conductive coating 1010 is in direct physical contact with both the auxiliary electrode 501 and the second electrode 801. In some embodiments, the second electrode 801 and the auxiliary electrode 501 are electrically connected to each other by the conductive coating 1010. In some embodiments, a material of the conductive coating 1010 includes magnesium.

Figure 6:
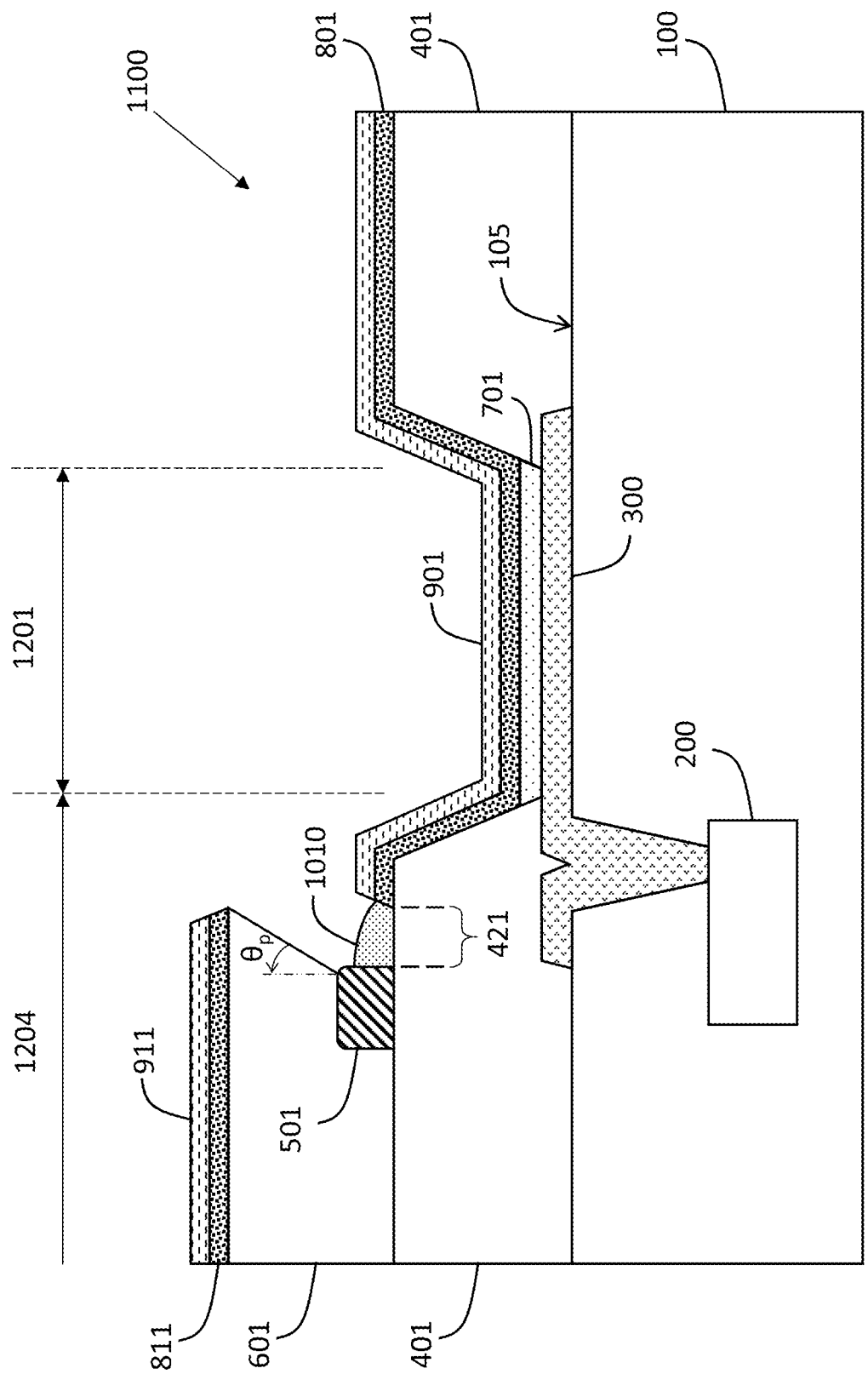
FIG. 6 is a schematic cross-sectional view of an opto-electronic device according to an embodiment.

FIG. 6 illustrates the opto-electronic device 1100 in one embodiment fabricated according to the process described above. The device 1100 includes an emissive region 1201 arranged adjacent to a non-emissive region 1204. In some embodiments, the emissive region 1201 corresponds to a subpixel region of the device 1100. The emissive region 1201 includes a first electrode 300, a second electrode 801, and a semiconducting layer 701 arranged between the first electrode 300 and the second electrode 801. The non-emissive region 1204 includes an auxiliary electrode 501 and a patterning structure 601 arranged to overlap with the auxiliary electrode 501. The patterning structure 601 extends laterally to provide a shadowed region 421. In the illustrated embodiment, the shadowed region 421 corresponds to a region on the surface of the pixel definition layer 401 which overlaps with a laterally extending portion of the patterning structure 601. The non-emissive region 1204 further includes a conductive coating 1010 disposed in the shadowed region 421. The conductive coating 1010 electrically connects the auxiliary electrode 501 and the second electrode 801. A nucleation inhibiting coating 901 is disposed in the emissive region 1201 and the non-emissive region 1204. The nucleation inhibiting coating 901 is disposed on the surface of the second electrode 801. In some embodiments, the surface of the patterning structure 601 is coated with a residual second electrode 811 and a residual nucleation inhibiting coating 911. The shadowed region 421 is substantially free of, or uncovered by the nucleation inhibiting coating 901 to allow the conductive coating 1010 to be deposited thereon.

Figure 7:
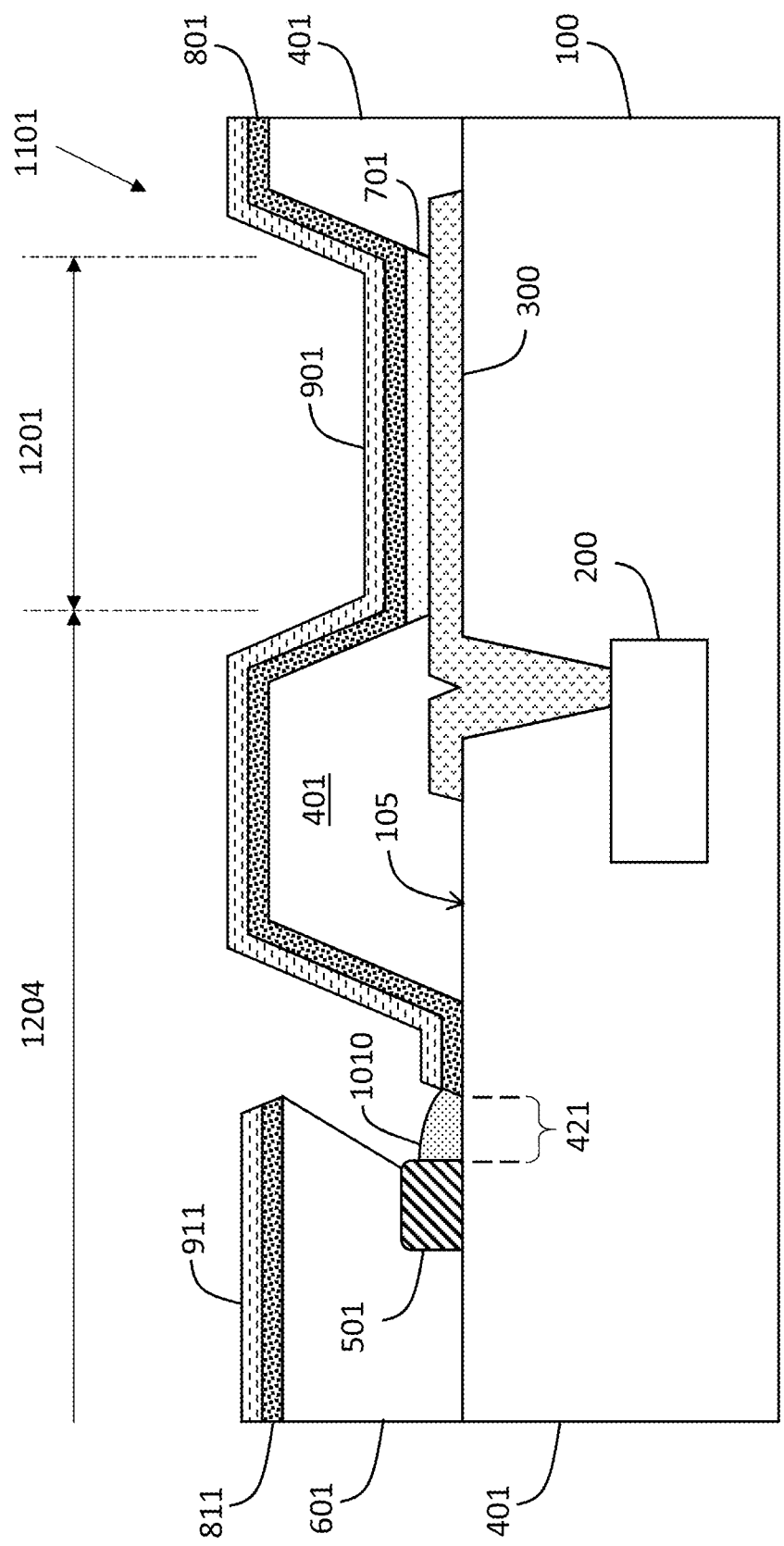
FIG. 7 is a schematic cross-sectional view of an opto-electronic device according to another embodiment.

FIG. 7 illustrates an opto-electronic device 1101 according to one embodiment wherein the auxiliary electrode 501 is disposed on the surface 105 of the substrate 100. In the illustrated embodiment, the device 1101 includes the emissive region 1201 arranged adjacent to the non-emissive region 1204. The emissive region 1201 includes the first electrode 300 disposed on the surface 105 of the substrate 100, a semiconducting layer 701 disposed on the first electrode 300, and the second electrode 801 disposed over the semiconducting layer 701. The non-emissive region 1204 includes an auxiliary electrode 501 formed on the surface 105 of the substrate 100, and a patterning structure 601 arranged to overlap with the auxiliary electrode 501. The patterning structure 601 extends laterally to provide a shadowed region 421. In the illustrated embodiment, the shadowed region 421 corresponds to a region on the surface 105 of the surface 100 which overlaps with a laterally extending portion of the patterning structure 601. The non-emissive region 1204 further includes a conductive coating 1010 disposed in the shadowed region 421. The conductive coating 1010 electrically connects the auxiliary electrode 501 and the second electrode 801. A nucleation inhibiting coating 901 is disposed in the emissive region 1201 and the non-emissive region 1204. The nucleation inhibiting coating 901 is disposed on the surface of the second electrode 801. In some embodiments, the surface of the patterning structure 601 is coated with a residual second electrode 811 and a residual nucleation inhibiting coating 911. The portion of the surface 105 corresponding to the shadowed region 421 is substantially free of, or uncovered by the nucleation inhibiting coating 901 to allow the conductive coating 1010 to be deposited thereon.

FIGS. 8A to 8F illustrates the patterning structure 601 and the auxiliary electrode 501 according to various embodiments. Corresponding features in various embodiments of FIGS. 8A to 8F are labeled with identical reference numerals, but are given different suffixes such as a, b, c, d, e, etc. to indicate different embodiments thereof.

In FIG. 8A, the patterning structure 601a includes a base portion 612a, a top portion 615a, and a sidewall 601a extending between the base portion 612a and the top portion 615a. The top portion 615a extends laterally from the base portion 601 such that a laterally extending portion 605a of the patterning structure 601a is formed. The laterally extending portion 605a forms a shadowed region 421a on a surface 515 onto which the patterning structure 601a is disposed. For example, the surface 515 may be the surface of a pixel definition layer or the surface of a substrate. In the illustrated embodiment, the sidewall 601a is illustrated as including a curved surface. Specifically, a concave sidewall 601a is shown. The auxiliary electrode 501 is arranged to be in overlapping relation with respect to the patterning structure 601a. In the illustrated embodiment, the shadowed region 421a is substantially free of, or is uncovered by the auxiliary electrode 501 such that the surface 515 is exposed.

In FIG. 8B, an embodiment is illustrated wherein the auxiliary electrode 501 extends laterally to overlap the laterally extending portion 605b of the patterning structure 601b. In such embodiment, a portion of the auxiliary electrode 501 is provided in the shadowed region 421b of the surface 515. Accordingly, the conductive coating (not shown) may be deposited on the surface of the auxiliary electrode 501 in the shadowed region 421b.

In FIG. 8C, the patterning structure 601c includes a base portion 612c, a top portion 615c, and a sidewall 601c extending between the base portion 612c and the top portion 615c. A laterally extending portion 605c is formed between the base portion 612c and the top portion 615c of the patterning structure 601c. The laterally extending portion 605c forms a shadowed region 421c on a surface 515 onto which the patterning structure 601c is disposed. For example, the surface 515 may be the surface of a pixel definition layer or the surface of a substrate. In the illustrated embodiment, the sidewall 601c is illustrated as including a curved surface. Specifically, the sidewall 601a includes both a concave portion and a convex portion. The auxiliary electrode 501 is arranged to be in overlapping relation with respect to the patterning structure 601c. In the illustrated embodiment, the shadowed region 421a is substantially free of, or is uncovered by the auxiliary electrode 501 such that the surface 515 is exposed.

In FIG. 8D, an embodiment is illustrated wherein the auxiliary electrode 501 extends laterally to overlap the laterally extending portion 605d of the patterning structure 601d. In such embodiment, a portion of the auxiliary electrode 501 is provided in the shadowed region 421d of the surface 515. Accordingly, the conductive coating (not shown) may be deposited on the surface of the auxiliary electrode 501 in the shadowed region 421d. Optionally, the conductive coating 501 may extend past the shadowed region 421b such that a portion of the auxiliary electrode 501 is uncovered or unmasked by the patterning structure 601d.

Figure 8F:
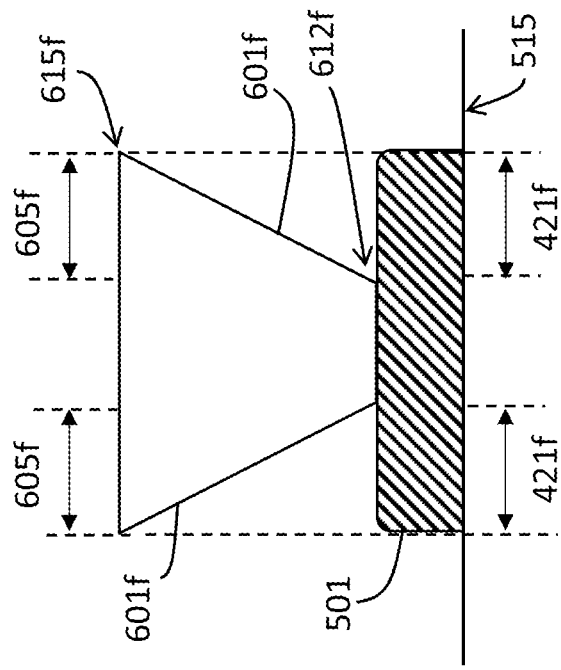
Figure 8E:
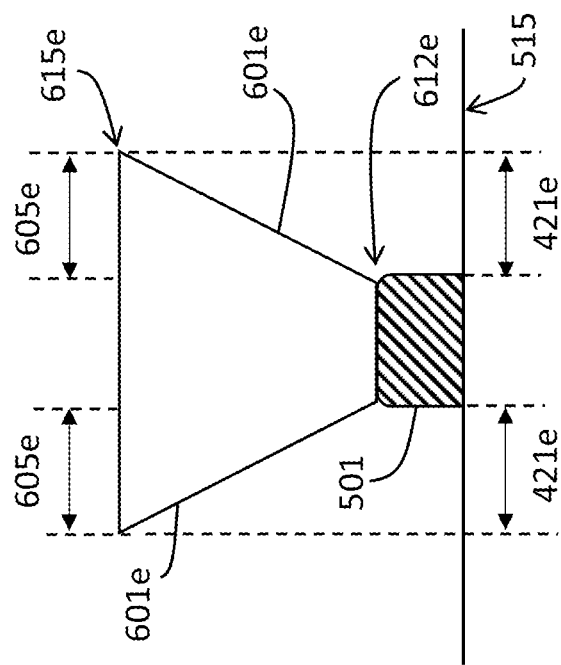

In FIG. 8E, the patterning structure 601e includes a base portion 612e, a top portion 615e, and a sidewall 601e extending between the base portion 612e and the top portion 615e. The top portion 615e extends laterally from the base portion 601 such that a laterally extending portion 605e of the patterning structure 601e is formed. In the illustrated embodiment, the sidewall 601e and the laterally extending portion 605e are provided on at least two sides of the patterning structure 601e. Each laterally extending portion 605e forms a shadowed region 421e on a surface 515 onto which the patterning structure 601e is disposed. For example, the surface 515 may be the surface of a pixel definition layer or the surface of a substrate. In the illustrated embodiment, the sidewall 601a is illustrated as including a linear or straight surface. The auxiliary electrode 501 is arranged to be in overlapping relation with respect to the patterning structure 601e. In the illustrated embodiment, each shadowed region 421e formed by the laterally extending portion 605e is substantially free of, or is uncovered by the auxiliary electrode 501 such that the surface 515 is exposed.

In FIG. 8F, an embodiment is illustrated wherein the auxiliary electrode 501 extends laterally to overlap each of the laterally extending portion 605e of the patterning structure 601b. In such embodiment, a portion of the auxiliary electrode 501 is provided in each shadowed region 421f of the surface 515. Accordingly, the conductive coating (not shown) may be deposited on the surface of the auxiliary electrode 501 in the shadowed region 421f to be in electrical contact with the auxiliary electrode 501 on at least two sides.

As would be appreciated, the sidewalls 601e, 601f illustrated in FIGS. 8E and 8F, respectively, may also include curved portions such as those illustrated in FIGS. 8A to 8E. In some embodiments, the sidewalls are symmetrical. In some embodiments, the sidewalls are non-symmetrical such that one side is provided with a sidewall that is different from the other side.

Figure 9:
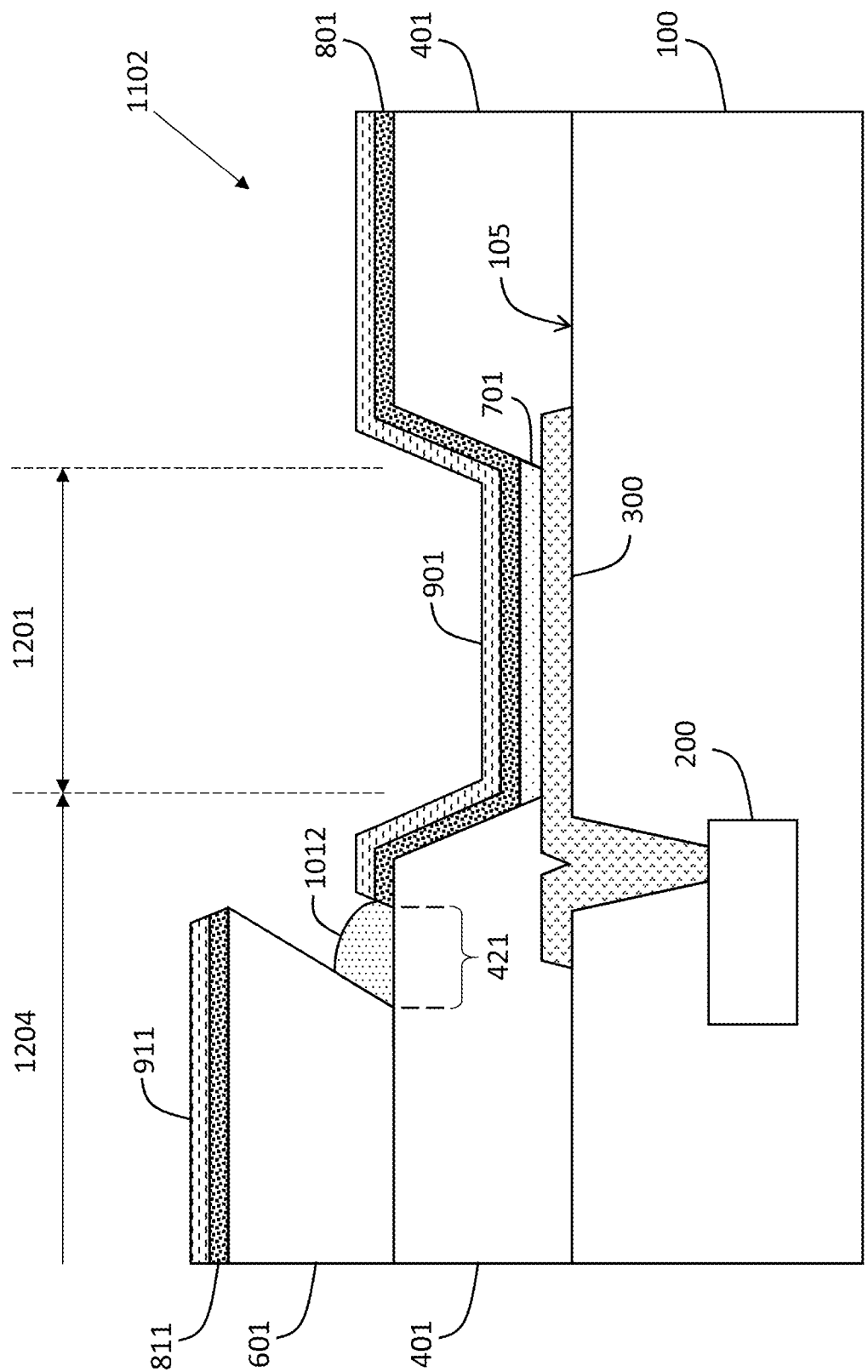
FIG. 9 is a schematic cross-sectional view of an opto-electronic device according to yet another embodiment.

FIG. 9 illustrates an opto-electronic device 1102 according to one embodiment wherein the auxiliary electrode is formed integral to the conductive coating 1012 and is disposed on the surface of the pixel definition layer 401. In the illustrated embodiment, the device 1102 includes the emissive region 1201 arranged adjacent to the non-emissive region 1204. The emissive region 1201 includes the first electrode 300 disposed on the surface 105 of the substrate 100, a semiconducting layer 701 disposed on the first electrode 300, and the second electrode 801 disposed over the semiconducting layer 701. The non-emissive region 1204 includes a pixel definition layer 401 and a patterning structure 601 disposed on the surface of the pixel definition layer 401. The patterning structure 601 extends laterally to provide a shadowed region 421. In the illustrated embodiment, the shadowed region 421 corresponds to a region on the surface of the pixel definition layer 410 which overlaps with a laterally extending portion of the patterning structure 601. The non-emissive region 1204 further includes a conductive coating 1012 disposed in the shadowed region 421. In the illustrated embodiment, at least a portion of the conductive coating 1012 is formed to act as the auxiliary electrode. The conductive coating 1012 is electrically connected to the second electrode 801 to reduce the sheet resistance of the second electrode 801. A nucleation inhibiting coating 901 is disposed in the emissive region 1201 and the non-emissive region 1204. The nucleation inhibiting coating 901 is disposed on the surface of the second electrode 801. In some embodiments, the surface of the patterning structure 601 is coated with a residual second electrode 811 and a residual nucleation inhibiting coating 911. The portion of the surface of the pixel definition layer 401 corresponding to the shadowed region 421 is substantially free of, or uncovered by the nucleation inhibiting coating 901 to allow the conductive coating 1012 to be deposited thereon.

Figure 10:
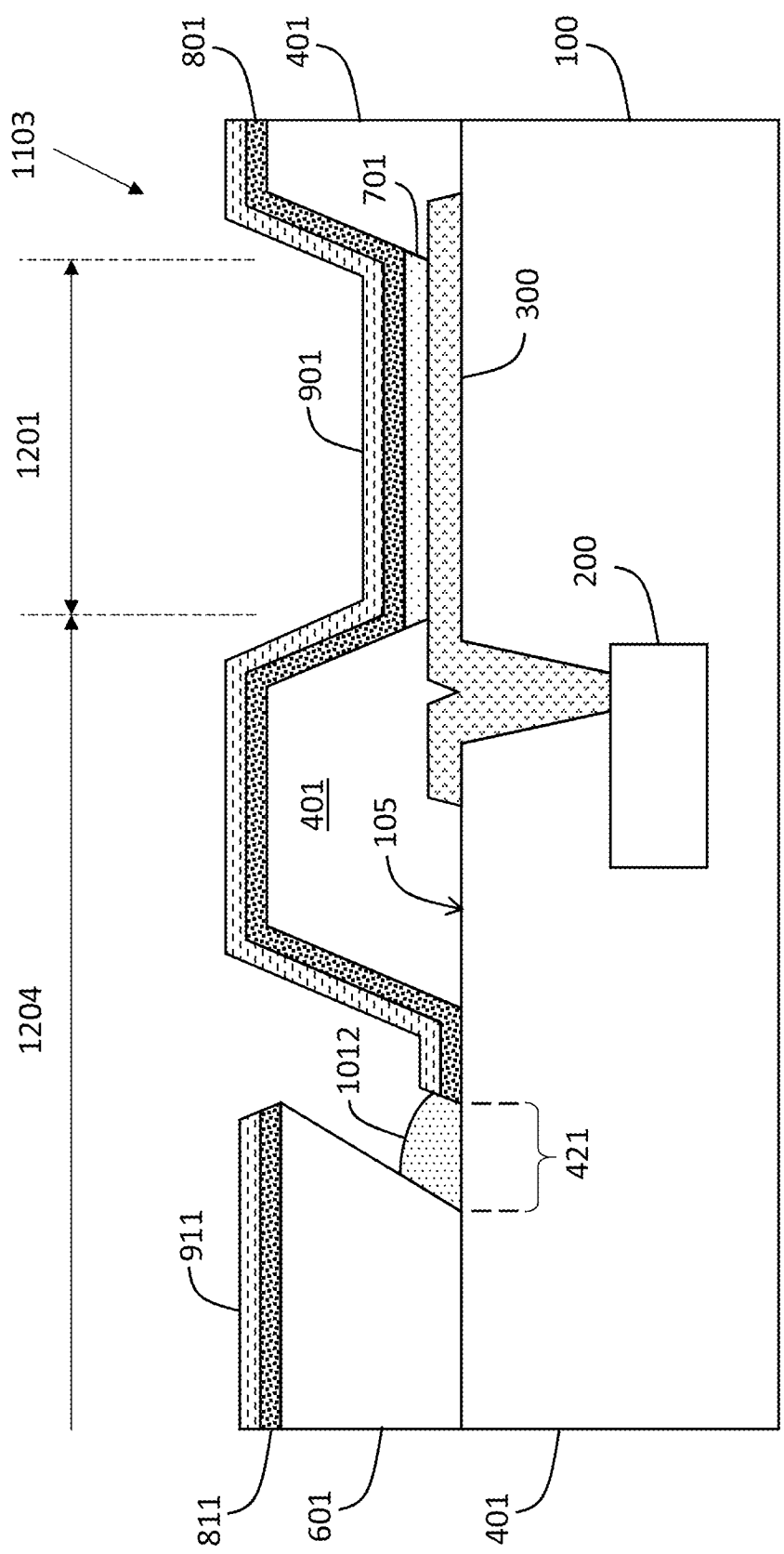
FIG. 10 is a schematic cross-sectional view of an opto-electronic device according to yet another embodiment.

FIG. 10 illustrates an opto-electronic device 1103 according to one embodiment wherein the auxiliary electrode is formed integral to the conductive coating 1012 and is disposed on the surface 105 of the substrate 100. In the illustrated embodiment, the device 1103 includes the emissive region 1201 arranged adjacent to the non-emissive region 1204. The emissive region 1201 includes the first electrode 300 disposed on the surface 105 of the substrate 100, a semiconducting layer 701 disposed on the first electrode 300, and the second electrode 801 disposed over the semiconducting layer 701. The non-emissive region 1204 includes a pixel definition layer 401 and a patterning structure 601 disposed on the surface 105 of the substrate 100. The patterning structure 601 extends laterally to provide a shadowed region 421. In the illustrated embodiment, the shadowed region 421 corresponds to a region on the surface of the pixel definition layer 410 which overlaps with a laterally extending portion of the patterning structure 601. The non-emissive region 1204 further includes a conductive coating 1012 disposed in the shadowed region 421. In the illustrated embodiment, at least a portion of the conductive coating 1012 is formed to act as the auxiliary electrode. The conductive coating 1012 is electrically connected to the second electrode 801 to reduce the sheet resistance of the second electrode 801. A nucleation inhibiting coating 901 is disposed in the emissive region 1201 and the non-emissive region 1204. The nucleation inhibiting coating 901 is disposed on the surface of the second electrode 801. In some embodiments, the surface of the patterning structure 601 is coated with a residual second electrode 811 and a residual nucleation inhibiting coating 911. The portion of the surface 105 corresponding to the shadowed region 421 is substantially free of, or uncovered by the nucleation inhibiting coating 901 to allow the conductive coating 1012 to be deposited thereon.

Figure 11:
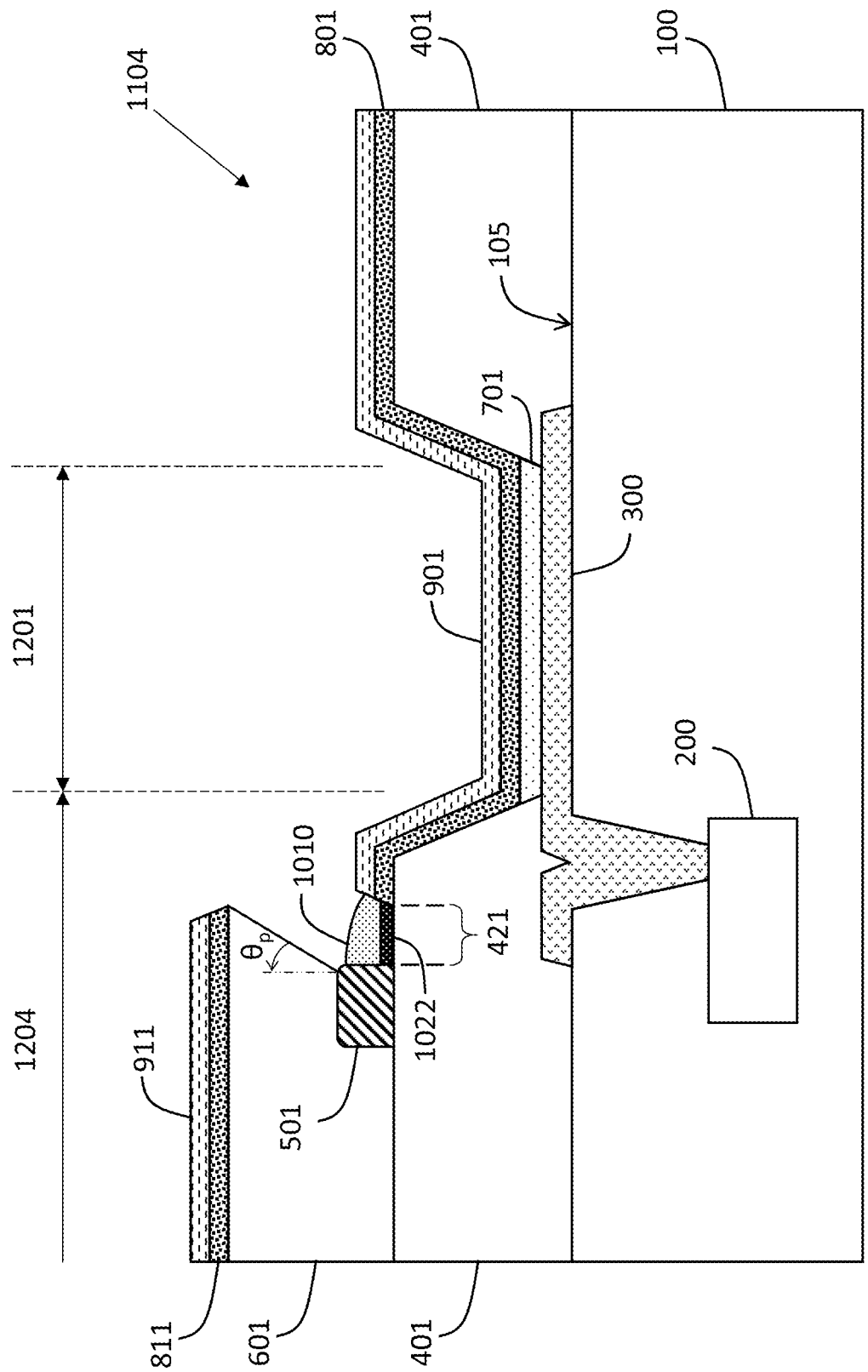
FIG. 11 is a schematic cross-sectional view of an opto-electronic device according to yet another embodiment.

In some embodiments, a nucleation promoting coating is provided. FIG. 11 illustrates an embodiment wherein the device 1104 is provided with a nucleation promoting coating 1022 disposed on the surface of the pixel definition layer 401, and underneath the conductive coating 1010. The nucleation promoting coating 1022 may be deposited prior to the deposition of the nucleation inhibiting coating 901 and/or the second electrode 801. For example, the nucleation promoting coating 1022 may be formed after providing the pixel definition layer 401 onto the surface 105 of the substrate 100 and before the deposition of the semiconducting layer 701. In the illustrated embodiment, the nucleation promoting coating 1022 is provided in the region of the surface of the pixel definition layer 401 corresponding to the shadowed region 421. The nucleation promoting coating 1022 is disposed such that it is in direct contact with the surface of the pixel definition layer 401 and the conductive coating 1010. In some embodiments, the nucleation promoting coating 1022 may be provided by a portion of the semiconducting layer 701. For example, the material for forming the electron injection layer of the semiconducting layer 701 may be deposited using an open mask deposition process to result in deposition of such material in both the emissive region 1201 and the non-emissive region 1204 of the device 1104. For example, referring to FIG. 11, a portion of the semiconducting layer 701 (e.g., the electron injection layer) may be deposited to coat the surface of the pixel definition layer 401 in the shadowed region 421. Examples of such materials for forming the electron injection layer includes, but are not limited to the following: alkali metals, alkaline earth metals, fluorides of alkaline earth metals, fullerene, and mixtures of two or more of foregoing. Examples of such materials include, but are not limited to, the following: lithium (Li), ytterbium (Yb), ytterbium fluoride ($YbF_3$), magnesium fluoride ($MgF_2$), and cesium fluoride (CsF). In other embodiments, the nucleation promoting coating 1022 may be provided by the second electrode 801 or portions thereof. For example, the second electrode 801 may extend laterally to cover the surface of the pixel definition layer 401 in the shadowed region 421. For example, the second electrode 801 in some cases includes two or more layers or materials. For example, the second electrode 801 may include a lower second electrode layer and an upper second electrode layer, wherein the upper second electrode layer is arranged on top of the lower second electrode layer. For example, the lower second electrode layer may include an oxide such as ITO, IZO, and ZnO and the upper second electrode layer may include a metal such as Ag, Mg, Yb, Mg:Ag, Yb/Ag, other alkali and alkaline earth metals, and combinations of the foregoing. In a further example, the lower second electrode layer may laterally extend to cover the shadowed region 421, such that the lower second electrode layer forms the nucleation promoting coating 1022.

Figure 12:
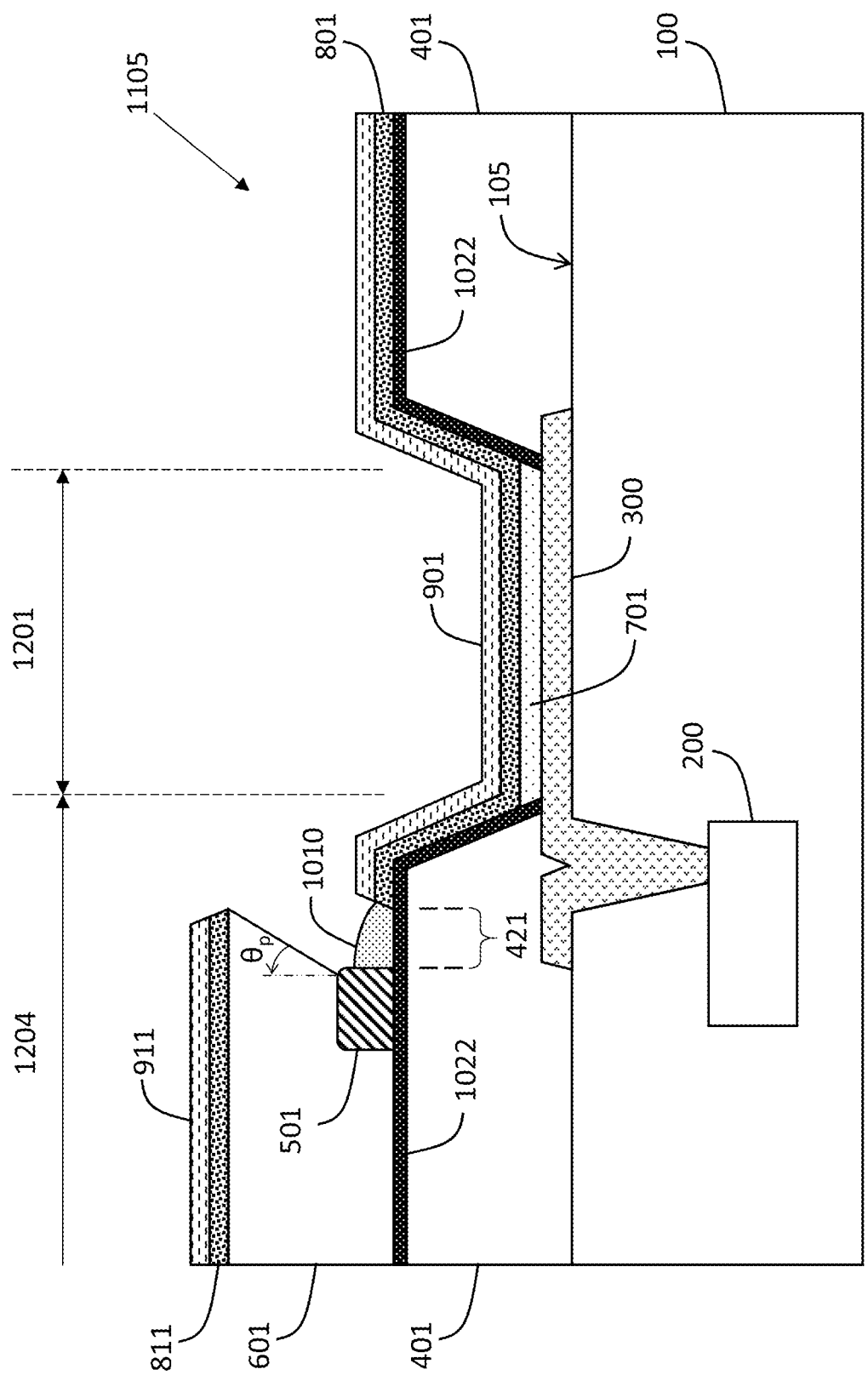
FIG. 12 is a schematic cross-sectional view of an opto-electronic device according to yet another embodiment.

In some embodiments, the surface of the pixel definition layer 401 may be treated to form a nucleation promoting coating. FIG. 12 illustrates an embodiment wherein the device 1105 includes a pixel definition layer 401 having a nucleation promoting coating 1022 provided on the surface thereof. Specifically in the embodiment of FIG. 12, the surface of the pixel definition layer 1022, including the region corresponding to the shadowed region 421 and regions outside the shadowed region 421 are provided with the nucleation promoting coating 1022. For example, the nucleation promoting coating 1022 may be provided prior to forming the auxiliary electrode 501 and the patterning structure 601. For example, the nucleation promoting coating 1022 may be provided after forming the pixel definition layer 401 and prior to forming the auxiliary electrode 501 and the patterning structure 601. In some embodiments, the nucleation promoting coating 1022 is formed by treating the surface of the pixel definition layer 401. In some embodiments, the surface of the pixel definition layer is treated chemically and/or physically. For example, the surface of the pixel definition layer 401 may be treated by subjecting the surface to a plasma treatment, UV treatment, and/or UV-ozone treatment. Without wishing to be bound by any particular theory, it is postulated that such treatment would chemically and/or physically alter the surface of the pixel definition layer 401 to modify the properties thereof. For example, treatment of the pixel definition layer 401 may result in an increase in the concentration of C—O or C—OH bonds on the surface, increase the roughness of the surface, and/or increase the concentration of certain species and/or functional groups such as halogens, nitrogen-containing functional groups, and/or oxygen-containing functional groups to thereby act as a nucleation promoting coating 1022. While the nucleation promoting coating 1022 is illustrated as being provided only on the surface of the pixel definition layer 401, it will be appreciated that in some embodiments, the pixel definition layer 401 may be formed using a material for forming the nucleation promoting coating 1022 and thus the entire pixel definition layer 401 may act as the nucleation promoting coating.

Figure 13:
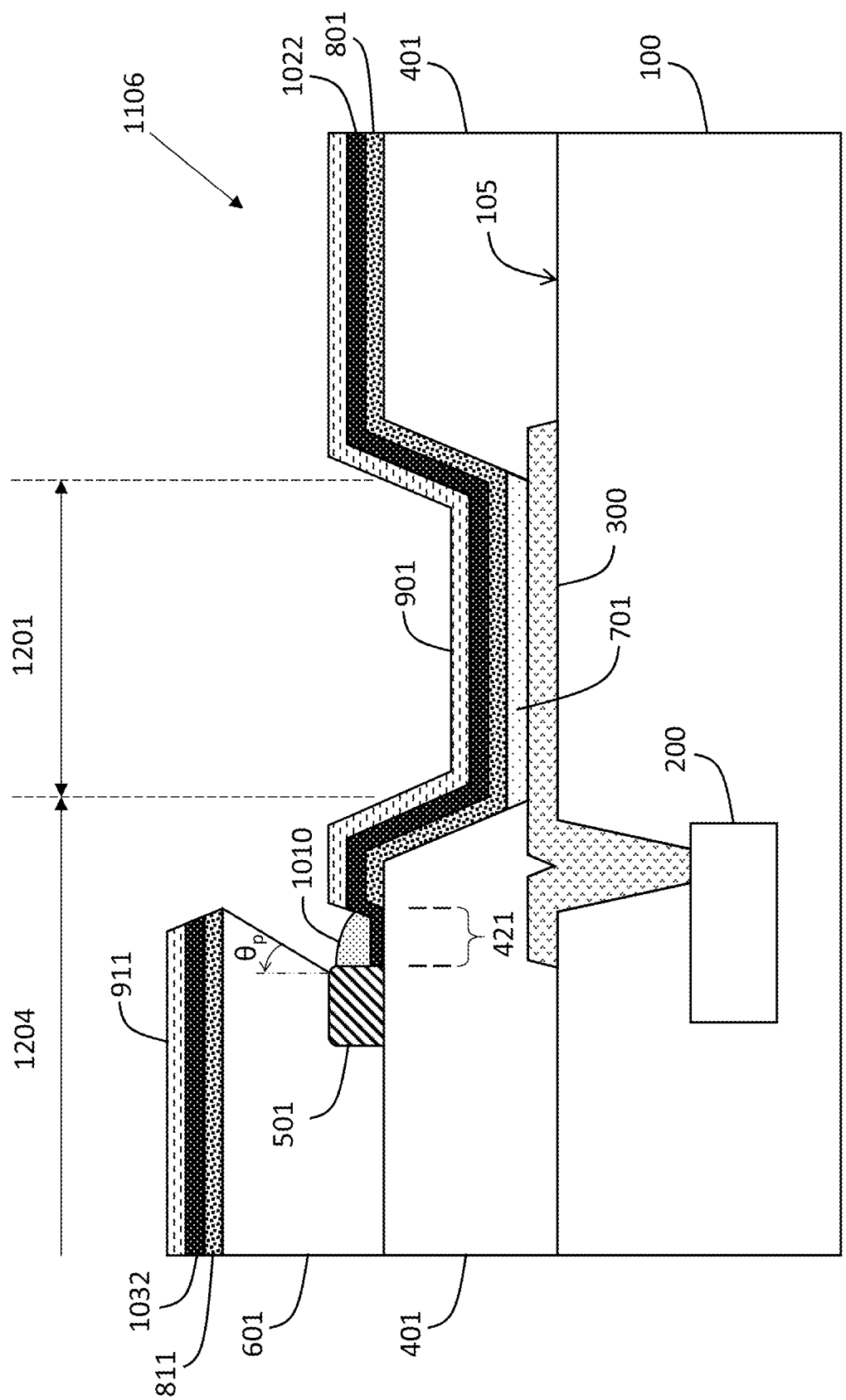
FIG. 13 is a schematic cross-sectional view of an opto-electronic device according to yet another embodiment.

FIG. 13 illustrates an embodiment of the device 1106 wherein the nucleation promoting coating 1022 is provided both in the emissive region 1201 and the non-emissive region 1204. In the illustrated embodiment, the nucleation promoting coating 1022 is deposited after the second electrode 801 has been deposited, and prior to the nucleation inhibiting coating 901 is deposited. In such embodiment, the nucleation promoting coating 1022 is arranged between the second electrode 801 and the nucleation inhibiting coating 901, and the nucleation promoting coating 1022 may be in direct contact with the second electrode 801 and the nucleation inhibiting coating 901. In this way, during deposition of the conductive coating 1010, the surface of the emissive region 1201 is covered by the nucleation inhibiting coating 901 and thus the deposition of the conductive coating 1010 in the emissive region 1201 is inhibited. In the illustrated embodiment, the nucleation promoting coating 1010 is also provided on the surface of the pixel definition layer 401 corresponding to the shadowed region 421. For example, an evaporation source for depositing a nucleation promoting material may be used to direct an evaporated nucleation promoting material towards the emissive region 1201 and the non-emissive region 1204, including the surface of the pixel definition layer 401 corresponding to the shadowed region 421, such that the evaporated nucleation promoting material is incident on such surfaces. In some embodiments, the deposition of the nucleation promoting coating 1022 is performed using an open mask or without a mask. In some embodiments, at least a portion of the evaporated flux is directed at a non-normal angle with respect to the surface of the pixel definition layer 401 corresponding to the shadowed region 421. For example, at least a portion of the evaporated flux may be incident onto the surface of the pixel definition layer 401 at an angle of incidence less than 90 degrees with respect to the surface of the pixel definition layer 401. For example, the angle of incidence is less than about 85 degrees, less than about 80 degrees, less than about 75 degrees, less than about 70 degrees, less than about 60 degrees, or less than about 50 degrees. By directing an evaporated flux including a portion incident upon the surface at a non-normal angle, the shadowed region 421 may be exposed to the evaporated flux. Specifically, the likelihood of such evaporated flux becoming inhibited from striking the surface in the shadowed region 421 due to the presence of the patterning structure is reduced due to the evaporated flux including a portion which is directed at a non-normal angle of incidence. In some embodiments, at least a portion of the evaporated flux is noncollimated. In some embodiments, the device 1106 is displaced during treatment. For example, the device 1106 including the substrate 100 is displaced while being subjected to the evaporated flux. In some embodiments, the device 1106 and the substrate 100 is subjected to an angular displacement, a lateral displacement, and/or a vertical displacement. In some embodiments, device 1106 including the substrate 100 is rotated about a rotation axis. For example, the rotation axis may be substantially normally oriented with respect to the surface 105 or plane of the substrate 100. During the deposition of the nucleation promoting coating 1022, a residual nucleation promoting coating 1032 may also be formed on top of the patterning structure 601. In particular, such residual nucleation promoting coating 1032 is formed in embodiments wherein the nucleation promoting coating material is deposited using an open mask or without a mask. As illustrated, the residual nucleation promoting coating 1032 is arranged between the residual second electrode 811 and the residual nucleation inhibiting coating 911.

Figure 14:
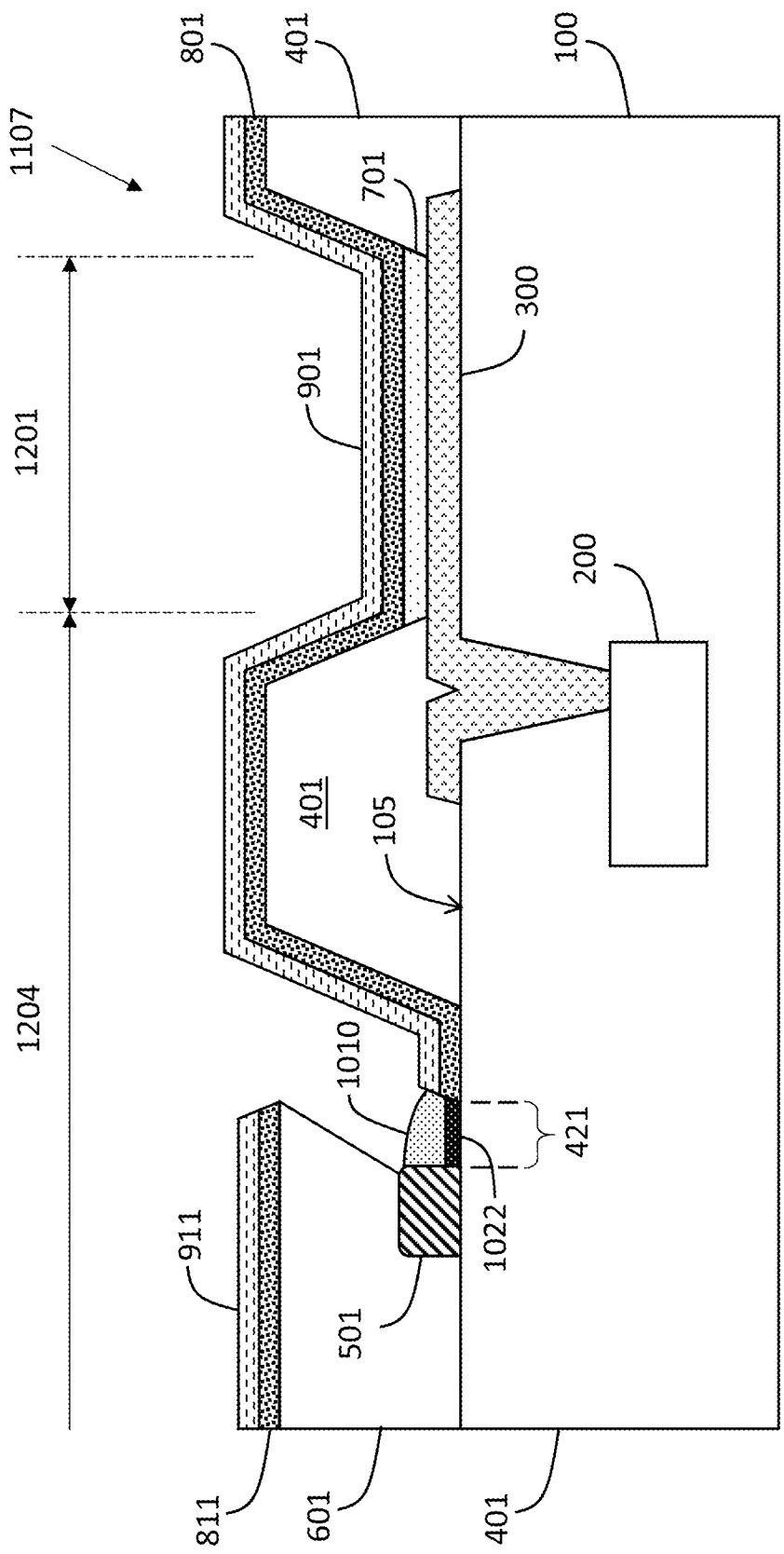
FIG. 14 is a schematic cross-sectional view of an opto-electronic device according to yet another embodiment.

FIG. 14 illustrates an embodiment of the device 1107 wherein the auxiliary electrode 501 is formed on the surface 105 of the substrate 100 and the nucleation promoting coating 1022 is provided between the surface 105 and the conductive coating 1010 in the shadowed region 421. Various descriptions of the nucleation promoting coating 1022 described in relation to the embodiments of FIGS. 11, 12, and 13 may also apply to the embodiment of FIG. 14. For example, the nucleation promoting coating 1022 may be formed by depositing a nucleation promoting material on a portion of the surface 105 corresponding to the shadowed region 421, or by treating at least a portion of the surface 105 to modify the properties thereof. In some embodiments, the surface 105 is treated chemically and/or physically. For example, the surface 105 may be treated by subjecting the surface to a plasma treatment, UV treatment, and/or UV-ozone treatment. In some embodiments, the nucleation promoting coating 1022 covers the non-emissive region 1204. In some embodiments, the nucleation promoting coating 1022 covers both the emissive region 1201 and the non-emissive region 1204.

FIGS. 15A to 15F are schematic illustrations of the conductive coating 1010 deposited in the shadowed region 421 according to various embodiments. In the illustrated embodiments, the conductive coating 1010 is deposited in the shadowed region 421 laterally arranged on the surface 515 between the auxiliary electrode 501 and the semiconducting layer 701, second electrode 801, and the nucleation inhibiting coating 901. As described above, the second electrode 801 is generally arranged on top of the semiconducting layer 701, and the nucleation inhibiting coating 901 is arranged on top of the second electrode 801. In each of the embodiments of FIGS. 15A to 15E, the conductive coating 1010 is in direct physical and electrical contact with the auxiliary electrode 501.

In FIG. 15A, the semiconducting layer 701, the second electrode 801, and the nucleation inhibiting coating 901 are illustrated as extending laterally to the boundary of the shadowed region 421. In such embodiment, an edge of the conductive coating 1010 is in direct contact with an edge of the second electrode 801 at the boundary of the shadowed region 421. Furthermore, the edge of the conductive coating 1010 is in direct contact with an edge of the semiconducting layer 701 and the nucleation inhibiting coating 901 at the boundary of the shadowed region 421.

In FIG. 15B, the semiconducting layer 701 is illustrated as extending laterally to the boundary of the shadowed region 421. The corresponding edges of the second electrode 801 and the nucleation inhibiting coating 901 are illustrated as being recessed from the boundary of the shadowed region 421. In such embodiment, the conductive coating 1010 extends away from the auxiliary electrode 501 beyond the shadowed region 421, such that an edge of the conductive coating 1010 is in direct contact with an edge of the second electrode 801 at a location outside the shadowed region 421 (e.g. a location recessed from the boundary of the shadowed region 421).

In FIG. 15C, the edge of the semiconductor layer 701 is illustrated as being recessed from the boundary of the shadowed region 421, and such edge of the semiconductor layer 701 is covered by the second electrode 801. The edges of the second electrode 801 and the nucleation inhibiting coating are illustrated as extending to the boundary of the shadowed region 421 such that the edge of the conductive coating 1010 is in direct contact with the edge of the second electrode 801 at such boundary.

In FIG. 15D, the edges of the semiconductor layer 701 and the second electrode 801 are recessed from the boundary of the shadowed region 421. The edge of the semiconductor layer is covered by the second electrode 801, and the edge of the second layer 801 is covered by the nucleation inhibiting coating 901. In such embodiment, the edge of the conductive coating 1010 may be in direct contact with the edge of the nucleation inhibiting coating 901 at the boundary of the shadowed region 421.

Figure 15E:
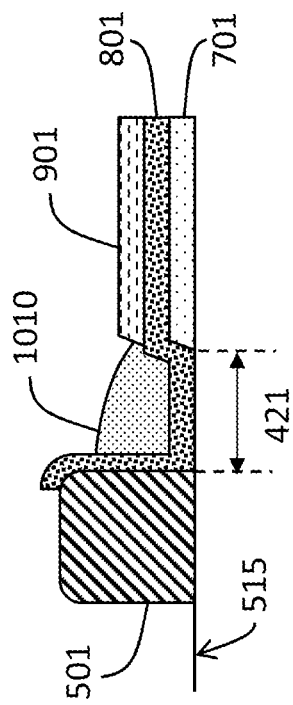

In FIG. 15E, the semiconducting layer 701 is illustrated as extending to the boundary of the shadowed region 421. The second electrode 801 is arranged over the semiconducting layer 701 and extends beyond the boundary of the shadowed region 421 towards the auxiliary electrode 501, such that the second electrode 801 covers at least a portion of the shadowed region 421. For example, the second electrode 801 may substantially cover the portion of the surface 515 corresponding to the shadowed region 801. In other examples, the second electrode 801 may selectively cover a portion of the shadowed region 801 such that the second electrode 801 is not in direct physical contact with the auxiliary electrode 501. The nucleation inhibiting coating 901 is provided over the second electrode 801 and configured such that the surface of the second electrode 801 corresponding to the shadowed region 421 is substantially free of, or is exposed from, the nucleation inhibiting coating 901. In this way, the conductive coating 1010 may be deposited over the second electrode 801 in the shadowed region 421 to be in direct physical and electrical contact with the auxiliary electrode 501 and the second electrode 801.

Figure 15F:
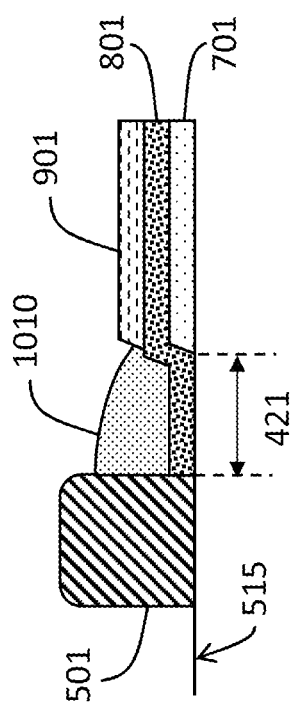

In FIG. 15F, an embodiment is illustrated wherein the semiconducting layer 701, the second electrode 801, and the nucleation inhibiting coating 901 are similarly arranged to the embodiment of FIG. 15E, except the second electrode 801 further extends to cover at least a portion of the auxiliary electrode 501. For example, the second electrode 801 may cover the surface 515 in the shadowed region 421 and a surface of the auxiliary electrode 501 such that the second electrode is disposed at the interface between the auxiliary electrode 501 and the conductive coating 1010. In such embodiment, the auxiliary electrode 501 and the conductive coating 1010 may not be in direct physical contact; however, the auxiliary electrode 501, the conductive coating 1010, and the second electrode 801 may nevertheless be in electrical contact with one another.

In some embodiments, it may be particularly desirable to deposit the residual nucleation inhibiting coating 911 on top of the patterning structure 601, such that the deposition of the conductive coating 1010 on top of the patterning structure 601 is substantially inhibited. For example, in some cases where the conductive coating material is deposited on top of the patterning structure 601, such coating may grow laterally to past the edge of the top portion 615 of the patterning structure 601 thus inhibiting deposition of the conductive coating material in the shadowed region 421. Accordingly, in some embodiments, the upper surface of the patterning structure 601 is substantially free of, or exposed from, the conductive coating.

While in some embodiments, the second electrode 801 and the conductive coating 1010 may not be in direct contact (e.g. the second electrode 801 and the conductive coating 1010 may be physically separated from one another by other layers and/or coatings), it will be appreciated that the second electrode 801 and the conductive coating 1010 may never-theless be electrically connected to allow current to flow between one another and thus reduce the effective sheet resistance of the second electrode 801. For example, referring to the embodiment of FIG. 15D, the thickness of the nucleation inhibiting coating 901 may be sufficiently thin to allow current to flow or tunnel there through without substantial impedance. Alternatively or in addition thereto, the nucleation inhibiting coating 901 may be formed using an electrically conductive material to allow the conductive coating 1010 to be electrically connected to the second electrode 801.

Particularly in AMOLED devices having pixel definition layers or bank structures with a relatively high aspect ratio (e.g., a relative ratio of height to width), it is challenging to electrically connect a common electrode to an auxiliary electrode formed on the surface of the substrate using comparative methods.

In one aspect, a method for manufacturing an optoelectronic device is provided, the method including providing a substrate having a substrate surface. The substrate includes at least one thin film transistor. A first electrode and an auxiliary electrode are disposed on the substrate surface. The first electrode is in electrical communication with the at least one thin film transistor. A bank structure is disposed on the surface and the bank structure defines a via hole region for exposing the auxiliary electrode. For example, the auxiliary electrode surface may be exposed in the via hole region. The method includes depositing a semiconducting layer over the first electrode, depositing a second electrode over the semiconducting layer, depositing a nucleation inhibiting coating over the second electrode, and treating the nucleating inhibiting coating and the via hole region to deposit a conductive coating in the via hole region, while at least a portion of the nucleation inhibiting coating remains substantially uncovered by the conductive coating. Upon depositing the conductive coating, the second electrode and the auxiliary electrode are electrically connected by the conductive coating. In some embodiments, the via hole is defined by the bank structure. In some embodiments, the via hole region is defined by a via hole extending substantially vertically. In some embodiments, the via hole extends substantially vertically through a portion of the bank structure. In some embodiments, another bank structure is disposed on the surface, and the via hole is defined by a gap formed between the bank structure and the another bank structure. For example, the another bank structure may be arranged laterally spaced apart from the bank structure. In some embodiments, at least a portion of the bank structure is arranged laterally between the first electrode and the auxiliary electrode. In some embodiments, at least a portion of the semiconducting layer is deposited by printing. In some embodiments, the nucleation inhibiting coating is deposited at a non-normal angle of incidence. The via hole region is substantially free of the nucleation inhibiting coating.

Figure 16:
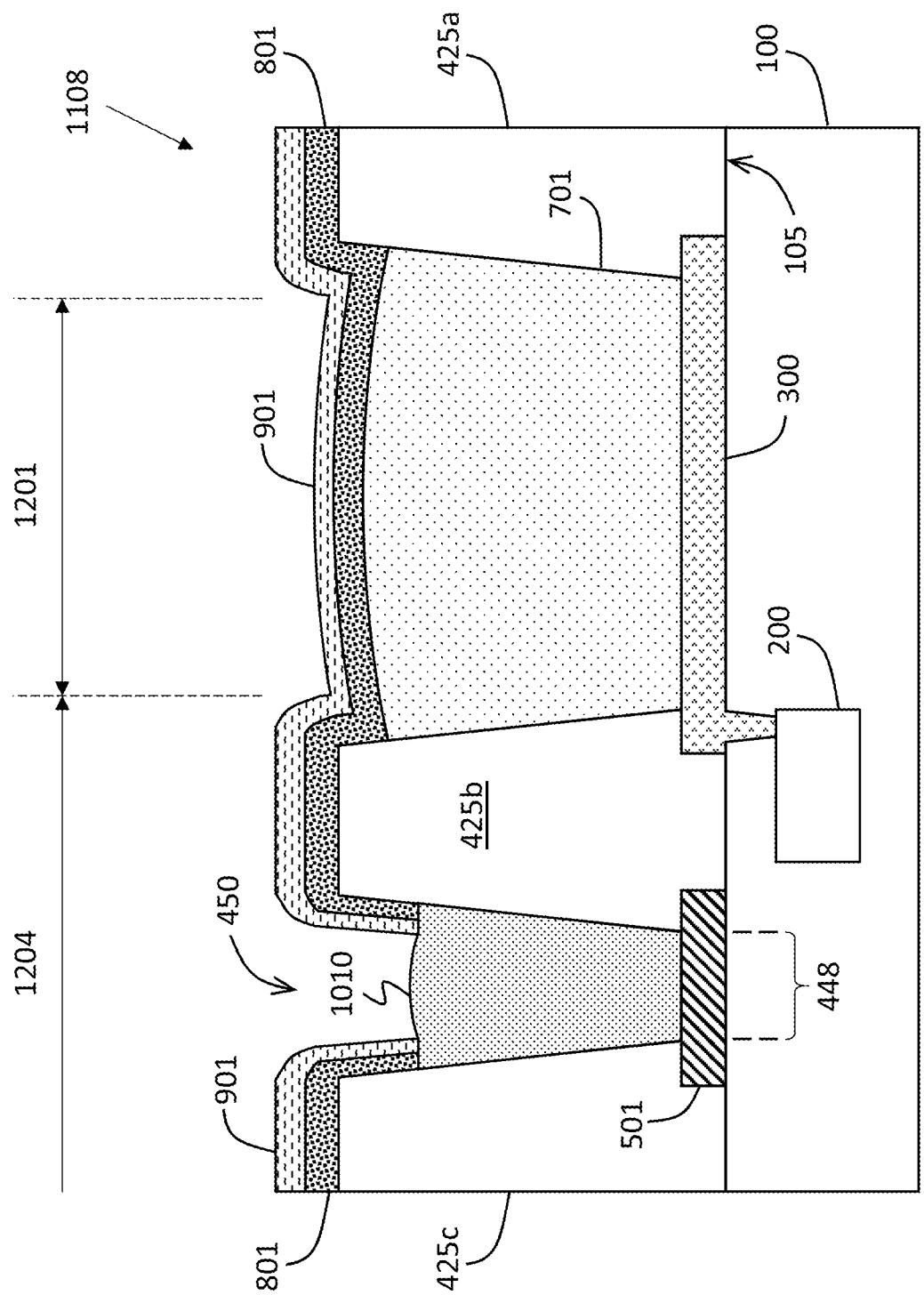
FIG. 16 is a schematic cross-sectional view of an opto-electronic device according to an embodiment wherein bank structures are provided.

FIG. 16 illustrates a device 1108 fabricated according to an embodiment wherein the device 1108 includes one or more bank structures 425a, 425b, 425c. In the illustrated embodiment, the device 1108 includes the emissive region 1201 arranged adjacent to the non-emissive region 1204. The emissive region 1201 includes the first electrode 300 disposed on the surface 105 of the substrate 100, a semiconducting layer 701 disposed on the first electrode 300, and the second electrode 801 disposed over the semiconducting layer 701. For example, at least a portion of the semiconducting layer 701 may be deposited by printing techniques, such as by ink-jet printing. The non-emissive region 1204 includes one or more bank structures 425a, 425b, 425c. The one or more bank structures 425a, 425b, 425c generally defines a specific structure, for example a well, which may be filled by materials forming the semiconducting layer 701. An auxiliary electrode 501 is provided on the surface 105 of the substrate 100. In the illustrate embodiment, the auxiliary electrode 501 is arranged in the non-emissive region 1204, and in a via hole region 448 defined between the bank structures 425b and 425c. In some embodiments, the bank structure 425b and 425c may be physically disconnected or isolated such that a via hole 450 is defined between a bank structure 425b and a neighbouring bank structure 425c. In such embodiment, the via hole region 448 corresponds to area defined by the walls of the bank structures 425b, 425c forming the via hole 450. In some embodiments, the bank structures 425b and 425c may be formed integrally or as a continuous structure. In such embodiments, the via hole 450 may extend through the bank structure 425b, 425c to define the via hole region 448. For example, the via hole 450 may extend substantially vertically to the surface of the auxiliary electrode 501. The non-emissive region 1204 further includes a conductive coating 1010 disposed in the via hole region 448. In the illustrated embodiment, the conductive coating 1010 is disposed inside the via hole 450, and is in electrical contact with the auxiliary electrode 501 and the second electrode 801. In some embodiments, the conductive coating 1010 is in direct physical contact with the auxiliary electrode 448 and/or the second electrode 801. A nucleation inhibiting coating 901 is disposed in the emissive region 1201 and the non-emissive region 1204. The nucleation inhibiting coating 901 is disposed on the surface of the second electrode 801. The via hole region 448 is substantially free of, or is uncovered by the nucleation inhibiting coating 901 to allow the conductive coating 1010 to be deposited thereon. In some embodiments, the nucleation inhibiting coating 901 is deposited by evaporating a nucleation inhibiting coating material to generate an evaporated flux, and subjecting the surface of the second electrode 801 to the evaporated flux to deposit the nucleation inhibiting coating 901 thereon. To reduce the likelihood of the evaporated flux of the nucleation inhibiting coating material from becoming incident onto the via hole region 448, the evaporated flux of the nucleation inhibiting coating material may be directed at a non-normal angle of incidence. Specifically, by providing the bank structure 425b, 425c having a relatively high aspect ratio, the likelihood of the evaporated flux directed as a non-normal angle of incidence arriving at the surface of the auxiliary electrode 501 arranged in the via hole region 448 formed by the bank structures 425b, 425c is reduced. Therefore, the deposition of the nucleation inhibiting coating 901 in the via hole region 448 and the surface of the auxiliary electrode 501 is reduced. In some embodiments, the nucleation inhibiting coating 901 may be deposited by selectively printing the material for forming the nucleation inhibiting coating 901 onto the surface of the second electrode 801. For example, various printing techniques such as ink-jet printing may be used to deposit the nucleation inhibiting coating 901.

It will be appreciated that features described in various embodiments may also be applicable to, and be combined with other features described in other embodiments. For example, referring to the embodiment of FIG. 16, the device 1108 may further be provided with a nucleation promoting coating, for example on the surfaces of the bank structures 425b, 425c.

In one aspect, an opto-electronic device is provided. The opto-electronic device includes a first electrode and a second electrode, a semiconducting layer disposed between the first electrode and the second electrode, a nucleation inhibiting coating disposed over at least a portion of the second electrode, an auxiliary electrode having a sidewall, and a conductive coating arranged adjacent to the sidewall, the conductive coating in electrical connection with the auxiliary electrode and the second electrode.

Figure 17A:
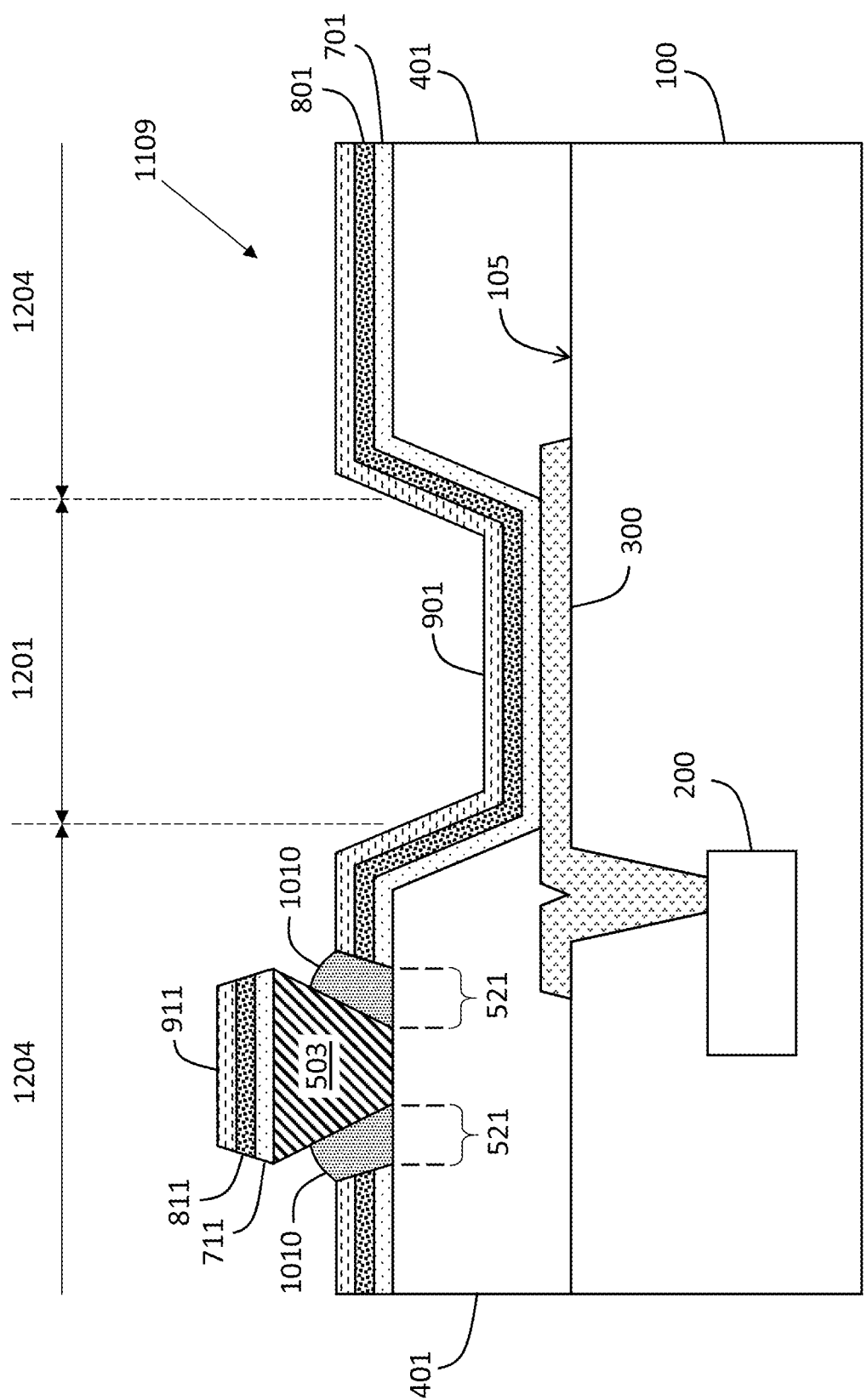
FIG. 17A is a schematic cross-sectional view of an opto-electronic device according to an embodiment wherein an auxiliary electrode provides a shadowed region.

The opto-electronic device 1109 according to one embodiment is illustrated in FIG. 17A. The device 1109 includes a substrate 100 including one or more TFTs 200. The first electrode 300 is formed on the surface 105 of the substrate 100 such that the first electrode 300 is in electronic communication with the TFT 200. The pixel definition layer 401 is then provided on the surface 105 of the substrate 100, such that the PDL 401 defines an opening through which the surface of the first electrode 300 is exposed. Each opening defined by the PDL 401 generally corresponds to an emissive region 1201 of the device 1109. In the illustrated embodiment, the auxiliary electrode 503 is shown as being provided over the PDL 401. For example, the auxiliary electrode 503 may be disposed on the surface of the PDL 401, such that the auxiliary electrode 503 is in physical contact with the PDL 401. For example, the surface of the PDL 401 onto which the auxiliary electrode 503 is provided may be electrically insulated. The device 1109 further includes the semiconducting layer 701 disposed on the first electrode 300, and the second electrode 801 disposed over the semiconducting layer 701. The nucleation inhibiting coating 901 is then disposed over at least a portion of the second electrode 801. In some embodiments, at least the portion of the second electrode 801 corresponding to the emissive region 1201 is coated by the nucleation inhibiting coating 901. In some further embodiments, the portion of the second electrode 801 corresponding to the non-emissive region 1204 is also coated by the nucleation inhibiting coating 901. The conductive coating 1010 is disposed adjacent to the auxiliary electrode 503 to electrically connect the auxiliary electrode 1010 and the second electrode 801.

Figure 17B:
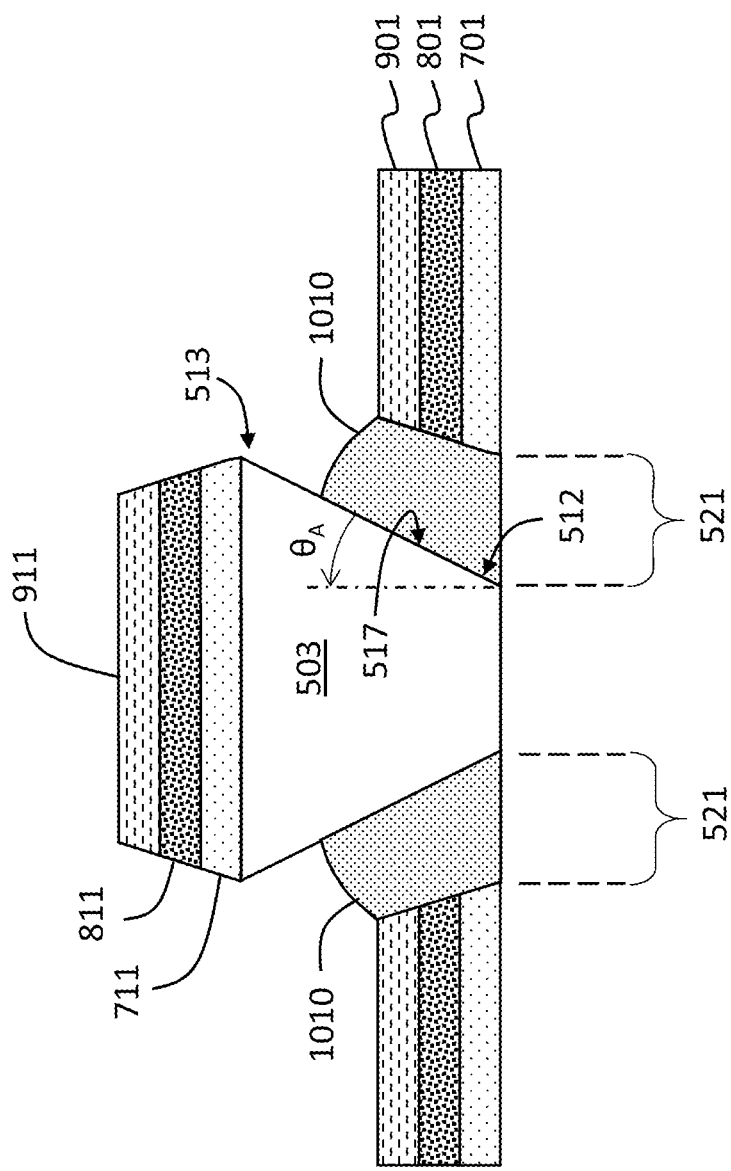
FIG. 17B is a schematic cross-sectional view of the shadowed region and adjacent portions of the device of FIG. 17A.

FIG. 17B illustrates the details of the device 1109 near the auxiliary electrode 503. In the illustrated embodiment, the auxiliary electrode 503 includes a top portion 513, a base portion 512, and a sidewall 517 extending between the top portion 513 and the base portion 512. The base portion 512 may be recessed with respect to the top portion 513 to form an auxiliary electrode 503 defining an overhang. In other words, the top portion 513 may extend laterally to block a greater area of the underlying surface than the area covered by the base portion 512. In this way, the sidewall 517 extending between the top portion 513 and the base portion 512 forms an overhanging profile. For example, the tangential angle $\theta_A$ of the sidewall 517 with respect to the normal of the underlying surface may be equal to or greater than about 10 degrees, equal to or greater than about 20 degrees, equal to or greater than about 30 degrees, equal to or greater than about 40 degrees, equal to or greater than about 45 degrees, equal to or greater than about 50 degrees, equal to or greater than about 55 degrees, or equal to or greater than about 60 degrees. In some embodiments, a shadowed region 521 is formed adjacent to the auxiliary electrode 503 due to the overhanging profile of the auxiliary electrode 503. Consequently, in some embodiments, the semiconducting layer 701, the second electrode 801, and the nucleation inhibiting coating 901 may be impeded from becoming deposited in the shadowed region 521. In such embodiments, the shadowed region 521 is substantially free from, or is substantially exposed from, the semiconducting layer 701, the second electrode 801, and the nucleation inhibiting coating 901. For example, particularly in embodiments wherein the depositions of the materials for forming the semiconducting layer 701, the second electrode 801, and the nucleation inhibiting coating 901 are conducted using an open mask or without a mask, such materials may also become deposited over the auxiliary electrode 503. For example, as illustrated in FIGS. 17A and 17B, the residual semiconducting layer 711, the residual second electrode 811, and the residual nucleation inhibiting coating 911 may be deposited in sequence on the upper surface of the auxiliary electrode 503. The conductive coating 1010 is selectively deposited in the shadowed region 521 according to the process detailed above. In the illustrated embodiment, the conductive coating 1010 is disposed to be in direct physical contact with the sidewall 517 of the auxiliary electrode 503. In some embodiments, the conductive coating 1010 may also be disposed to be in direct physical contact with the surface of the PDL 401. The conductive coating 1010 may also be in contact with the second electrode 801 to establish an electrical contact therewith.

Figure 18:
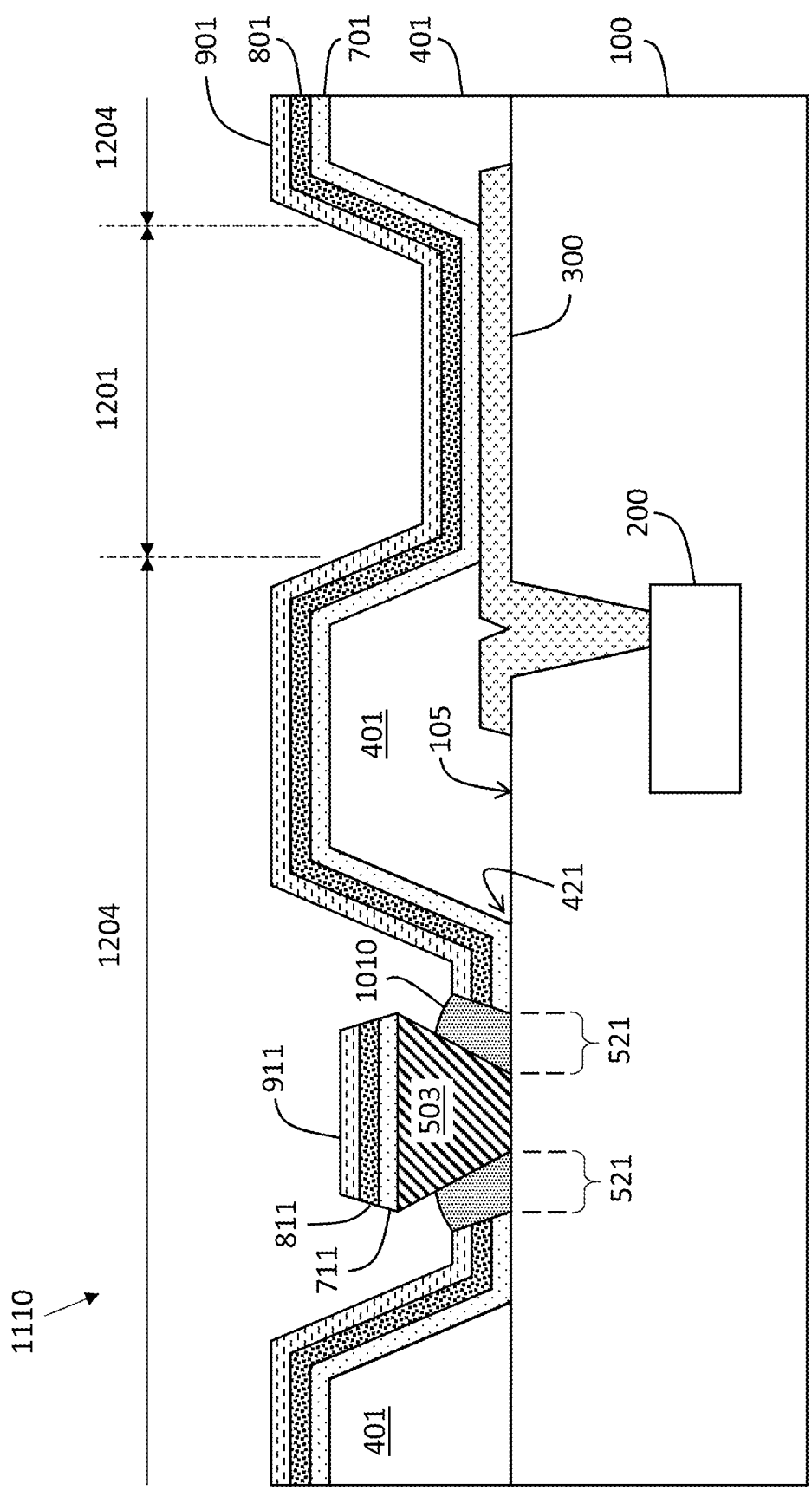
FIG. 18 is a schematic cross-sectional view of an opto-electronic device according to another embodiment wherein an auxiliary electrode provides a shadowed region.

FIG. 18 illustrates another embodiment of an opto-electronic device 1110, wherein the auxiliary electrode 503 is disposed directly on the surface 105 of the substrate 100. Specifically, the device 1110 includes a substrate 100 including one or more TFT 200. The substrate 100 defines a surface 105 onto which the first electrode 300 and the auxiliary electrode 503 are disposed. In some embodiments, the first electrode 300 and the auxiliary electrode 503 are formed using the same material. This may be advantageous in some cases for simplifying the deposition and patterning process to form the first electrode 300 and the auxiliary electrode 503. For example, the surface 105 may be provided by an electrically insulating material, such that the first electrode 300 and the auxiliary electrode 503 are electrically insulated from one another. The PDL 401 is then provided to cover a portion of the first electrode 300 to define the emissive region 1201. The semiconducting layer 701, the second electrode 801, and the nucleation inhibiting coating 901 are then deposited in sequence over the emissive region 1201 and the non-emissive region 1204. However, due to the overhanging profile of the auxiliary electrode 503, deposition of the semiconducting layer 701, the second electrode 801, and the nucleation inhibiting coating 901 in the shadowed region 521 formed adjacent to the auxiliary electrode 503 is substantially inhibited. In the illustrated embodiment, the shadowed region 521 is arranged in a portion of the device 1110 between the auxiliary electrode 503 and the PDL 401. For example, the auxiliary electrode 503 and the PDL 401 may be laterally spaced apart from one another, and the shadowed region 521 may be arranged on the surface 105 of the substrate 100 between the base portion 521 of the auxiliary electrode 503 and an edge 421 of the PDL 401. The conductive coating 1010 is selectively deposited in the shadowed region 521 according to the process described above to electrically contact the auxiliary electrode 503 and the second electrode 801.

FIG. 19A to 19J illustrate the cross-sectional side view of a portion of the device including the auxiliary electrode 503 and the conductive coating 1010 according to various embodiments.

Figure 19A:
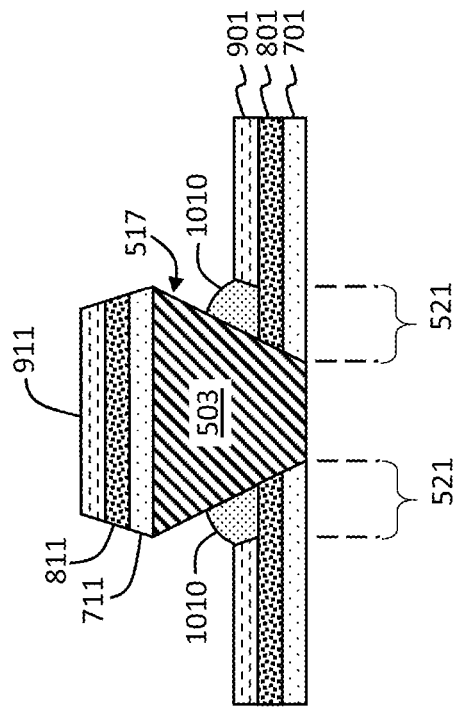
FIGS. 19A-19J are schematic cross-sectional views of an auxiliary electrode and adjacent portions according to various embodiments.

In FIG. 19A, an embodiment is illustrated wherein the semiconducting layer 701 extends laterally into the shadowed region 521, while the shadowed region 521 is substantially free of, or exposed from, the second electrode 801 and the nucleation inhibiting coating 901. In the illustrated embodiment, the conductive coating 1010 is deposited over the semiconducting layer 701 in the shadowed region 521. For example, the conductive coating 1010 may be deposited directly on and in contact with the semiconducting layer 701 and/or the sidewall 517 of the auxiliary electrode 503. The conductive coating 1010 is also in contact with the second electrode 801 to electrically connect the auxiliary electrode 503 to the second electrode 801. The residual semiconductor layer 711, the residual second electrode 811, and the residual nucleation inhibiting coating 911 are deposited in sequence on top of the auxiliary electrode 503.

Figure 19B:
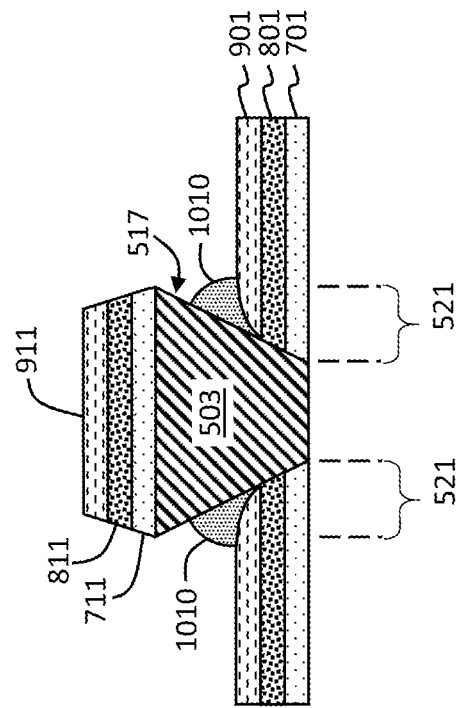

In FIG. 19B, an embodiment is illustrated wherein the semiconducting layer 701 and the second electrode 801 both extend laterally into the shadowed region 521, while the shadowed region 521 is substantially free of, or exposed from, the nucleation inhibiting coating 901. In the illustrated embodiment, the conductive coating 1010 is deposited over the second electrode 801 in the shadowed region 521. For example, the conductive coating 1010 may be deposited directly on and in contact with the second electrode 801 and/or the sidewall 517 of the auxiliary electrode 503. In this way, the conductive coating 1010 electrically connects the auxiliary electrode 503 to the second electrode 801.

Figure 19C:
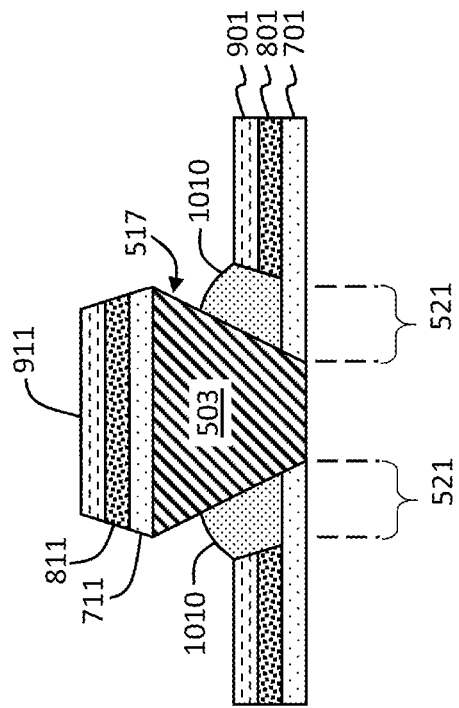

In FIG. 19C, an embodiment is illustrated wherein the semiconducting layer 701 and the second electrode 801 both extend laterally into the shadowed region 521, while the shadowed region 521 is substantially free of, or exposed from, the nucleation inhibiting coating 901. In the illustrated embodiment, the conductive coating 1010 is deposited over the second electrode 801 and laterally extending away from the auxiliary electrode 503 to overlap with a portion the nucleation inhibiting coating 901. For example, the conductive coating 1010 may include a portion overlapping with the nucleation inhibiting coating 901 due to lateral growth of the conductive coating 1010. In some embodiments, the conductive coating 1010 laterally extends beyond the shadowed region 521. In some further embodiments, the conductive coating 1010 is disposed in the non-emissive region of the device, and the emissive region of the device is substantially free of, or exposed from, the conductive coating 1010.

Figure 19D:
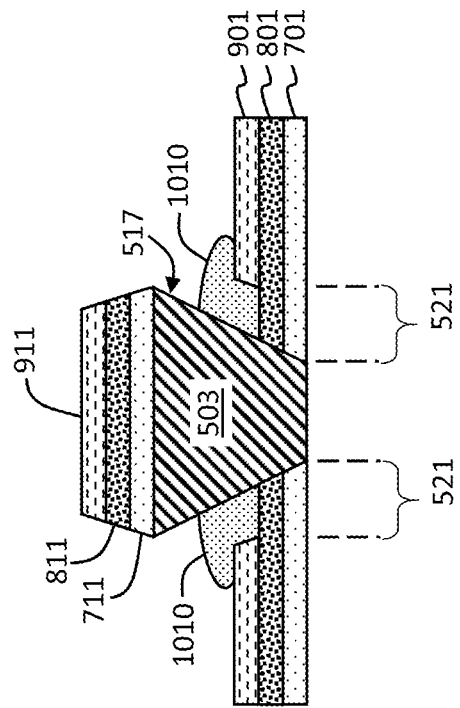
Figure 19E:
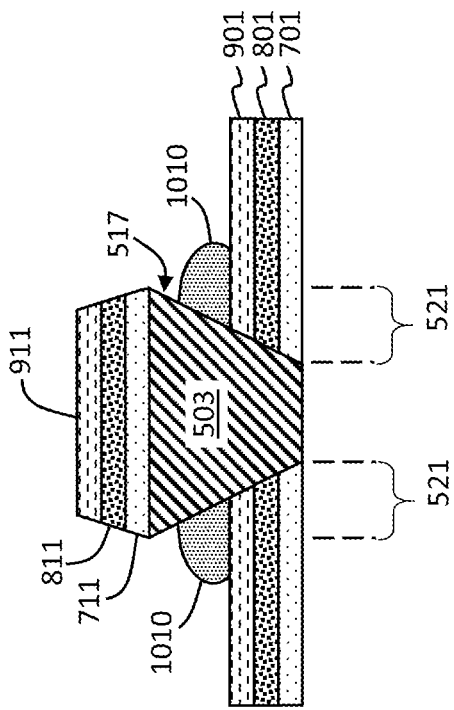
Figure 19F:
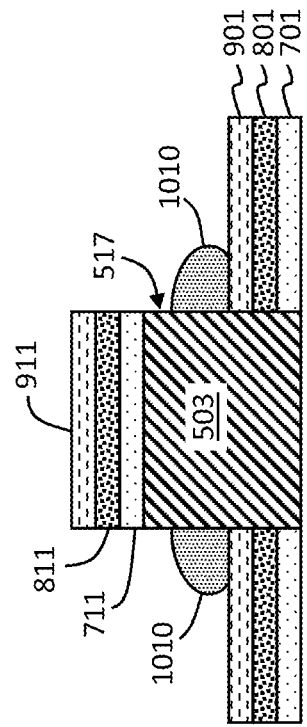

In FIG. 19D, an embodiment is illustrated wherein the semiconducting layer 701, the second electrode 801, and the nucleation inhibiting coating 901 all extend laterally into the shadowed region 521. For example, the thickness of the nucleation inhibiting coating 901 may be tapered such that the thickness of the nucleation inhibiting coating 901 in the shadowed region 521 is less than the thickness of the nucleation inhibiting coating 901 outside the shadowed region 521. Similarly, in some examples, the thicknesses of the semiconducting layer 701 and the second electrode 801 in the shadowed region 521 may be tapered such that they are less than their respective thicknesses outside the shadowed region 521. In the illustrated embodiment, the conductive coating 1010 may be deposited on the sidewall 517 of the auxiliary electrode 503 and be in contact with the nucleation inhibiting coating 901. FIG. 19E illustrates an embodiment wherein the thickness of the nucleation inhibiting coating 901 is substantially uniform. FIG. 19F illustrates an embodiment wherein the conductive coating 1010 laterally extends away from the auxiliary electrode 503 to cover a portion of the device outside the shadowed region 521. In the embodiments of FIGS. 19D, 19E and 19F, the thickness of the nucleation inhibiting coating 901 may be sufficiently thin to allow electrical contact to be established between the conductive coating 1010 and the second electrode 801 underlying the nucleation inhibiting coating 901. For example, the thickness of the nucleation inhibiting coating 901 may be less than or equal to about 15 nm, less than or equal to about 10 nm, less than or equal to about 8 nm, or less than or equal to about 5 nm.

Figure 19G:
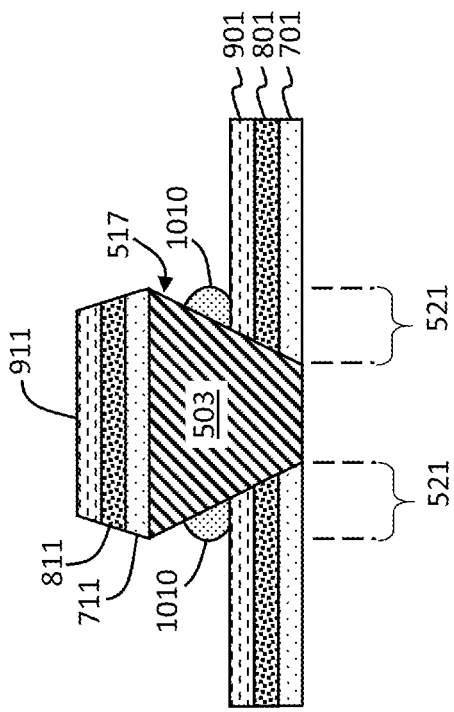

In FIG. 19G, an embodiment is illustrated wherein the semiconducting layer 701 is disposed in the shadowed region 521 and the sidewall 517 of the auxiliary electrode 503. For example, the semiconducting layer 701 may be disposed continuously to cover the shadowed region 521, the sidewall 517, and the upper surface of the auxiliary electrode 503. In another example, the semiconducting layer 701 may be formed as discrete, non-continuous coatings on such surfaces. In some embodiments, the thickness of the semiconducting layer 701 disposed on the sidewall 517 is less than the thickness of the semiconducting layer 701 disposed in other portions of the device, for example in the region outside the shadowed region 521. The second electrode 801 and the nucleation inhibiting coating 901 are illustrated as being deposited on the semiconducting layer 701 in the region outside the shadowed region 521. However in some embodiments, the second electrode 801 and/or the nucleation inhibiting coating 901 may extend laterally towards the auxiliary electrode 503 to coat the shadowed region 521. The conductive coating 1010 is deposited in the shadowed region 521 over the semiconducting layer 701. For example, the conductive coating 1010 may be in direct physical contact with the portions of the semiconducting layer 701 disposed in the shadowed region 521 and the sidewall 517. In such embodiment, for example, the portion of the semiconducting layer 701 disposed on the sidewall 517 may be sufficiently thin to allow electrical connection to be established between the auxiliary electrode 503 and the conductive coating 1010.

Figure 19H:
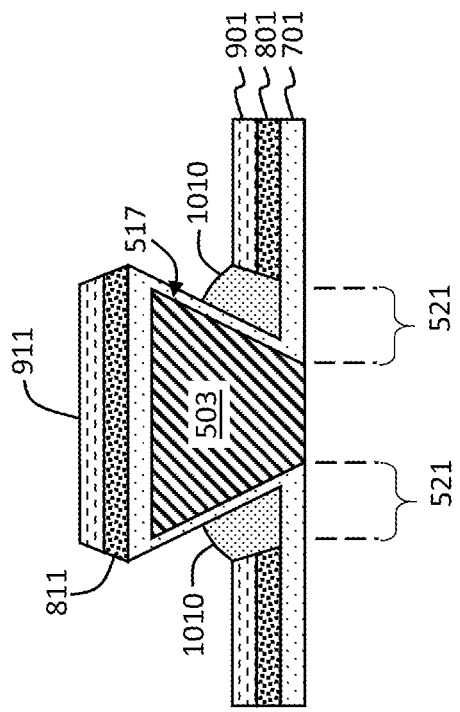

In FIG. 19H, an embodiment is illustrated wherein the auxiliary electrode 503 defines a step edge. In the illustrated embodiment, the sidewall 517 of the auxiliary electrode 503 is substantially vertical. Accordingly, in such embodiment, a shadowed region is not formed by the presence of the auxiliary electrode 503. In some embodiments, the sidewall 517 of the auxiliary electrode is substantially free of, or exposed from, the nucleation inhibiting coating 901 such that the conductive coating 1010 is deposited thereon. The conductive coating 1010 may then be formed such that the conductive coating 1010 laterally extends away from the auxiliary electrode 503 to overlap the second electrode 801. While the nucleation inhibiting coating 901 is illustrated as being arranged between the conductive coating 1010 and the second electrode 801, the nucleation inhibiting coating 901 may nevertheless be configured to allow electrical connection to be established between the conductive coating 1010 and the second electrode 801.

Figure 19J:
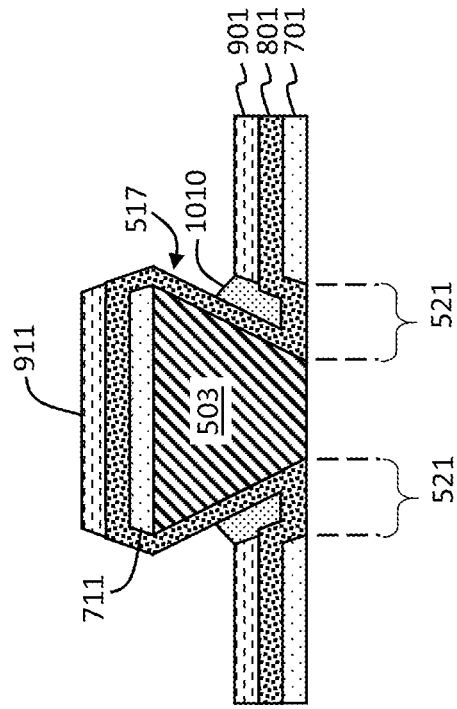
Figure 19I:
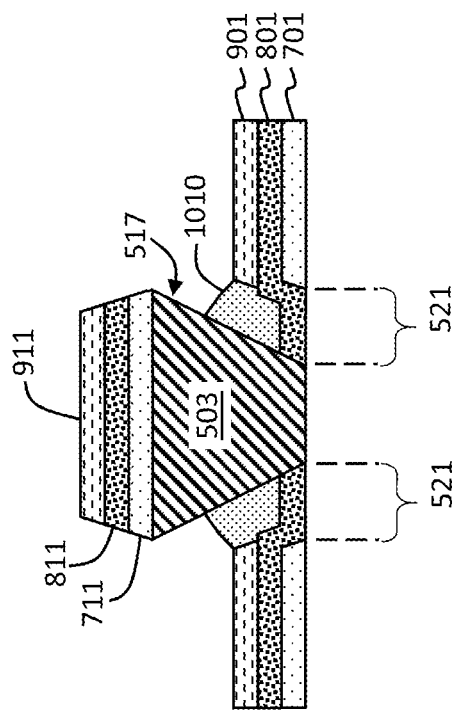

In FIG. 19I, an embodiment is illustrated wherein the shadowed region 521 is substantially free of, or is exposed from, the semiconducting layer 521 and the nucleation inhibiting coating 901. The second electrode 801 extends laterally to cover at least a portion of the shadowed region 521. In such embodiment, the conductive coating 1010 is disposed on top of the second electrode 801 in the shadowed region 521 such that it is in direct physical and electrical contact with both the auxiliary electrode 503 and the second electrode 801.

In FIG. 19J, an embodiment is illustrated wherein the second electrode 801 is configured to cover the shadowed region 521 and at least a portion of the auxiliary electrode 503. In the illustrated embodiment, the second electrode 801 substantially covers the side wall 517 of the auxiliary electrode 503 and the residual semiconducting layer 711 disposed on the top surface of the auxiliary electrode 503. In such arrangement, for example, the second electrode 801 is provided as a continuous or single monolithic structure and accordingly the residual second electrode may not be present. The conductive coating 1010 is disposed over the second electrode 801 in the shadowed region 521.

FIGS. 20A to 20I illustrate the auxiliary electrode 503 according to various embodiments wherein the auxiliary electrode 503 comprises a lower portion 531 and an upper portion 533.

Figure 20A:
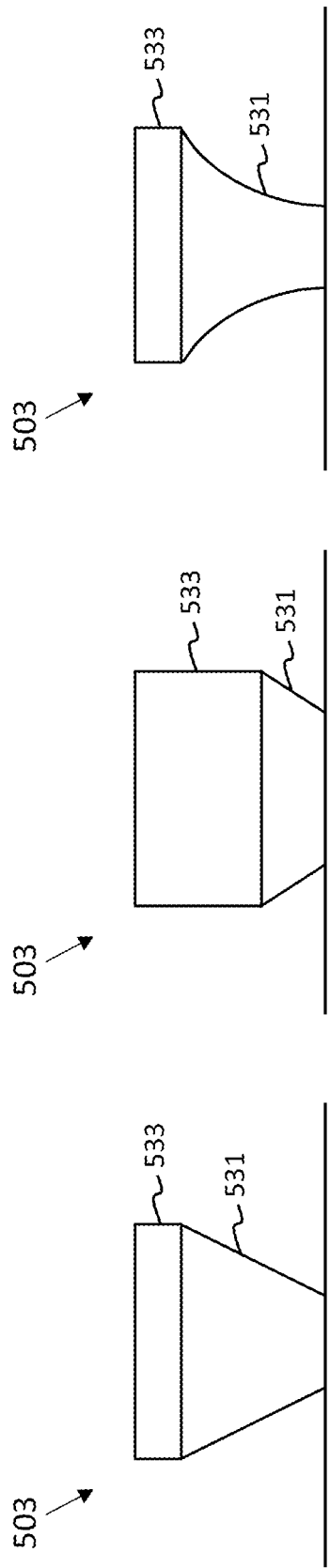
FIGS. 20A-20I are schematic cross-sectional view of an auxiliary electrode according to various embodiments.
Figure 20B:
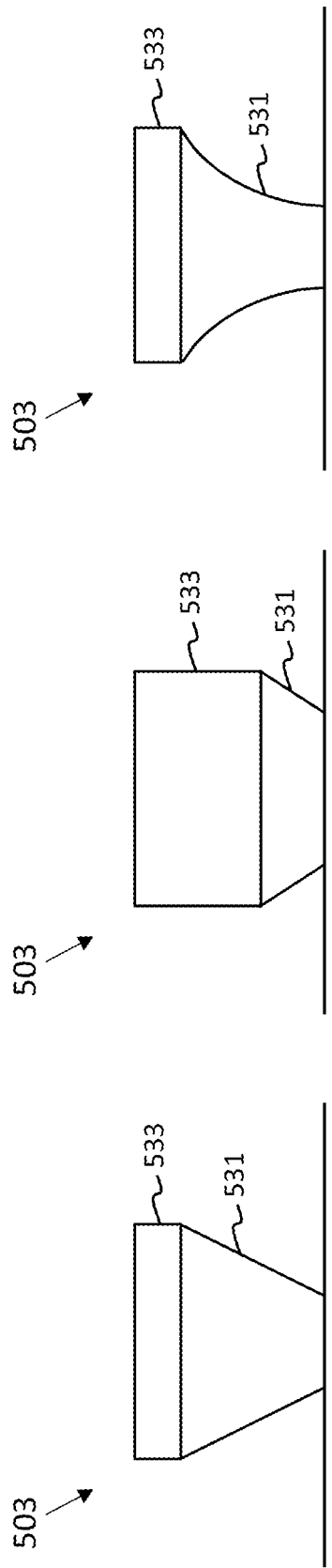

In FIGS. 20A and 20B, the lower portion 531 includes a tapered profile such that the base of the lower portion 531 is narrower in width. The lower portion 531 defines a linearly tapered sidewall, and the upper portion 533 is illustrated as having a substantially vertical sidewall. The lower portion 531 and the upper portion 533 together define the auxiliary electrode 503 defining an overhang for providing a shadowed region. In the embodiment illustrated in FIG. 20A, the thickness of the lower portion 531 is greater than the thickness of the upper portion 533. In another embodiment according to FIG. 20B, the thickness of the upper portion 533 is greater than the thickness of the lower portion 531. In yet another embodiment, the thickness of the upper portion 533 and the lower portion 531 are substantially the same.

Figure 20C:
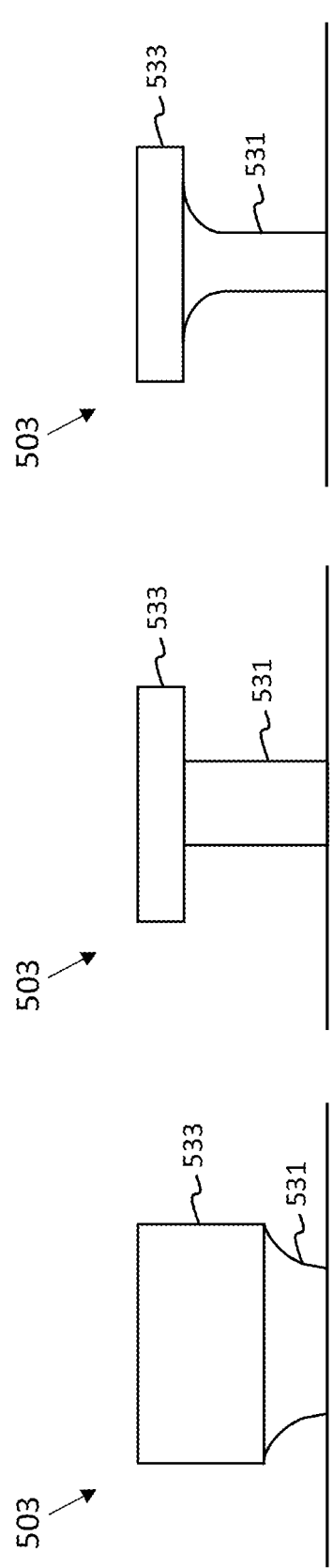
Figure 20D:
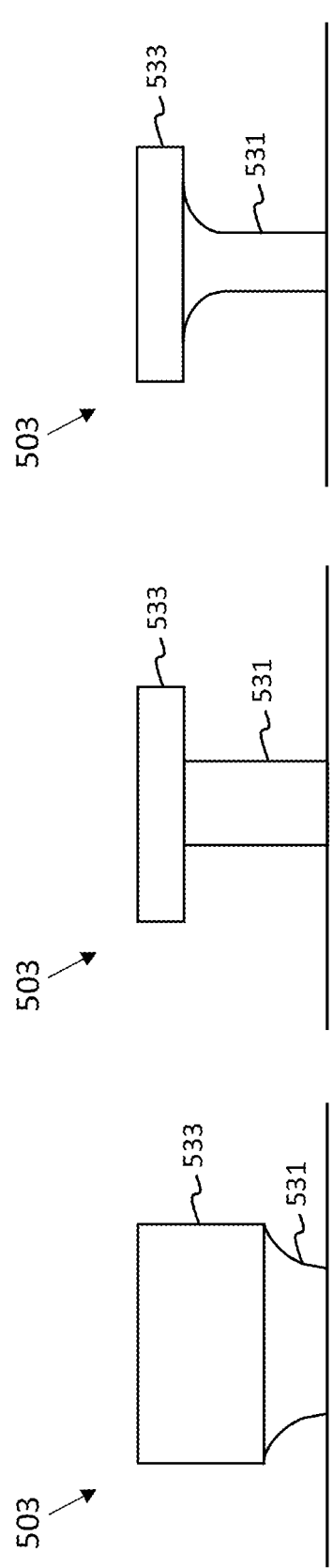

In FIGS. 20C and 20D, the lower portion 531 includes a tapered profile defined by a concave sidewall. The upper portion 533 is illustrated as having a substantially vertical sidewall. The lower portion 531 and the upper portion 533 together define the auxiliary electrode 503 defining an overhang for providing a shadowed region. In the embodiment illustrated in FIG. 20C, the thickness of the lower portion 531 is greater than the thickness of the upper portion 533. In another embodiment according to FIG. 20D, the thickness of the upper portion 533 is greater than the thickness of the lower portion 531. In yet another embodiment, the thickness of the upper portion 533 and the lower portion 531 are substantially the same.

Figure 20E:
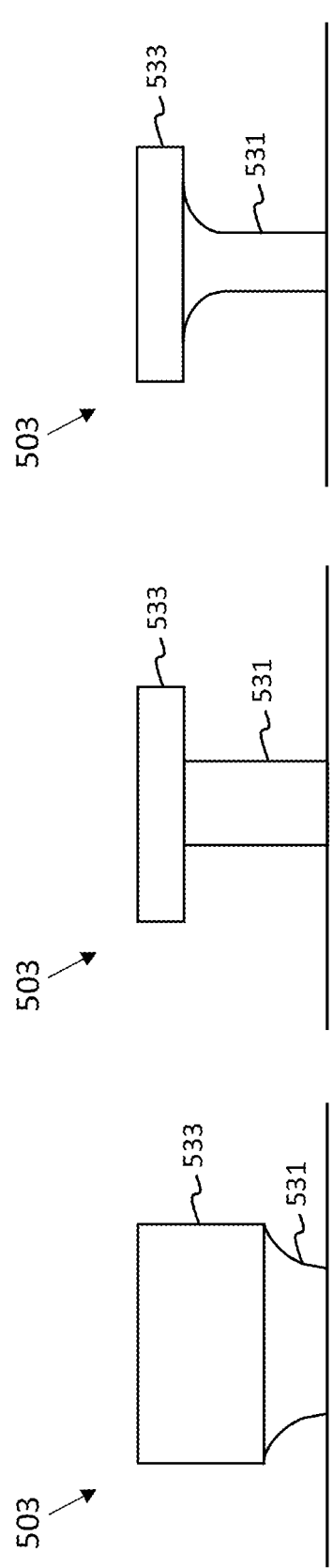

In FIG. 20E, the lower portion 531 and the upper portion 533 both include substantially vertical sidewalls. The width of the lower portion 531 is illustrated as being narrower than the width of the upper portion 533 such that the lower portion 531 and the upper portion 533 together define an auxiliary electrode 503 defining an overhang.

Figure 20F:
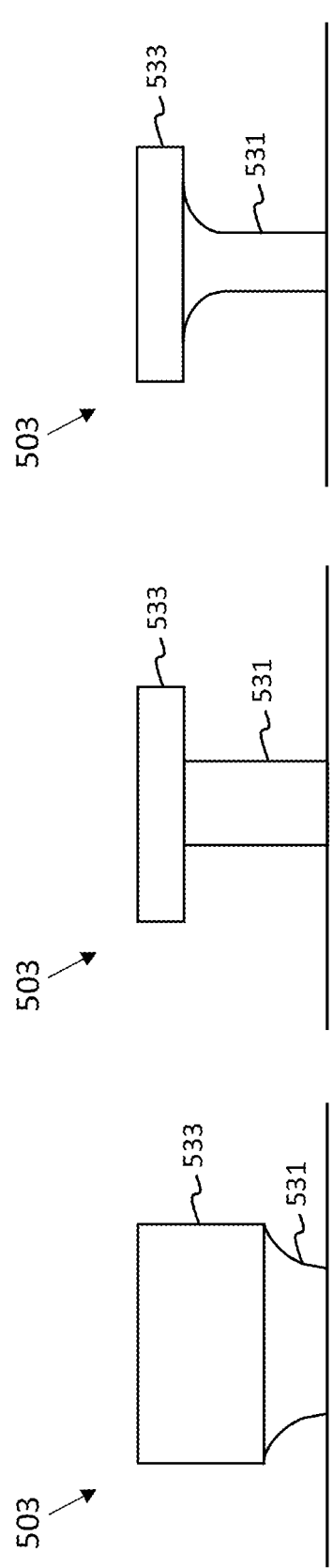

In FIG. 20F, the lower portion 531 includes a portion having curved sidewalls and a portion having substantially vertical sidewalls. The upper portion 533 having a greater width than the lower portion 531 is arranged on top of the lower portion 531. In this way, the auxiliary electrode 503 defining an overhanging profile is formed.

Figure 20I:
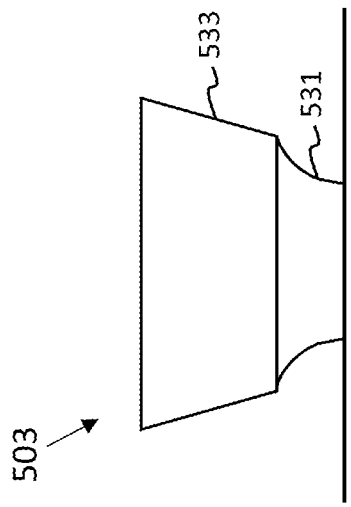
Figure 20H:
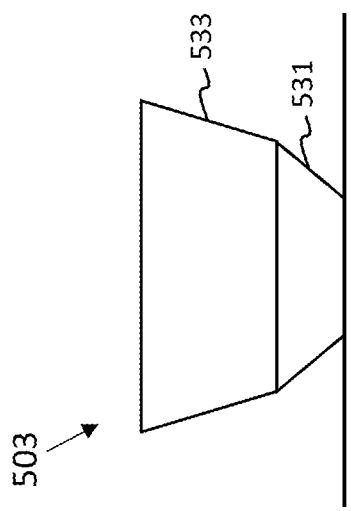
Figure 20G:
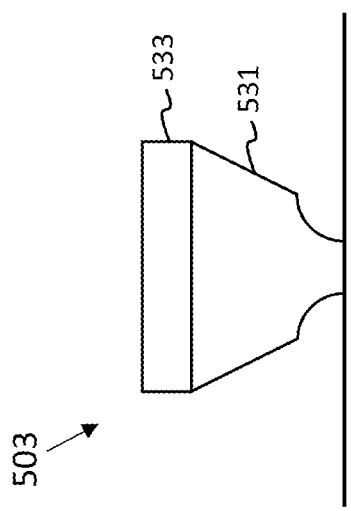

In FIG. 20G, an embodiment is illustrated wherein the lower portion 531 includes a tapered portion and a concave portion. In this way, a recess is formed by the auxiliary electrode 503 to provide the shadowed region.

In FIG. 20H, both the upper portion 533 and the lower portion 531 define a linearly tapered profile. For example, the slope of the lower portion 531 may be steeper than the slope of the upper portion 533 such that the base of the auxiliary electrode 503 is narrower than the top.

In FIG. 20I, the upper portion 533 defines a linearly tapered profile, while the lower portion 531 defines a concave profile.

In some embodiments, the lower portion 531 and the upper portion 533 include different materials. For example, the lower portion 531 may include a first material and the upper portion 533 may include a second material. Examples of the first material and the second material include, but are not limited to, metals, alloys, metal alloys, oxides (including conductive oxides), and combinations thereof. Examples of such materials include, but are not limited to, ITO, ZnO, IZO, Ag, Cu, Mo, Al, Ti, and combinations thereof including examples such as Mo/Al/Mo and Ag/ITO. In some examples, the auxiliary electrode 503 may include additional portions and/or materials. In some embodiments, the auxiliary electrode 503 is formed using electrically conductive material(s). In some embodiments, the auxiliary electrode 503 includes dielectric material, semiconducting material, and/or insulating material. For example, the lower portion 531 may include an electrically conductive material such as metals, alloys, metal alloys, and conductive oxides, and the upper portion 533 may include dielectric material, semiconducting material, and/or insulating material.

In some embodiments, the material for forming the lower portion 531 may have a different etching rate than the material for forming the upper portion 533. For example, when the lower portion 531 and the upper portion 533 are subjected to an etching process, the etching rate of the lower portion 531 may be greater than the etching rate of the upper portion 533. In this way, the auxiliary electrode 503 defining an overhanging profile may be formed.

In some embodiments, the lower portion 531 and the upper portion 533 are formed integrally or continuous with each other to provide a single monolithic structure. In such embodiments, for example, the lower portion 531 and the upper portion 533 may be formed using the same material.

In various embodiments above, the auxiliary electrode 503 has been illustrated as having a substantially symmetric profile. In other embodiments, the auxiliary electrode 503 may have a non-symmetric profile. For example, the auxiliary electrode 503 may define an overhanging profile along one sidewall and not along other sidewalls.

While the semiconducting layer 701 has been illustrated as being disposed in both the emissive area 1201 and the non-emissive area 1204 in some embodiments, it will be appreciated that the semiconducting layer 701 may be selectively deposited in the emissive area 1201 in other embodiments.

In some embodiments, it may be particularly desirable to deposit the residual nucleation inhibiting coating 911 over an upper surface of the auxiliary electrode 911, such that the deposition of the conductive coating 1010 on top of the auxiliary electrode 911 is substantially inhibited. For example, in some cases where the conductive coating material is deposited on top of the auxiliary electrode 911, such coating may grow laterally to past the edge of the top portion 513 of the auxiliary electrode 911, thus inhibiting deposition of the conductive coating material in the shadowed region 521 and/or the sidewall 517. Accordingly, in some embodiments, the upper surface of the auxiliary electrode 911 is substantially free of, or exposed from, the conductive coating.

In some embodiments, the thickness or height of the auxiliary electrode 503 is greater than the thickness of the semiconducting layer 701. For example, the thickness of the auxiliary electrode 503 may be equal to or greater than about 200 nm, equal to or greater than about 250 nm, equal to or greater than about 300 nm, equal to or greater than about 350 nm, equal to or greater than about 500 nm, equal to or greater than about 600 nm, equal to or greater than about 750 nm, equal to or greater than about 800 nm, or equal to or greater than about 1 μm. For example, the thickness of the auxiliary electrode 503 may be equal to or greater than about 1.1 times, equal to or greater than about 1.3 times, equal to or greater than about 1.5 times, equal to or greater than about 1.6 times, equal to or greater than about 2 times, equal to or greater than about 3 times, equal to or greater than about 5 times, or equal to or greater than about 10 times the thickness of the semiconducting layer 701. By providing an auxiliary electrode 503 having a thickness greater than that of the semiconducting layer 701, the likelihood of the sidewall 517 of the auxiliary electrode 503 being substantially free of, or exposed from, the nucleation inhibiting coating 901 is enhanced.

Figure 21:
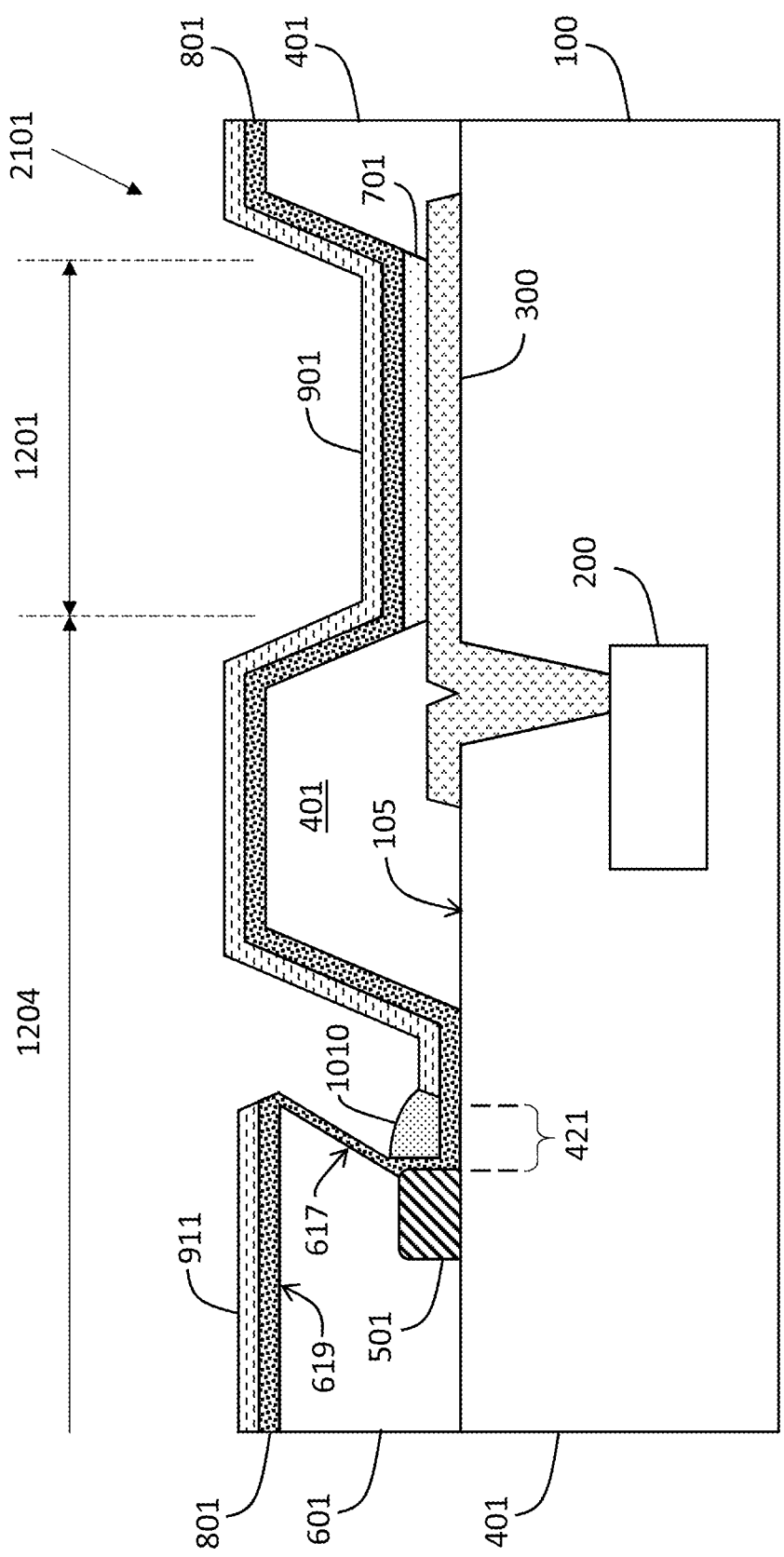
FIG. 21 is a schematic cross-sectional view of an opto-electronic device according to an embodiment wherein a second electrode covers a shadowed region.

In some embodiments, the second electrode or a portion thereof is provided in the shadowed region. Referring now to FIG. 21, an embodiment is shown wherein the second electrode 801 is disposed in the shadowed region 421 provided in the non-emissive region 1204 of the device 2101. In the illustrated embodiment, the second electrode 801 is formed as an integral or continuous structure across the emissive region 1201 and the non-emissive region 1204. For example, the second electrode 801 may also be disposed on the surface 617 of the laterally extending portion of the patterning structure 601 for providing the shadowed region 421, as well as on the top surface 619 of the patterning structure 601. In this way, for example, the second electrode 801 may substantially cover the patterning structure 601. Upon deposition of the nucleation inhibiting coating 901 followed by the conductive coating 1010, the conductive coating 1010 is deposited on top of, and in electrical contact with, the second electrode 801. In some embodiments, the thickness of the second electrode 801 in the emissive region 1201 is greater than the thickness of the second electrode 801 in the shadowed region 421. For example, during deposition of the second electrode 801, at least a portion of the evaporated flux for forming the second electrode 801 may be inhibited from becoming incident upon the portion of the surface 105 corresponding to the shadowed region 421 due to the presence of the patterning structure 601. In other examples, the second electrode 801 may include a lower portion and an upper portion, and a single one of the lower portion and the upper portion of the second electrode 801 may be deposited in the shadowed region 421 while both portions are deposited in the emissive region 1201, thus creating a difference in the thickness of the second electrode 801. As illustrated in the embodiment of FIG. 21, at least a portion of the auxiliary electrode 501 may be covered by the second electrode 801, and thus the auxiliary electrode 501 and the second electrode 801 may be in electrical contact with each other. However, it may be desirable in some cases to provide the conductive coating 1010 in the shadowed region 421, for example to decrease the contact resistance between the auxiliary electrode 501 and the conductive coating 1010. For example, providing the conductive coating 1010 in such configuration may also increase the reliability of the electrical contact in some cases. For example, the second electrode 801 in the embodiment of FIG. 21 may include a transparent conductive oxide. Examples of such transparent conductive oxide include, but are not limited to, the following: ITO, IZO, and ZnO.

Figure 22:
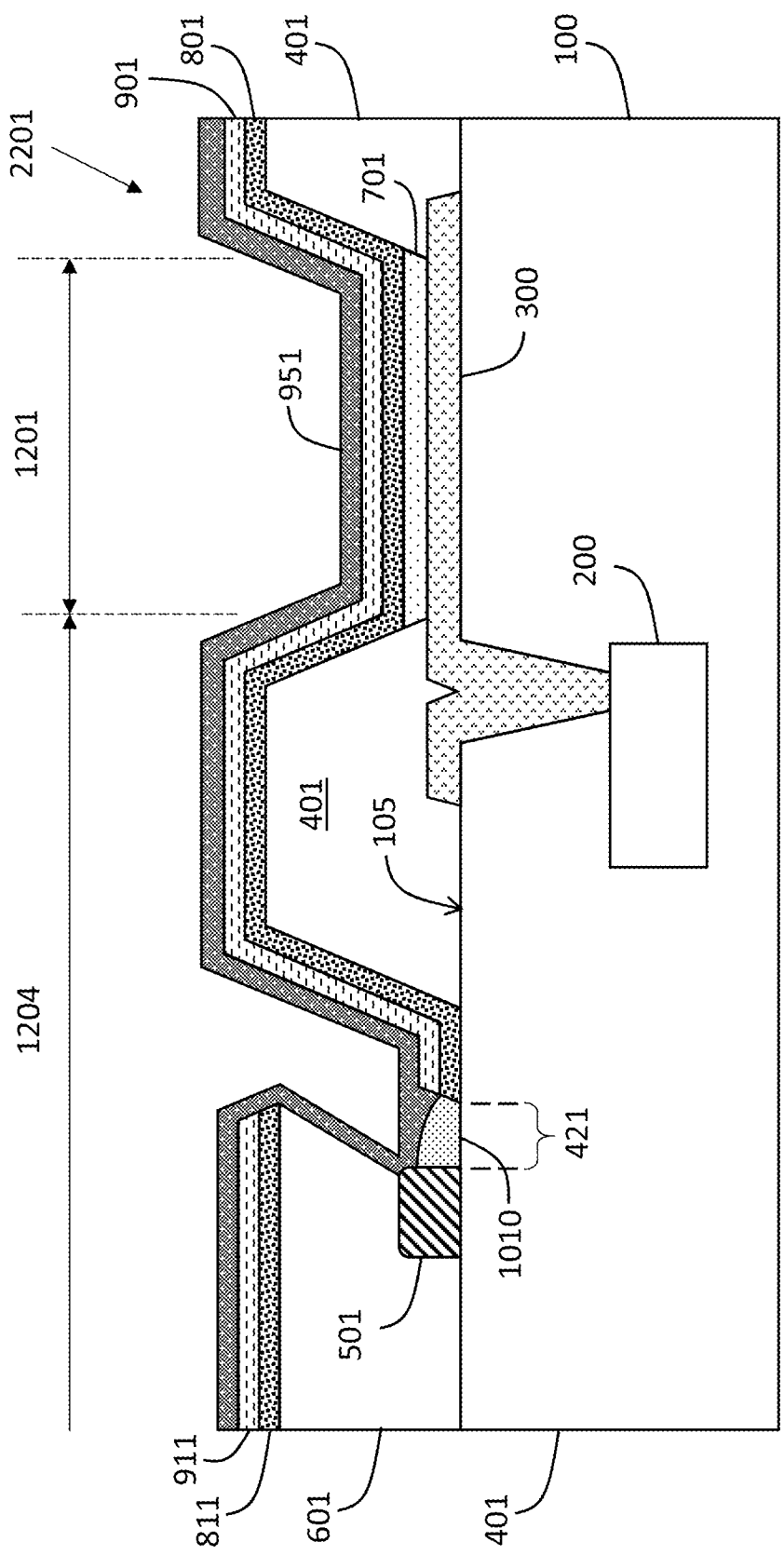
FIG. 22 is a schematic cross-sectional view of an opto-electronic device according to an embodiment wherein a transparent conductive coating is provided in an emissive region and a non-emissive region of the device.

FIG. 22 illustrates an embodiment of the device 2201 wherein a transparent conductive coating 951 is provided in the emissive region 1201 and the non-emissive region 1204 of the device 2201. For example, the device 2201 may be fabricated substantially identically to the device 1101 in the embodiment of FIG. 7, up to the step of depositing the conductive coating 1010. Referring again to FIG. 22, after depositing the conductive coating 1010, the transparent conductive coating 951 is deposited using an open mask or without a mask. For example, the transparent conductive coating 951 may be deposited using a physical vapor deposition process such as sputtering, which may cause at least a portion of the evaporated flux of the material used to form the transparent conductive coating 951 to become incident upon the shadowed region 421 and the surfaces of the patterning structure 601. Accordingly, in the embodiment illustrated in FIG. 22, the transparent conductive coating 951 is provided as a continuous or single monolithic structure coating the emissive region 1201 and the non-emissive region 1204 of the device 2201. For example, the transparent conductive coating 951 may be in direct physical and electrical contact with the auxiliary electrode 501 and the conductive coating 1010. In some embodiments, the transparent conductive coating 951 may also be in direct physical and electrical contact with a portion of the second electrode 801. In the emissive region 1201, the transparent conductive coating 951 is disposed over the nucleation inhibiting coating 901. In such embodiments, it will be appreciated that the material for forming the transparent conductive coating 951 is different from the material for forming the conductive coating 1010, such that deposition of the transparent conductive coating 951 over the nucleation inhibiting coating 901 is not substantially inhibited. For example, the transparent conductive coating 951 may include a transparent conductive oxide. Examples of such transparent conductive oxide include, but are not limited to, the following: ITO, IZO, and ZnO. It may be particularly advantageous to provide such transparent conductive coating 951 for enhancing the reliability of electrical contact, planarizing the surface of the device 2201 to facilitate encapsulation, and/or optical outcoupling.

While embodiments illustrating the presence of the second electrode 801 in the shadowed region 421 and the presence of the transparent conductive coating 951 have been described in relation to embodiments of the devices 2101 and 2201, respectively, it will be understood that such features may similarly be applied to other embodiments of devices described herein.

In some embodiments, the device is configured such that it is substantially free of, or omits the presence of, a conductive oxide material in an optical path of the light emitted by the device. For example, in the emissive region 1201, the presence of a conductive oxide material may be omitted from all of the layers and coatings above the semiconducting layer 701. For example, a conductive oxide material may be omitted from the second electrode 801, the nucleation inhibiting coating 901, and any additional layers or coatings which may be deposited above. In some cases, it may be desirable to omit the presence of the conductive oxide material to reduce any absorption and/or reflection of light emitted by the device. For example, conductive oxide materials such as ITO and IZO, particularly when deposited in sufficient thickness, can absorb light in the blue region of the visible spectrum. This generally reduces the efficiency and performance of the device and is undesirable.

In some embodiments, the optoelectronic device further includes a capping layer or an outcoupling layer. For example, the capping layer or outcoupling layer may be provided directly onto the surface of the second electrode 801 or on the surface of the nucleation inhibiting coating 901. In particular, such capping layer or outcoupling layer may be provided in the emissive region(s). In some embodiments, the nucleation inhibiting coating 901 may act as, or form part of, the capping layer or outcoupling layer.

In some embodiments, the optoelectronic device further includes an encapsulation layer. Examples of such encapsulation layer include, but are not limited to, a glass cap, a barrier film, a barrier adhesive, and thin film encapsulation. For example, the encapsulation layer may be arranged above the second electrode 801 and the nucleation inhibiting coating 901. In some embodiments, the optoelectronic device further includes additional optical and/or structural layers, coatings, and components. Examples include, but are not limited to, the following: polarizer, color filter, anti-reflection coating, anti-glare coating, cover glass, and optically-clear adhesive (OCA).

In some embodiments, the auxiliary electrode 501, 503, the conductive coating 1010, and the patterning structure 601 may be selectively provided in certain region(s) of a display panel. For example, any of the foregoing features may be provided at or near one or more edges of the display panel for electrically connecting one or more elements of the front plane (e.g., second electrode) to one or more elements of the back plane. In some embodiments, the auxiliary electrode 501, 503, the conductive coating 1010, and the patterning structure 601 may be omitted from certain region(s) of a display panel. For example, such features may be omitted from parts of the display panel, except at or near one or more edges of the panel in cases where relatively high pixel density is desired. In such cases, it may still be desirable to provide any of the foregoing features along one or more edges of the display panel, for example, to supply and distribute electrical current to the cathode from an auxiliary electrode located at the one or more edges. For example, such implementation may be particularly desirable for reducing the bezel of the display panel.

In some embodiments, the sheet resistance of the conductive coating is equal to or less than the sheet resistance of the second electrode.

As used herein, the term "overlap" or "overlapping" would be understood to refer to two or more layers and/or structures arranged to intersect a line drawn perpendicular to the underlying surface onto which the two or more layers and/or structures are disposed on.

In some embodiments, the residual second electrode and the residual nucleation inhibiting coating are removed and/or not deposited and as such the surface of the patterning structure is left exposed.

Without wishing to be limited to a particular theory, it is postulated that providing a nucleation promoting coating 1022 may facilitate the deposition of the conductive coating 1010 onto certain surfaces. In some embodiments, the nucleation promoting coating includes fullerenes. In some embodiments, the nucleation promoting coating includes metals. As used herein, the term "fullerene" refers to a material including carbon molecules. Examples of fullerene molecules include carbon cage molecules including a three-dimensional skeleton that includes multiple carbon atoms, which form a closed shell, and which can be spherical or semi-spherical in shape. A fullerene molecule can be designated as $C_n$, where n is an integer corresponding to a number of carbon atoms included in a carbon skeleton of the fullerene molecule. Examples of fullerene molecules include $C_n$, where n is in the range of 50 to 250, such as $C_{60}$, $C_{70}$, $C_{72}$, $C_{74}$, $C_{76}$, $C_{78}$, $C_{80}$, $C_{82}$, and $C_{84}$. Additional examples of fullerene molecules include carbon molecules in a tube or cylindrical shape, such as single-walled carbon nanotubes and multi-walled carbon nanotubes.

Suitable materials for use to form a nucleation inhibiting coating include those exhibiting or characterized as having an initial sticking probability for a material of a conductive coating of no greater than or less than about 0.3 (or 30%), or no greater than or less than about 0.2, or no greater than or less than about 0.1, or no greater than or less than about 0.05, and, more particularly, no greater than or less than about 0.03, no greater than or less than about 0.02, no greater than or less than about 0.01, no greater than or less than about 0.08, no greater than or less than about 0.005, no greater than or less than about 0.003, no greater than or less than about 0.001, no greater than or less than about 0.0008, no greater than or less than about 0.0005, or no greater than or less than about 0.0001.

In some embodiments, suitable materials for use to form the nucleation inhibiting coating include those exhibiting or characterized as having an initial sticking probability for a material of a conductive coating of between about 0.03 and about 0.0001, between about 0.03 and about 0.0003, between about 0.03 and about 0.0005, between about 0.03 and about 0.0008, between about 0.03 and about 0.001, between about 0.03 and about 0.005, between about 0.03 and about 0.008, or between about 0.03 and about 0.01. In some embodiments, suitable materials for use to form the nucleation inhibiting coating include those exhibiting or characterized as having an initial sticking probability for a material of a conductive coating of between about 0.02 and about 0.0001, between about 0.02 and about 0.0003, between about 0.02 and about 0.0005, between about 0.02 and about 0.0008, between about 0.02 and about 0.001, between about 0.02 and about 0.005, between about 0.02 and about 0.008, or between about 0.02 and about 0.01. In some embodiments, suitable materials for use to form the nucleation inhibiting coating include those exhibiting or characterized as having an initial sticking probability for a material of a conductive coating of between about 0.01 and about 0.0001, between about 0.01 and about 0.0003, between about 0.01 and about 0.0005, between about 0.01 and about 0.0008, between about 0.01 and about 0.001, between about 0.01 and about 0.005, or between about 0.01 and about 0.008. In some embodiments, suitable materials for use to form the nucleation inhibiting coating include those exhibiting or characterized as having an initial sticking probability for a material of a conductive coating of between about 0.008 and about 0.0001, between about 0.008 and about 0.0003, between about 0.008 and about 0.0005, between about 0.008 and about 0.0008, between about 0.008 and about 0.001, or between about 0.008 and about 0.005. In some embodiments, suitable materials for use to form the nucleation inhibiting coating include those exhibiting or characterized as having an initial sticking probability for a material of a conductive coating of between about 0.005 and about 0.0001, between about 0.005 and about 0.0003, between about 0.005 and about 0.0005, between about 0.005 and about 0.0008, or between about 0.005 and about 0.001.

Suitable materials for use to form a nucleation promoting coating include those exhibiting or characterized as having an initial sticking probability for a material of a conductive coating of at least about 0.4 (or 40%), at least about 0.5 (or 50%), at least about 0.6 (or 60%), at least about 0.7, at least about 0.75, at least about 0.8, at least about 0.9, at least about 0.93, at least about 0.95, at least about 0.98, or at least about 0.99. Examples of suitable materials for forming the nucleation promoting coating include, but are not limited to, the following: metals (including alkali metals, alkaline earth metals, transition metals, post-transition metals), metal fluorides, metal oxides, fullerene, and mixtures of two or more of foregoing. Examples of such materials include, but are not limited to, the following: Ca, Ag, Mg, Yb, ITO, IZO, ZnO, ytterbium fluoride ($YbF_3$), magnesium fluoride ($MgF_2$), and cesium fluoride (CsF).

The substrate 100 onto which various coatings are deposited may include one or more additional organic and/or inorganic layers not specifically illustrated or described in the foregoing embodiments. The substrate 100 may further include one or more transistors and other electronic components such as resistors and capacitors, which are included in an active matrix or a passive matrix OLED device. For example, the substrate 100 may include one or more top-gate thin-film transistors (TFTs), one or more bottom-gate TFTs, and/or other TFT structures. A TFT may be an n-type TFT or a p-type TFT. Examples of TFT structures include those including amorphous silicon (a-Si), indium gallium zinc oxide (IGZO), and low-temperature polycrystalline silicon (LTPS).

The substrate 100 may also include a base substrate for supporting the above-identified additional organic and/or inorganic layers. For example, the base substrate may be a flexible or rigid substrate. The base substrate may include, for example, silicon, glass, metal, polymer (e.g., polyimide), sapphire, or other materials suitable for use as the base substrate.

In another embodiment where the device is an electroluminescent quantum dot device, an electroluminescent layer generally includes quantum dots, which emit light when current is supplied.

It will also be appreciated that an open mask used for deposition of any of various layers or coatings, including a conductive coating, a nucleation inhibiting coating, and a nucleation promoting coating, may "mask" or prevent deposition of a material on certain regions of a substrate. However, unlike a fine metal mask (FMM) used to form relatively small features with a feature size on the order of tens of microns or smaller, a feature size of an open mask is generally comparable to the size of an OLED device being manufactured. For example, the open mask may mask edges of a display device during manufacturing, which would result in the open mask having an aperture that approximately corresponds to a size of the display device (e.g., about 1 inch for micro-displays, about 4-6 inches for mobile displays, about 8-17 inches for laptop or tablet displays, and so forth). For example, the feature size of an open mask may be on the order of about 1 cm or greater. Accordingly, an aperture formed in an open mask is typically sized to encompass a plurality of emissive regions or pixels, which together form the display device.

While in some embodiments of a device, the first electrode 300 has been described as being an anode and the second electrode 801 as being a cathode, it will be appreciated that in other embodiments, the first electrode 300 may be a cathode and the second electrode 801 may be an anode.

In some embodiments, the nucleation inhibiting coating 901 may act as an optical coating. For example, the nucleation inhibiting coating 901 may modify the properties or characteristics of the light emitted from the emissive region 1201 of the device. In some embodiments, the nucleation inhibiting coating 901 may exhibit a degree of haze to cause light to scatter. For example, the nucleation inhibiting coating 901 may comprise a crystalline material for causing light transmitted through the nucleation inhibiting coating 901 to become scattered. Such scattering of light may be useful for enhancing the outcoupling of light from the device, for example. In some embodiments, the nucleation inhibiting coating 901 is initially deposited as a substantially non-crystalline (e.g. substantially amorphous) coating. After depositing the conductive coating 1010, the nucleation inhibiting coating 901 may become crystallized to act as an optical coating.

While the pixel definition layer 401 has been generally illustrated as having a linearly sloped surface to form the "banks" for defining the emissive area 1201, it will be appreciated that the shape, aspect ratio, thickness, width, and configuration of the pixel definition layer 401 may be different in other embodiments. For example, the pixel definition layer 401 may be formed with a steeper or more gradual sloped portions. In other examples, the pixel definition layer 401 may be configured to be a substantially vertically extending structure covering one or more edges of the first electrode 300. For example, the pixel definition layer 401 may be configured for depositing semiconducting layer via solution-processing techniques (e.g. by printing including ink-jet printing).

In various embodiments described herein, it will be understood that the use of an open mask may be omitted, if desired. Specifically, an open mask deposition process described herein may alternatively be conducted without the use of a mask, such that an entire target surface is exposed.

Unless context clearly indicates otherwise, it will be appreciated that features, components, and/or elements described in singular forms may also be provided in plural forms and vice versa. For example, while various embodiments of the device have been described as including an emissive region and a non-emissive region, it will be appreciated that such device may further include additional emissive regions and non-emissive regions. For example, the device may include a plurality of emissive regions. The plurality of emissive regions may further include emissive regions configured to emit light corresponding to red, blue, green, white, and/or any other color. The device may also include a plurality of thin film transistors and a plurality of first electrodes. In such embodiments, each of the plurality of first electrodes may be electrically connected to at least one of the plurality of thin film transistors.

At least some of the above embodiments have been described with reference to various layers or coatings, including a nucleation promoting coating, a nucleation inhibiting coating, and a conductive coating, being formed using an evaporation process. As will be understood, an evaporation process is a type of PVD process where one or more source materials are evaporated or sublimed under a low pressure (e.g., vacuum) environment and deposited on a target surface through de-sublimation of the one or more evaporated source materials. A variety of different evaporation sources may be used for heating a source material, and, as such, it will be appreciated that the source material may be heated in various ways. For example, the source material may be heated by an electric filament, electron beam, inductive heating, or by resistive heating. In addition, such layers or coatings may be deposited and/or patterned using other suitable processes, including photolithography, printing, OVPD, LITI patterning, and combinations thereof. These processes may also be used in combination with a shadow mask to achieve various patterns.

Although certain processes have been described with reference to evaporation for purposes of depositing a nucleation promoting material, a nucleation inhibiting material, and the second electrode, it will be appreciated that various other processes may be used to deposit these materials. For example, deposition may be conducted using other PVD processes (including sputtering), CVD processes (including plasma enhanced chemical vapor deposition (PECVD)), or other suitable processes for depositing such materials. In some embodiments, magnesium is deposited by heating a magnesium source material using a resistive heater. In other embodiments, a magnesium source material may be loaded in a heated crucible, a heated boat, a Knudsen cell (e.g., an effusion evaporator source), or any other type of evaporation source.

A deposition source material used to deposit a conductive coating may be a mixture or a compound, and, in some embodiments, at least one component of the mixture or compound is not deposited on a substrate during deposition (or is deposited in a relatively small amount compared to, for example, magnesium). In some embodiments, the source material may be a copper-magnesium (Cu—Mg) mixture or a Cu—Mg compound. In some embodiments, the source material for a magnesium deposition source includes magnesium and a material with a lower vapor pressure than magnesium, such as, for example, Cu. In other embodiments, the source material for a magnesium deposition source is substantially pure magnesium. Specifically, substantially pure magnesium can exhibit substantially similar properties (e.g., initial sticking probabilities on nucleation inhibiting and promoting coatings) compared to pure magnesium (99.99% and higher purity magnesium). For example, an initial sticking probability of substantially pure magnesium on a nucleation inhibiting coating can be within ±10% or within ±5% of an initial sticking probability of 99.99% purity magnesium on the nucleation inhibiting coating. Purity of magnesium may be about 95% or higher, about 98% or higher, about 99% or higher, or about 99.9% or higher. Deposition source materials used to deposit a conductive coating may include other metals in place of, or in combination with, magnesium. For example, a source material may include high vapor pressure materials, such as ytterbium (Yb), cadmium (Cd), zinc (Zn), or any combination thereof.

As used herein, the terms "substantially," "substantial," "approximately," and "about" are used to denote and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be substantially or about the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component, or "covering" or which "covers" another component, can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

Although the present disclosure has been described with reference to certain specific embodiments, various modifications thereof will be apparent to those skilled in the art. Any examples provided herein are included solely for the purpose of illustrating certain aspects of the disclosure and are not intended to limit the disclosure in any way. For example, various features described in relation to specific embodiments or examples herein may be combined with features of other embodiments or examples. Any drawings provided herein are solely for the purpose of illustrating certain aspects of the disclosure and may not be drawn to scale and do not limit the disclosure in any way. The scope of the claims appended hereto should not be limited by the specific embodiments set forth in the above description, but should be given their full scope consistent with the present disclosure as a whole. The disclosures of all documents recited herein are incorporated herein by reference in their entirety.

The invention claimed is:

1. An opto-electronic device having a plurality of layers, comprising:
   a nucleation-inhibiting coating (NIC) disposed in a first portion of a lateral aspect of the device;
   a feature comprising a laterally extending portion, the feature being disposed to provide a shadowed region in a second portion of the lateral aspect of the device, the shadowed region overlapping the laterally extending portion, and the shadowed region being substantially devoid of the NIC; and
   a conductive coating comprising a conductive coating material,
   wherein at least a part of the conductive coating is disposed in the shadowed region.

2. The opto-electronic device of claim 1, wherein the shadowed region is adapted to be masked during the deposition of the NIC to inhibit the deposition of the NIC thereon.

3. The opto-electronic device of claim 1, further comprising, in the first portion, an emissive region, comprising:
   a first electrode,
   a second electrode, and
   at least one semiconducting layer disposed between the first electrode and the second electrode,
   wherein the second electrode is disposed between the at least one semiconducting layer and the NIC, and the conductive coating is electrically coupled with the second electrode.

4. The opto-electronic device of claim 3, wherein at least a part of the NIC is disposed between the second electrode and the conductive coating.

5. The opto-electronic device of claim 3, further comprising a pixel definition layer (PDL) covering an edge of the first electrode, wherein the PDL defines an opening through which the first electrode is exposed, and which corresponds to the emissive region of the device.

6. The opto-electronic device of claim 5, further comprising a third electrode is spaced apart from the second electrode.

7. The opto-electronic device of claim 6, wherein the third electrode is electrically coupled with the second electrode via the conductive coating.

8. The opto-electronic device of claim 7, wherein the feature is a patterning structure.

9. The opto-electronic device of claim 8, wherein the patterning structure comprises a base portion and a top portion, and the top portion extends laterally outward from the base portion, thereby shadowing the shadowed region.

10. The opto-electronic device of claim 9, wherein a sidewall extends between the base portion and the top portion, and the sidewall is at least one of: substantially linear, tapered, and curved.

11. The opto-electronic device of claim 8, wherein at least a part of the third electrode is disposed in the shadowed region.

12. The opto-electronic device of claim 8, wherein the third electrode is disposed beneath the patterning structure.

13. The opto-electronic device of claim 8, wherein the third electrode is integrally formed with the conductive coating.

14. The opto-electronic device of claim 8, wherein the patterning structure is disposed on a surface of the PDL.

15. The opto-electronic device of claim 14, wherein the third electrode is disposed on the surface of the PDL.

16. The opto-electronic device of claim 7, wherein the feature is the third electrode.

17. The opto-electronic device of claim 16, wherein the third electrode has at least one sidewall, and the conductive coating is arranged adjacent to the sidewall.

18. The opto-electronic device of claim 3, further comprising a non-emissive region, comprising the shadowed region and the conductive coating.

19. The opto-electronic device of claim 6, wherein the third electrode is an auxiliary electrode.

20. The opto-electronic device of claim 1, wherein the conductive coating material comprises magnesium.

* * * * *